(12) United States Patent
Balakrishnan et al.

(10) Patent No.: US 11,581,873 B2
(45) Date of Patent: Feb. 14, 2023

(54) DUAL MODE DIGITAL FILTERS FOR RF SAMPLING TRANSCEIVERS

(71) Applicant: Texas Instruments Incorporated, Dallas, TX (US)

(72) Inventors: Jaiganesh Balakrishnan, Bengaluru (IN); Sriram Murali, Bengaluru (IN); Kalyan Gudipati, Bengaluru (IN); Venkateshwara Reddy Pothapu, Bengaluru (IN); Sarma Sundareswara Gunturi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 4 days.

(21) Appl. No.: 17/463,317

(22) Filed: Aug. 31, 2021

(65) Prior Publication Data

US 2022/0231667 A1 Jul. 21, 2022

(30) Foreign Application Priority Data

Jan. 18, 2021 (IN) ............................. 202141002239

(51) Int. Cl.
*H03H 11/00* (2006.01)
*H03H 11/04* (2006.01)
*H03H 17/00* (2006.01)

(52) U.S. Cl.
CPC ....... *H03H 11/04* (2013.01); *H03H 2017/009* (2013.01); *H03H 2017/0081* (2013.01)

(58) Field of Classification Search
CPC ............ H03H 11/04; H03H 2017/0072; H03F 3/245; H04B 1/40
See application file for complete search history.

(56) References Cited

U.S. PATENT DOCUMENTS 5,642,382 A * 6/1997 Juan .................. H04L 25/03038
375/321
9,748,928 B1 * 8/2017 Mauer ................ H03H 17/0248

* cited by examiner

*Primary Examiner* — Dinh T Le
(74) *Attorney, Agent, or Firm* — John R. Pessetto; Frank D. Cimino

(57) ABSTRACT

Dual mode filters having two reconfigurable multi-stage filters. In a dual band mode, each reconfigurable filter filters an input signal in a different band using every filter stage. In a single band mode, both reconfigurable filters are effectively divided into two sub-chains that include either the odd-numbered filter stages or the even-numbered filter stages. Together, the four sub-chains in the single band mode filter an input signal in a single band with a higher parallelization than each reconfigurable filter in the dual band mode. In some embodiments, the dual mode filter is a decimation filter. In other embodiments, the dual mode filter is a resampling filter. In still other embodiments, the dual mode filter is an interpolation filter.

21 Claims, 26 Drawing Sheets

DUAL MODE DIGITAL FILTERS FOR RF SAMPLING TRANSCEIVERS

CROSS-REFERENCE TO RELATED APPLICATIONS

This application claims priority to India Provisional Application No. 202141002239, filed Jan. 18, 2021, which is hereby incorporated by reference.

BACKGROUND

Radio frequency sampling transceivers often need to be configurable to filter signals in a single band and reconfigurable to filter signals in multiple bands. Because of the need to filter signals at high sampling rates, highly parallelized implementations are typically used. In particular, because the bandwidth and sampling rate of the single band may be higher than the bandwidth and sampling rate of each dual band, higher parallelization may be required to filter signals in the single band.

Because of the differences in the architectures of the single band filters and the dual band filters, many hardware elements must be duplicated to support both the single band mode and the dual band mode, increasing the size and cost of the RF sampling transceivers.

SUMMARY

Example embodiments include dual mode digital filters. In some example embodiments, the dual mode filter includes two reconfigurable, multi-stage filters. In a dual band mode, each reconfigurable filter filters an input signal in a different band using every filter stage. In a single band mode, both reconfigurable filters are effectively divided into two sub-chains that include either the odd-numbered filter stages or the even-numbered filter stages. Together, the four sub-chains in the single band mode filter an input signal in a single band with a higher parallelization than each reconfigurable filter in the dual band mode.

In some embodiments, the dual mode filter is a decimation filter. In other embodiments, the dual mode filter is a resampling filter. In some decimation and resampling embodiments, each filter stage of the dual mode filter generates a partial sum for that filter stage in part by adding a partial sum from a previous filter stage. In the dual band mode, each filter stage adds the partial sum from the preceding filter stage. In the single band mode, each filter stage adds the partial sum from two stages prior.

In other embodiments, the dual mode filter is an interpolation filter. In some interpolation embodiments, each filter stage filters an input sample provided by a previous filter stage. In the dual band mode, each filter stage is provided with the input sample from the preceding filter stage. In the single band mode, each filter stage adds the partial sum from two stages prior.

Because the dual mode filter can be configured to filter signals in each of two bands and reconfigured to filter signals in a single band with higher parallelization, the dual mode filter eliminates the need for duplicate hardware elements to support both single band and dual band modes.

BRIEF DESCRIPTION OF THE DRAWINGS

For a detailed description of various examples, reference will now be made to the accompanying drawings in which.

The same reference numbers and other reference designators are used in the drawings to depict the same or similar (functionally and/or structurally) features.

DETAILED DESCRIPTION

Figure 1:
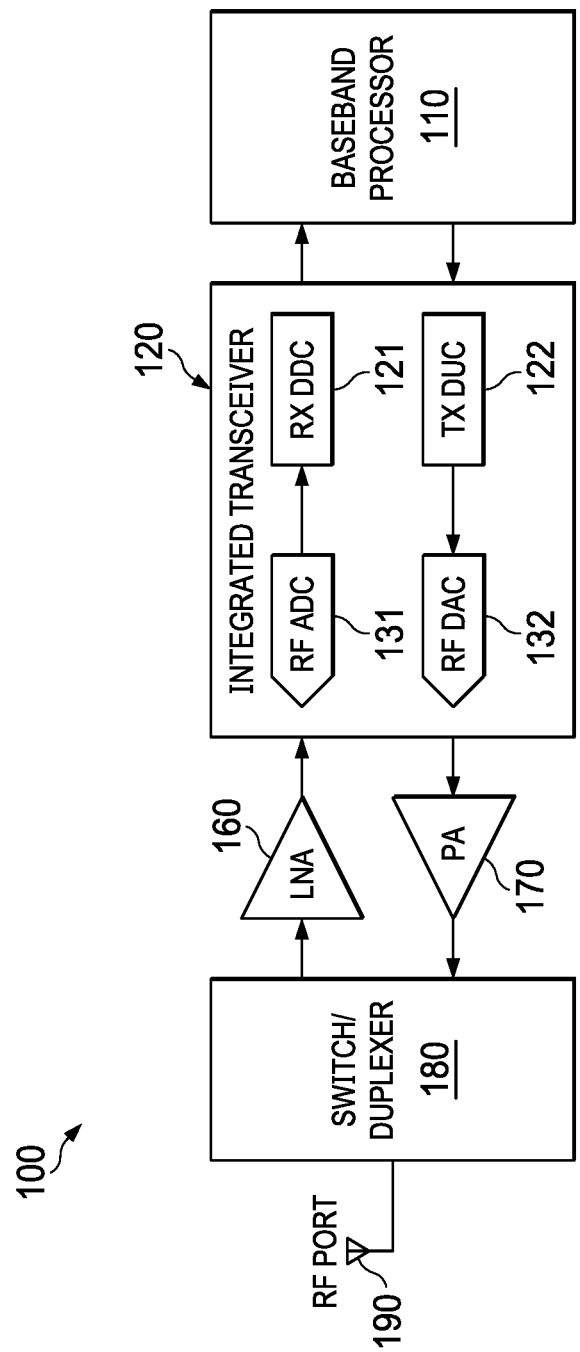
FIG. 1 is a block diagram of a cellular base station.

FIG. 1 is a block diagram of a cellular base station 100.

In the embodiment of FIG. 1, the cellular base station 100 includes a baseband processor 110, a radio frequency (RF) sampling transceiver 120, a low noise amplifier (LNA) 160, a power amplifier (PA) 170, a switch/duplexer 180, and an RF port 190 (e.g., an antenna). The transceiver 120 has a receive signal path that includes an RF analog-to-digital converter (ADC) 131 coupled to a receive digital down-converter (DDC) 121. The transceiver 120 also has a transmit signal path that includes an RF digital-to-analog converter (DAC) 132 coupled to a transmit digital up-converter (DUC) 131.

The baseband processor 110 may be implemented as an application-specific integrated circuit (ASIC) or a field-programmable gate array (FPGA) and may include digital signal processors, microprocessors, microcontrollers and/or other types of signal processing hardware. The transceiver 120 may be implemented using multiple semiconductor devices (e.g. devices on different semiconductor die or packaged in different semiconductor device packages) or may be part of an integrated transceiver with the analog-to-digital converter 131, digital down-converter 121, digital-to-analog converter 132, and digital up-converter 122 integrated on a single semiconductor die. The integrated transceiver 120 may be implemented on the same semiconductor die (or in the same semiconductor device package) as the baseband processor 110.

The RF port 190 receives RF signals via an antenna (or, in other example embodiments, any type of communications mediums, such as cables, buses or optical cables) and provides those received RF signals to the low noise amplifier 160 via the switch/duplexer 180. The low noise amplifier 160 amplifies the received RF signals provided by the RF port 190 and provides those amplified receive signals to the analog-to-digital converter 131. The analog-to-digital converter 131 converts the amplified receive signals provided by the low noise amplifier 160 to a digital representation and provides those digital receive signals to the digital down-converter 121. The digital down-converter 121 converts the digital receive signals provided by the analog-to-digital converter 131 to a baseband frequency and provides those baseband frequency receive signals to the baseband processor 110, which processes the baseband frequency receive signals.

To transmit signals, the baseband processor 110 provides baseband transmit signals to the digital up-converter 122. The digital up-converter 122 upconverts the baseband transmit signals provided by baseband processor 110 to a higher frequency and provides those higher frequency transmit signals to the digital-to-analog converter 132. The digital-to-analog converter 132 converts the higher frequency transmit signals received from the digital up-converter 122 to an analog representation and provides those analog transmit signals to the power amplifier 170. The power amplifier 170 amplifies the analog transmit signals received from the digital-to-analog converter 132 and provides those amplified analog transmit signals to the switch/duplexer 180. The switch/duplexer 180 provides the amplified analog transmit signals received from the power amplifier 170 to the RF port 190 for transmission by an antenna.

In some implementations, the cellular base station 100 may operate in a dual band mode and transmit and receive signals in two signal bands using a single, shared power amplifier 170. Therefore, the power amplifier 170 may be a wide-band power amplifier with a bandwidth sufficiently large to amplify RF signals in two signal bands.

Figure 2:
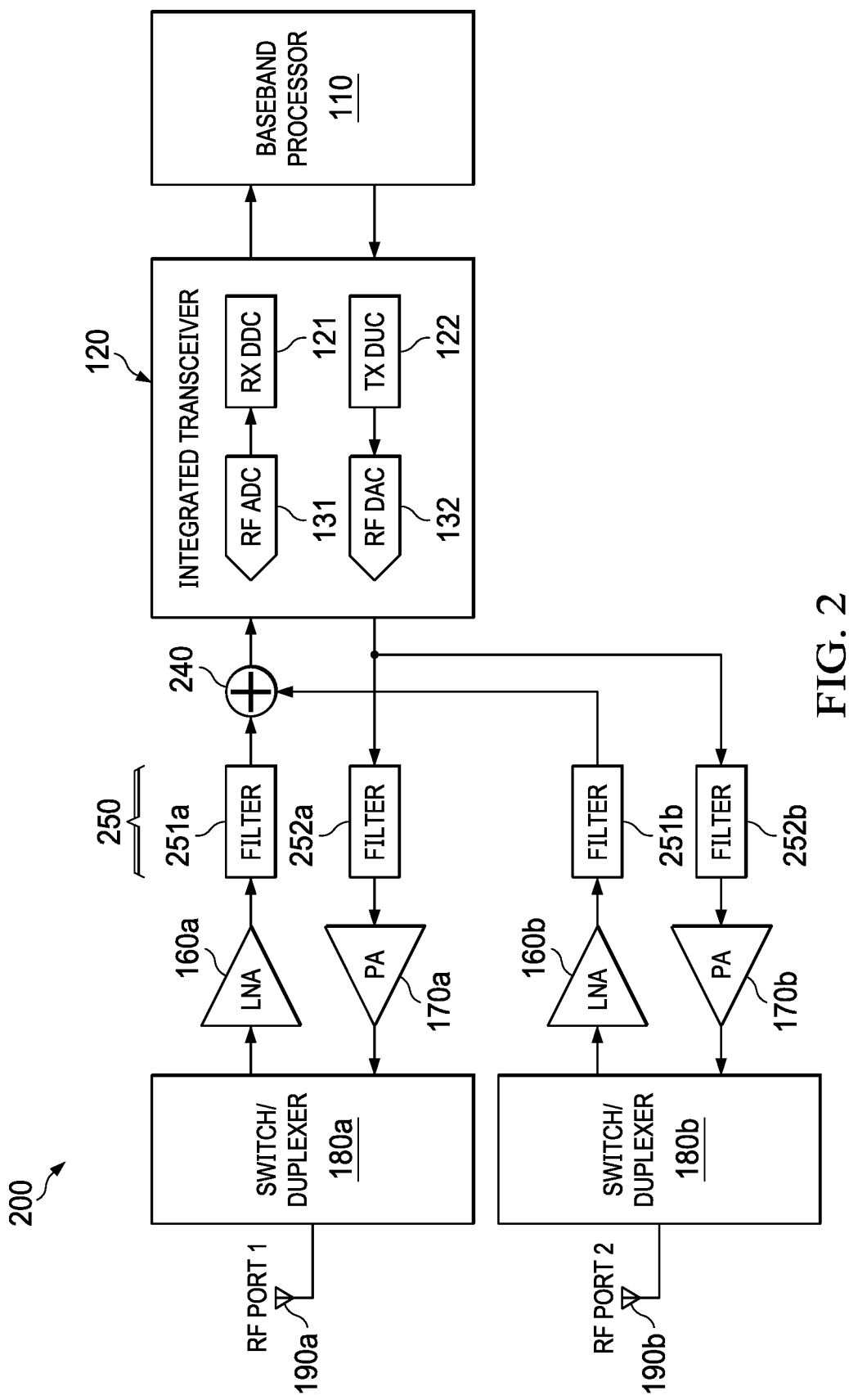
FIG. 2 is a block diagram of a dual band cellular base station with two power amplifiers that amplify transmitted RF signals in two signal bands.

FIG. 2 is a block diagram of a dual band cellular base station 200 with two power amplifiers 170a and 170b that each amplify the transmitted RF signals in one of the two signal bands.

As shown in FIG. 2, the dual band cellular base station 200 includes the baseband processor 151 and the transceiver 120 described above as well as two low noise amplifiers 160a and 160b, two power amplifiers 170a and 170b, two switches/duplexers 180a and 180b, and two RF ports 190a and 190b. In other embodiments, both RF ports 190a and 190b may be implemented as a single RF port 190.

The dual band cellular base station 200 also includes filters 250 and a summer 240. The filters 250 may include a first receive band filter 251a, a first transmit band filter 252a, a second receive band filter 252b, and a second transmit band filter 252b. The digital-to-analog converter 132 is coupled to the first power amplifier 170a via the first transmit band filter 252a and to the second power amplifier 170b via the second transmit band filter 252b. The first low noise amplifier 160a is coupled to the summer 240 via the first receive band filter 251a. The second low noise amplifier 160b is coupled to the summer 240 via the second receive band filter 251b. The summer 240 is coupled to the analog-to-digital converter 131 of the transceiver 120.

As described below, each of the filters 250 has a frequency band of interest. The filters 250 may be analog, band pass filters that each attenuate signals outside of the frequency band of interest of that filter 250.

The dual band cellular base station 200 transmits and receives signals in a first signal band via the first RF port 190a and transmits and receives signals in a second signal band via the second RF port 190b. The first signal band includes a first transmit signal band and a first receive signal band. The second signal band includes a second transmit signal band and a second receive signal band. In some implementations, the transmit band and the receive band may be separate. In other implementations, however, the transmit band and the receive band may overlap across the entire signal band. In some examples, cellular base station 200 may include additional circuitry (e.g. includes additional switch duplexers, LNAs, PAs, summers and filters) to transmit and/or receive signals in multiple bands To transmit signals over either the first transmit band or the second transmit band, the baseband processor 110 provides baseband digital transmit signals to the digital up-converter 122, which upconverts the baseband digital transmit signals to a higher frequency and provides those higher frequency digital transmit signals to the digital-to-analog converter 132, which converts those higher frequency digital transmit signals to analog and provides those analog transmit signals to both the first transmit band filter 252a and the second transmit band filter 252b.

The first transmit band filter 252a attenuates the analog transmit signals outside of the first transmit band and passes the transmit signals within the first transmit band to the first power amplifier 170a. The second transmit band filter 252b attenuates the analog transmit signals outside of the second transmit band and passes the transmit signals within the second transmit band to the second power amplifier 170b. The transmit band filters 252a and 252b may be used to attenuate any potential out-of-band emissions, which might need to be suppressed to comply with emission specifications.

The first power amplifier 170a receives the transmit signals passed by the first transmit band filter 252a, amplifies those transmit signals, and provides those amplified transmit signals to the first RF port 190a (via the first switch duplexer 180a) for transmission by an antenna. The second power amplifier 170b receives the transmit signals passed by the second transmit band filter 252b, amplifies those transmit signals, and provides those amplified transmit signals to the second RF port 190b (via the second switch duplexer 180b) for transmission by an antenna.

The first RF port 190a receives RF signals and provides those received RF signals to the first receive band filter 251a via the first switch/duplexer 180a and the first low noise amplifier 160a. The second RF port 190b receives RF signals and provides those received RF signals to the second receive band filter 251b via the second switch/duplexer 180b and the second low noise amplifier 160b.

The first receive band filter 251a attenuates the received RF signals outside of the first receive band and passes the received RF signals within the first receive band to the summer 240. The second receive band filter 251b attenuates the received RF signals outside of the second receive band and passes the received RF signals within the second receive band to the summer 240. The receive band filters 251a and 251b suppress out-of-band blockers from other transmitters to better use the dynamic range of the rest of the signal chain.

The summer 240 is an analog summer that that adds the received RF signals passed by the first receive band filter 251a and the second receive band filter 251b. The summer 240 provides the received RF signals to the analog-to-digital converter 131, which converts the received RF signals to a digital representation and provides those digital receive signals to the digital down-converter (DDC) 121, which converts the digital receive signals to a baseband frequency and provides those baseband frequency receive signals to the baseband processor 110, which processes the baseband frequency receive signals.

In an RF sampling receiver, the RF signal is sampled directly with a high speed, high performance analog-to-digital converter. Therefore, the analog-to-digital converter (ADC) 131 may be, for example, 14 bits with a sampling rate of 4 giga-sample per second (GSPS). In an RF sampling transmitter, the RF signal is generated in the digital domain and converted to the analog domain with a multi-GSPS radio frequency digital-to-analog converter. Therefore, the digital-to-analog converter (DAC) 132 may be, for example, a 14-bit DAC with a sampling rate of 12 GSPS. Because of the need to perform high speed signal processing, the digital filtering complexity in the digital down-converter 121 and the digital up-converter 122 is significant.

In some implementations, the RF sampling transceiver 120 may need to support both a single band mode and a dual band mode. In a single band mode, for example, the single band may have a bandwidth that is scalable up to 800 megahertz (800 MHz) and an interface rate of 1 giga-sample per second (GSPS). In a dual band mode, for example, each band may have a bandwidth that is scalable up to 400 MHz and an interface rate of 500 mega-samples per second (MSPS).

Figure 3:
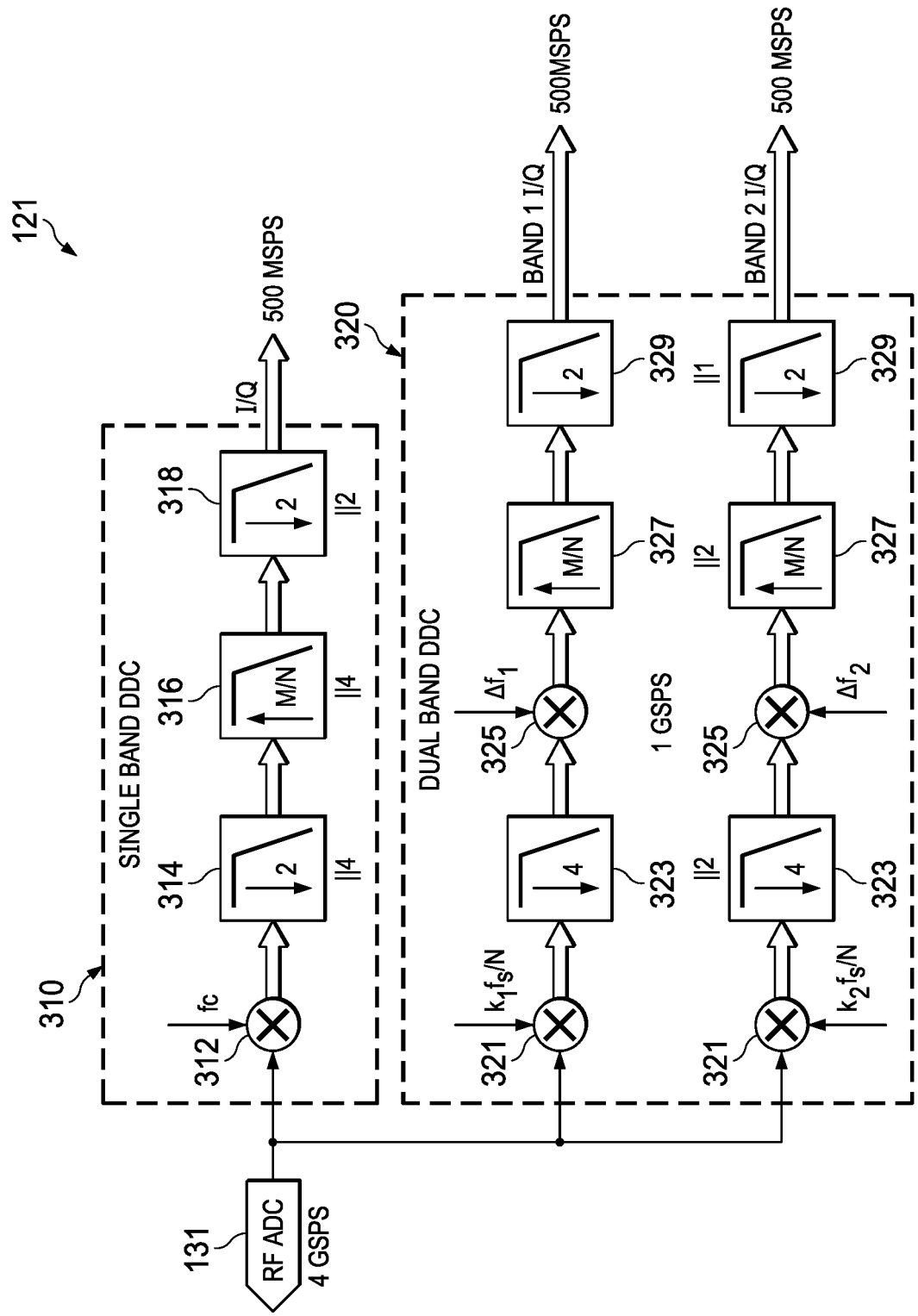
FIG. 3 is a block diagram of a prior art digital down-converter having a dedicated single band digital down-conversion chain and a separate, dedicated dual band digital down-conversion chain.

FIG. 3 is a block diagram of a prior art digital down-converter 121 having a dedicated single band digital down-conversion chain 310 and a separate, dedicated dual band digital down-conversion chain 320.

In the example shown in FIG. 3, the single band digital down-conversion chain 310 includes a mixer 312, an initial decimation filter 314, a resampling filter 316, and a final decimation filter 318. In the single band mode, the single band digital down-conversion chain 310 receives the digital receive signals from the analog-to-digital converter 131, down-converts the digital receive signals to a baseband frequency, down-samples the (I- and Q-phase) baseband receive signals, and provides the down-sampled (I- and Q-phase) baseband receive signals to the baseband processor 110.

To down-convert the digital receive signals FIG. 3, the mixer 312 mixes the digital receive signals with the center frequency $f_c$ of the single band and provides the (I- and Q-phase) baseband receive signals to the initial decimation filter 314. To down-sample the baseband receive signals, the initial decimation filter 314 decimates the baseband receive signals and provides the decimated baseband receive signals to the resampling filter 316, which resamples the decimated baseband receive signals and provides the resampled baseband receive signals to the final decimation filter 318, which decimates the resampled baseband receive signals and provides the down-sampled (I- and Q-phase) baseband receive signals to the baseband processor 110.

For each of the two signal bands, the dual band digital down-conversion chain 320 may include a coarse mixer 321, mid-conversion decimation filter 323, a fine mixer 325, a resampling filter 327, and a post-conversion decimation filter 329.

In the dual band mode, the dual band digital down-conversion chain 320 receives the digital receive signals in each of the two signal bands from the analog-to-digital converter 131, down-converts the digital receive signals to the baseband frequency, down-samples the (I- and Q-phase) baseband receive signals, and provides the down-sampled (I- and Q-phase) baseband receive signals to the baseband processor 110.

To down-convert the digital receive signals in each band, the example dual band digital down-conversion chain 320 uses two-phase mixing. The coarse mixer 321 operates at the sampling rate ($f_s$) of the analog-to-digital converter 131, the mid-conversion decimation filter 323 reduces that sampling rate, and the fine mixer 325 operates at the reduced sampling rate. The coarse mixer 321 mixes the digital receive signals by a coarse frequency and provides the (I- and Q-phase) coarse mixed receive signals to the mid-conversion decimation filter 323. To limit the number of sine and cosine calculations that the high frequency coarse mixer 321 must perform, the coarse frequency may be a multiple (k) of the sampling frequency ($f_s$) divided by an integer (N). The mid-conversion decimation filter 323 decimates the coarse mixed receive signals and provides the decimated coarse mixed receive signals to the fine mixer 325, which completes the down-conversion by mixing the decimated coarse mixed receive signals with the frequency difference ($\Delta f$) between the coarse frequency ($kf_s/N$) and the center frequency ($f_1$ or $f_2$) of the relevant band and provides the decimated baseband receive signals to the resampling filter 327. Each resampling filter 327 resamples the decimated baseband receive signals in the relevant band and provides the resampled baseband receive signals to the post-conversion decimation filter 329 for that band, which decimates the resampled baseband receive signals and provides the down-sampled (I- and Q-phase) baseband receive signals to the baseband processor 110.

Because of the need to process multiple GSPS samples, highly parallelized implementations are typically used. In the example dual band digital down conversion chain 320, for instance, each mid-conversion decimation filter 323 may have a parallelization factor of 2, each resampling filter 327 may have a parallelization factor of 2, and each post-conversion decimation filter 329 may have a parallelization factor of 1. However, because the bandwidth (e.g., 800 MHz) and sampling rate (e.g., 1000 MSPS) of the single band may be higher than the bandwidth (e.g., 400 MHz) and sampling rate (e.g., 500 MSPS) of each dual band, the single band digital down-conversion chain 310 may require a higher parallelization digital implementation. For instance, the initial decimation filter 314 may have a parallelization factor of 4, the resampling filter 316 may have a parallelization factor of 4, and the final decimation filter 318 may have a parallelization factor of 2.

Because of the differences in the architectures of the single band digital down-conversion chain 310 and the dual band digital down-conversion chain 320, many hardware elements must be duplicated to support both the single band mode and the dual band mode. For instance, even if the decimation filters 318 and 329 or the resampling filters 316 and 327 have the same number of taps and coefficients, separate hardware elements with different microarchitectures are required because the single band digital down-conversion chain 310 requires a higher parallelization factor than the dual band digital down-conversion chain 320.

Figure 4:
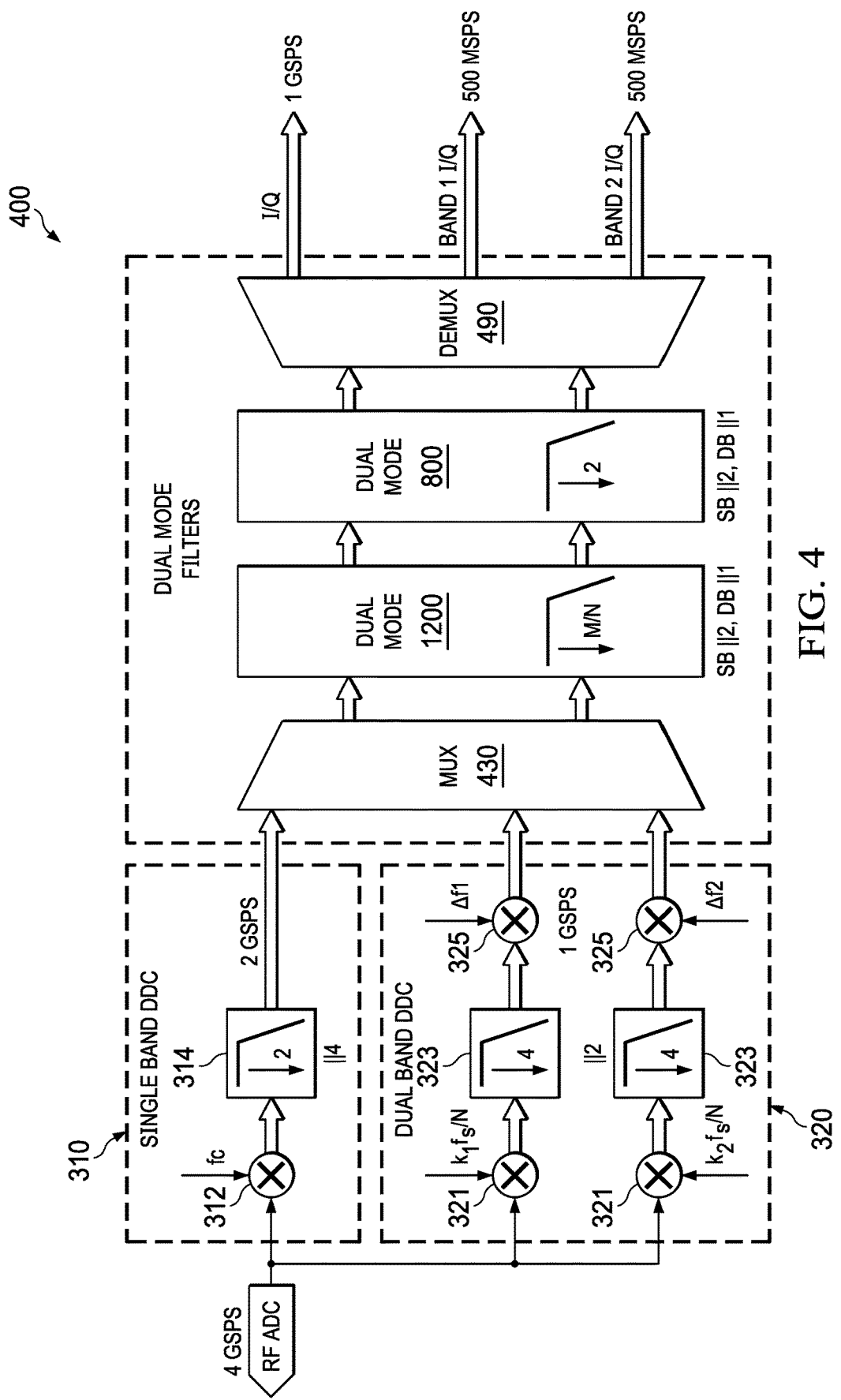
FIG. 4 is a block diagram of a dual mode digital down-converter employing a dual mode decimation filter and a dual mode resampling filter according to an illustrative embodiment.

FIG. 4 is a block diagram of a dual mode digital down-converter 400 employing a dual mode decimation filter 800 and a dual mode resampling filter 1200 according to an illustrative embodiment.

The dual mode digital down-converter 400 includes a single band digital down-conversion chain 310 and a dual band digital down-conversion chain 320. In the embodiment of FIG. 4, the single band digital down-conversion chain 310 includes the mixer 312 and the initial decimation filter 314 described above with reference to FIG. 3. For each of the dual bands, the dual band digital down-conversion chain 320 includes the coarse mixer 321, the mid-conversion decimation filter 323, and the fine mixer 325 described above with reference to FIG. 3.

However, instead of the separate resampling filters 316 and 327 and the separate decimation filters 318 and 329 employed by the prior art digital down-converter 121 shown in FIG. 3, the dual mode digital down-converter 400 includes a multiplexer (MUX) 430, the dual mode resampling filter 1200, the dual mode decimation filter 800, and a demultiplexer (DEMUX) 490. In some examples, MUX 430 and DEMUX 490 are controlled by a microcontroller, processor, ASIC and/or logic circuitry (e.g. baseband processor 110 or other circuitry included in conjunction with the receiver) based on the received signals.

In a single band mode, the dual mode resampling filter 1200 receives the (I- and Q-phase) decimated baseband receive signals from the initial decimation filter 314 of the single band digital down-conversion chain 410 via the multiplexer 430. In a dual band mode, the dual mode resampling filter 1200 receives the (I- and Q-phase) decimated baseband receive signals from each fine mixer 325 of the dual band digital down-conversion chain 420 via the multiplexer 430. In either mode, the dual mode resampling filter 1200 resamples the decimated baseband receive signals and provides the resampled baseband receive signals to the dual mode decimation filter 800. In either mode, the dual mode decimation filter 800 decimates the resampled baseband receive signals received from the dual mode resampling filter 1200 and provides the down-sampled (I- and Q-phase) baseband receive signals to the baseband processor 110 via the multiplexer 490.

The dual mode resampling filter 1200 eliminates the need for the separate resampling filters 316 and 327 of the prior art digital down-converter 121 because, as described in detail below with reference to FIGS. 11-13, the dual mode resampling filter 1200 may be configured to resample the baseband receive signals of the single band (when operating in a single band mode) and reconfigured to resample the baseband receive signals of both of the dual bands (when operating in a dual band mode). Similarly, the dual mode decimation filter 800 eliminates the need for the separate decimation filters 318 and 329 of the prior art digital down-converter 121 because, as described in detail below with reference to FIGS. 7-9, the dual mode decimation filter 800 may be configured to decimate the resampled baseband receive signals of the single band (when operating in a single band mode) and reconfigured to decimate the resampled baseband receive signals of both of the dual bands (when operating in a dual band mode). Furthermore, the dual mode digital down-converter 400 can process samples with the same efficiency as the prior art digital down-converter 121 (without the separate, duplicative hardware elements) because the parallelization of both the dual mode resampling filter 1200 and the dual mode decimation filter 800 are higher in the single band mode than in the dual band mode.

Dual Mode Decimation Filter

The purpose of the prior art decimation filters 329 and 318 is to reduce the sampling rate of the baseband receive signal provided to the baseband processor 110. In practice, however, the prior art decimation filters 329 and 318 are typically implemented as lowpass filters to suppresses aliasing while also reducing the sampling rate. More specifically, the prior art decimation filters 329 and 318 are typically implemented as finite impulse response (FIR) filters.

Figure 5A:
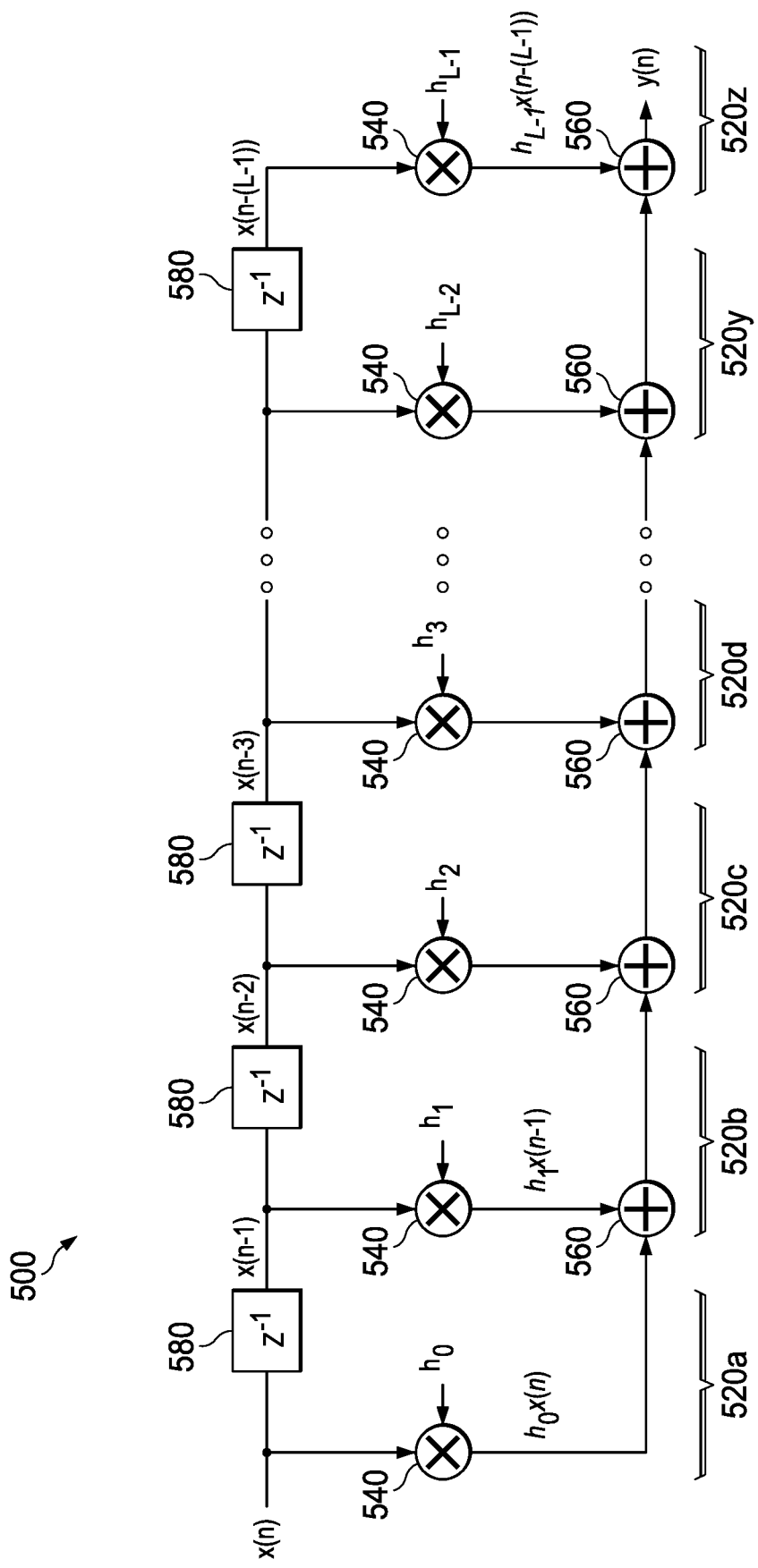
FIG. 5A is a block diagram illustrating the logical structure of a prior art "direct form" finite impulse response (FIR) filter.

FIG. 5A is a block diagram illustrating the logical structure of a prior art "direct form" finite impulse response (FIR) filter 500, which may be used to implement filters 318 and/or 329.

As shown in FIG. 5A, the FIR filter 500 filters input samples x(n) and outputs filtered output samples y(n), where n is the sampling index of the input samples x(n) and the output signal y(n) over time. Each clock cycle, the example FIR filter 500 shown in FIG. 5A receives one input sample x(n) and outputs one output sample y(n) As described below, the FIR filter 500 filters the input samples x(n) by multiplying an array of the most recent input samples x(n) (where, for example, the most recent previous input sample is expressed as x(n−1)) by an array of filter coefficients $h_k$ and summing the elements of the resulting array. The FIR filter 500 has a length L, meaning the input samples x(n) are filtered by L filter coefficients $h_k$ where k is each integer between 0 and L−1.

The FIR filter 500 is a multi-stage filter having a number of filter stages 520. The example FIR filter 500 of FIG. 5A has L filter stages 520. For ease of reference, each filter stage 520 shown in FIG. 5A is individually identified as an initial filter stage 520a, a second filter stage 520b, a third filter stage 520c, a fourth filter stage 520d, a penultimate filter stage 520y, and a final filter stage 520z.

In the "direct form" FIR filter 500 shown in FIG. 5A, each filter stage 520 includes: a multiplier 540; a memory register 580 (except for the final filter stage 520z); and an adder 560 (except for the initial filter stage 520a). At a first clock cycle, the initial filter stage 520a receives the input sample x(n) and stores the input sample x(n) in the memory register 580 of the initial filter stage 520a. The multiplier 540 of the initial filter stage 520a filters the input sample x(n) by multiplying it by the specified filter coefficient $h_0$. The multiplier 540 of the initial filter stage 520a outputs the filtered input sample $h_0 x(n)$ to the adder 560 of the second filter stage 520b.

In a second clock cycle, the second filter stage 520b receives the input sample x(n−1), which is the input sample x(n) of the first clock cycle, from the memory register 580 of the initial filter stage 520a. The multiplier 540 of the second filter stage 520b filters the input sample x(n−1) by multiplying it by the specified filter coefficient $h_1$. The multiplier 540 of the second filter stage 520b outputs the filtered input sample $h_1$x(n−1) to the adder 560 of the second filter stage 520b. The adder 560 of the second filter stage 520b adds the filtered input sample $h_1$x(n−1) output by the multiplier 540 of the second filter stage 520b to the filtered input sample $h_0$x(n) of the second clock cycle, output by the multiplier 540 of the initial filter stage 520a. The output of the adder 560 of the second filter stage 520b is referred to as the partial sum for the second filter stage 520b.

In subsequent clock cycles, the same process is performed by the remaining filter stages 520. Each filter stage 520 receives the input signal x(n−t) (where t is the clock cycle), each multiplier 540 filters the input sample x(n−t) by a specified filter coefficient $h_k$, and each adder 560 generates a partial sum for that filter stage 520 by adding the filtered input sample of that filter stage 540 to the partial sum of the preceding filter stage 520.

Over the course of L clock cycles, the FIR filter 500 filters the input sample x(n) by all of the L filter coefficients $h_k$ (using each of the L multipliers 540) to form L filtered input samples. Those L filtered input samples are summed by each of the L−1 adders 560. In the final step of the process, the adder 560 of the final filter stage 520z adds the filtered input sample $h_{L-1}$x(n−(L−1)) output by the multiplier 540 of the final filter stage 520z to the partial sum output by the adder 560 of the penultimate filter stage 540y. Meanwhile, the partial sum of the penultimate filter stage 540y is the input sample x(n−(L−1)) having been filtered by all of the preceding filter coefficients $h_0$ through $h_{L-2}$. As a result, the output y(n) of the FIR filter 500, which is output by the adder 560 of the final filter stage 520z, may be represented mathematically as follows:

$$y(n) = \sum_{k=0}^{L-1} h_k x(n-k)$$

While the FIR filter 500 of FIG. 5A is in direct form, prior art decimation filters 329 and 318 are typically implemented in transposed form.

Figure 5B:
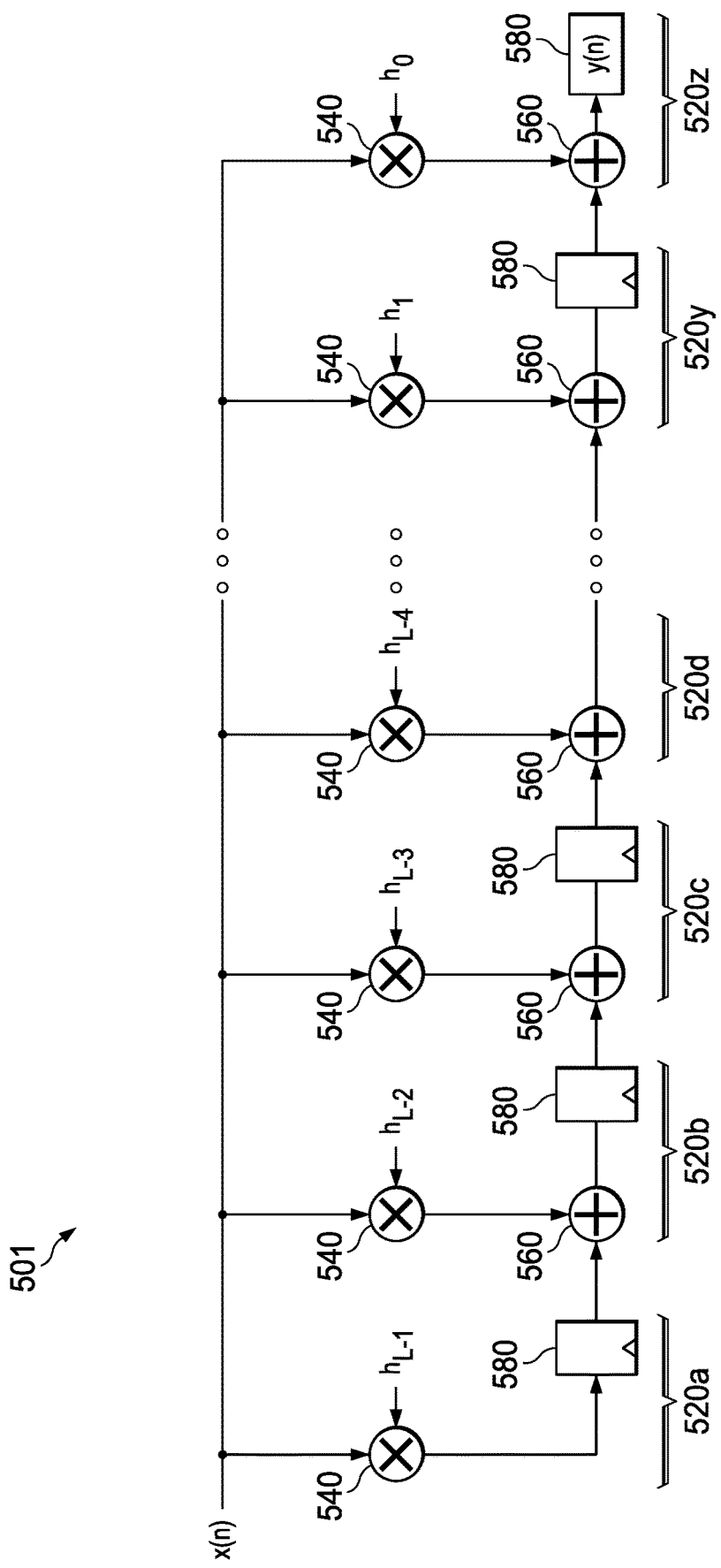
FIG. 5B is a block diagram illustrating the logical structure of a prior art "transposed form" finite impulse response (FIR) filter.

FIG. 5B is a block diagram illustrating the logical structure of a generic "transposed form" finite impulse response (FIR) filter 501.

Like the direct form FIR filter 500 of FIG. 5A, the transposed form FIR filter 501 of FIG. 5B filters input samples x(n) and outputs filtered output samples y(n), where n is the sampling index of the input samples x(n) and the output signal y(n) over time. The transposed form FIR filter 501 also filters the input samples x(n) by multiplying an array of the most recent input samples x(n) by an array of filter coefficients $h_k$ and summing the elements of the resulting array. The transposed form FIR filter 501 also has a length L, meaning the input samples x(n) are filtered by L filter coefficients $h_k$ where k is each integer between 0 and L−1. The example transposed form FIR filter 501 also has L filter stages 520, which are individually identified as an initial filter stage 520a, a second filter stage 520b, a third filter stage 520c, a fourth filter stage 520d, a penultimate filter stage 520y, and a final filter stage 520z. In the FIR filter 501, each filter stage 520 includes a multiplier 540 and a memory register 580 and each filter stage 520 (except the initial filter stage 520a) includes an adder 560.

Compared to the direct form FIR filter 500 of FIG. 5A, the order of the filter coefficients $h_k$ in the transposed form FIR filter 501 is reversed, with the first filter coefficient $h_0$ being applied by multiplier 540 of the final filter stage 540z and the final filter coefficient $h_{L-1}$ being applied by multiplier 540 of the final filter stage 540z. Also, in contrast to the direct form FIR filter 500 of FIG. 5A, each filter stage 540 of the transposed form FIR filter 501 receives the same input sample x(n) during the same clock cycle.

Each clock cycle, the multipliers 540 in each filter stage 520 of the transposed form FIR filter 501 filter the input sample x(n) by multiplying it by the specified filter coefficient $h_k$ of that filter stage 520. With the exception of the initial stage 520a, the multipliers 540 in each filter stage 520 output the filtered input sample to the adder 560 of that filter stage 520, which generate a partial sum for that filter stage 520 by adding the filtered input sample (output by the multiplier 540 of the filter stage 520) to the partial sum of the preceding filter stage 520. The initial stage 520a does not require an adder 560, because there is no filter stage 520 that precedes the initial filter stage 520a. Hence, the partial sum of the initial filter stage 520a is generated directly by the multiplier 540 of the initial filter stage 520a. The multiplier 540 of the initial filter stage 520a and the adders 560 of each of the subsequent filter stages 520 store the partial sum for that filter stage 520 in the memory register 580 of that filter stage 520. The memory register 580 of the final filter stage 520z stores the output sample z(n) of the transposed form FIR filter 501.

Working from right to left, the output sample y(n), which is generated by the adder 560 of the final filter stage 520z and the stored by the memory register 580 of the final filter stage 520z, is the sum of the filtered input sample $h_0$x(n) output by the multiplier 540 of the final filter stage 520z and the partial sum stored in the memory register 580 of the penultimate filter stage 520y during the previous clock cycle. The partial sum output by the memory register 580 of the penultimate filter stage 520y is sum of the filtered input sample $h_1$x(n−1) output by the multiplier 540 of the final filter stage 520z, where x(n−1) is the input sample x(n) of the previous clock cycle, and the partial sum stored in the memory register 580 of the preceding filter stage 520. The partial sum output of the preceding filter stage 520 (not shown) is the sum of the filtered input sample $h_2$x(n−2), where x(n−2) is the input sample x(n) two clock cycles prior, and the partial sum of the preceding filter stage 520.

As a result, each output sample y(n) of the transposed form FIR filter 501 is the sum of all of the L filter coefficients $h_k$, each filtering one of the L most recent input samples x(n) through x(n−(L−1)). By virtue of the transposition theorem, the output of the transposed form FIR filter 501 is the same as the output of the direct form FIR filter 500. The output y(n) of the transposed form FIR filter 501 may be represented mathematically as follows:

$$y(n) = \sum_{k=0}^{L-1} h_k x(n-k)$$

Figure 5C:
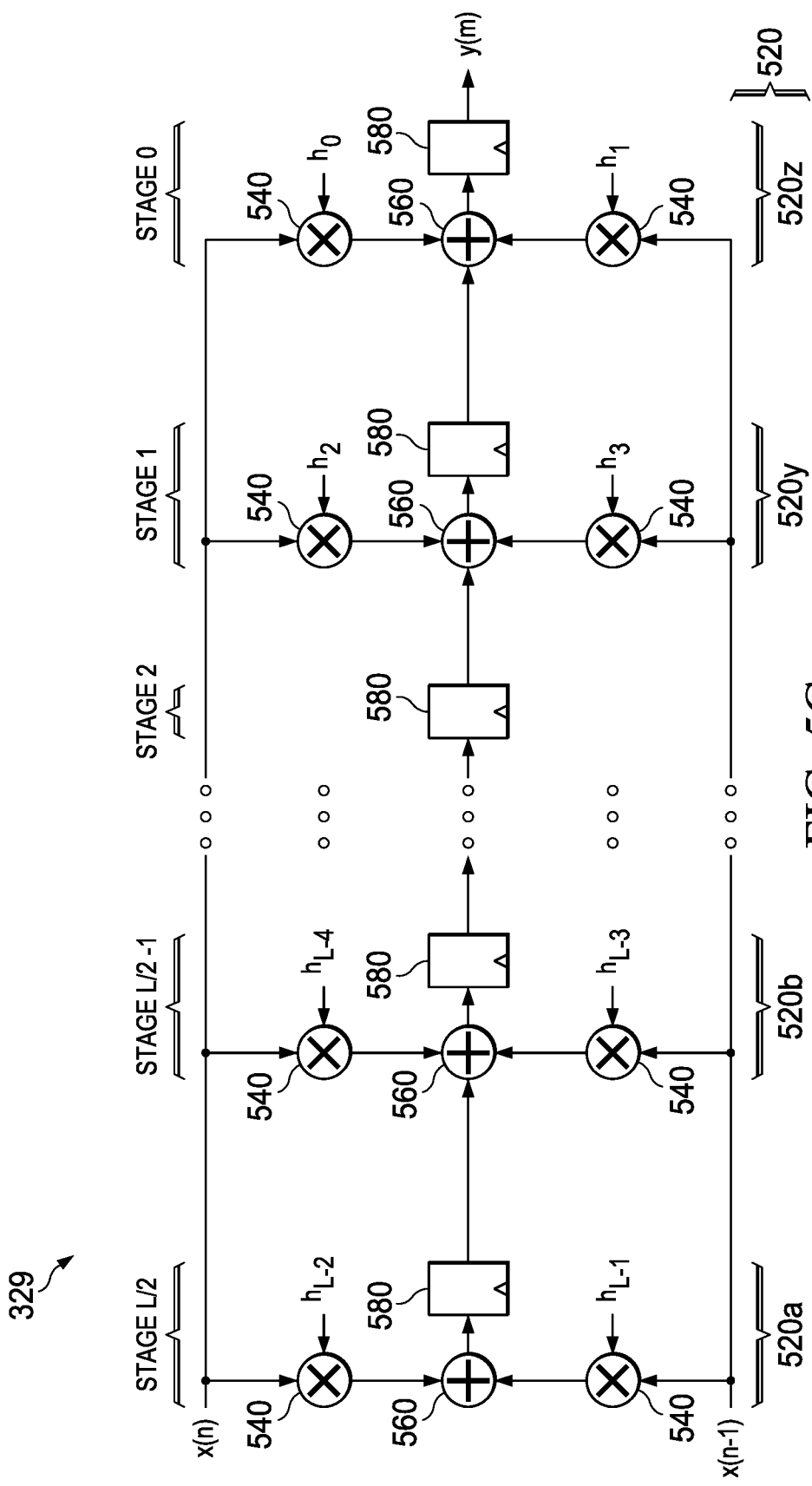
FIG. 5C is a block diagram illustrating a prior art decimation filter having a parallelization factor of 1.

FIG. 5C is a block diagram illustrating prior art decimation filter 329 having a parallelization factor of 1. The decimation filter 329 filters an input signal x(n), where n is the sampling index of the input signal x(n) over time. The decimation filter 329 is a finite impulse response (FIR) filter that filters the input samples x(n) by multiplying an array of the most recent input samples x(n) by the array of filter coefficients $h_k$ and summing the elements of the resulting array. The decimation filter 329 has a length L, meaning the input samples x(n) are filtered by L filter coefficients $h_k$ where k is each integer between 0 and L−1.

The decimation filter 329 is a multi-stage filter having a plurality of filter stages 520. The example decimation filter 329 of FIG. 5C is in transposed form and has ⌈L/2⌉ filter stages 520 (where the ⌈ ⌉ symbol represents a ceiling operation where the operand is rounded up to the nearest integer). For ease of reference, some of the filter stages 520 are identified as the initial filter stage 520*a*

$$\left(\text{"Stage }\frac{L}{2}\text{"}\right),$$

the second filter stage 520*b*

$$\left(\text{"Stage }\frac{L}{2}-1\text{"}\right),$$

the penultimate filter stage 520*y* ("Stage 1"), and the final filter stage 520*z* ("Stage 0").

The decimation filter 329 receives two input samples x(n) and x(n−1), where x(n−1) is the input sample immediately preceding x(n) over time. Each filter stage 520 of the decimation filter 329 includes a memory register 580. Each filter stage 520 of the decimation filter 329 (with the possible exception of the initial filter stage 520*a*) includes two multipliers 540. (If the length L of the decimation filter 329 is an odd number, the initial filter stage 520*a* includes only one multiplier 540.) Each filter stage 520 of the decimation filter 329 (with the possible exception of the initial filter stage 520*a*) includes an adder 560. (If the length L of the decimation filter 329 is an odd number, the initial filter stage 520*a* does not require an adder 560.)

Each multiplier 540 of each filter stage 520 filters the input sample x(n) or x(n−1) by a specified filter coefficient $h_k$. Because the filter coefficients $h_k$ are known, the multipliers 540 may be realized using a canonical signed digit (CSD) based implementation. The memory register 580 of each filter stage 520 stores a partial sum for that filter stage 520. The memory registers 580 may be implemented using any digital storage element (e.g., flip-flops). Each adder 560 of each filter stage 520 (except the initial filter stage 520*a*) computes the partial sum for that filter stage 520 by adding the filtered input samples from the multipliers 540 in that filter stage 520 to the partial sum stored in the memory register 580 of the preceding filter stage 520. Because the initial filter stage 520*a* has no preceding filter stage 520, the adder 560 of the initial filter stage 520*a* computes the partial sum for the initial filter stage 520*a* by adding the filtered input sample(s) from the multiplier(s) 540 without adding any partial sum from any preceding filter stage 520. If the length L of the decimation filter 329 is an odd number, the initial filter stage 520*a* requires only a single multiplier 540 and does not require an adder 560. In those instances, the single multiplier 540 of the initial filter stage 520*a* may compute the partial sum for that the initial filter stage 520*a*, by multiplying the input signal x(n) or x(n−1) by the specified filter coefficient $h_{L-1}$ as described above, and stores the partial sum for the initial filter stage 520*a* directly in the memory register 580 of the initial filter stage 520*a*.)

The decimation filter 329 is a finite impulse response (FIR) filter that filters the input signal x(n) by multiplying the two most recent input samples x(n−1) and x(n) by the array of filter coefficients $h_k$ and summing the elements of the resulting array. Working from right to left, the output sample y(m), which is generated by the adder 560 of the final filter stage 520*z* and the stored by the memory register 580 of the final filter stage 520*z*, is the sum of the filtered input sample $h_0 x(n)$ and $h_1 x(n-1)$ output by the multipliers 540 of the final filter stage 520*z* and the partial sum stored in the memory register 580 of the penultimate filter stage 520*y* during the previous clock cycle. The partial sum output by the memory register 580 of the penultimate filter stage 520*y* is the sum of the filtered input samples $h_2 x(n-2)$ and $h_3 x(n-3)$ output by the multiplier 540 of the final filter stage 520*z* (where x(n−2) is the input sample x(n) of the previous clock cycle and x(n−3) is the input sample x(n−1) of the previous clock cycle) and the partial sum stored in the memory register 580 of the preceding filter stage 520. The partial sum output of the preceding filter stage 520 (not shown) is the sum of the filtered input sample $h_4 x(n-4)$ and $h_5 x(n-5)$ (where x(n−4) is the input sample x(n) two clock cycles prior and x(n−5) is the input sample x(n−1) two clock cycles prior) and the partial sum of the preceding filter stage 520. As a result, each output sample y(m) of the prior art decimation filter 329 is the sum of all of the L filter coefficients $h_k$, each filtering one of the L most recent input samples x(n) through x(n−(L−1)).

The example decimation filter 329 has a parallelization factor of 1, meaning one decimated output sample y(m) is produced every clock cycle. The example decimation filter 329 is a decimate-by-2 filter, meaning each decimated output sample y(m) is produced using two input samples, x(n−1) and x(n), and the partial sums generated during previous clock cycles and stored in the memory registers 580. The output sample y(m), which is stored in the memory register 580 of the final stage 520*z* ("Stage 0"), is represented mathematically as follows:

$$y(m) = \sum_{k=0}^{L-1} h_k x(n-k)$$

where the relationship between the output sample index m and the input sample index n is n=2m.

Figure 6:
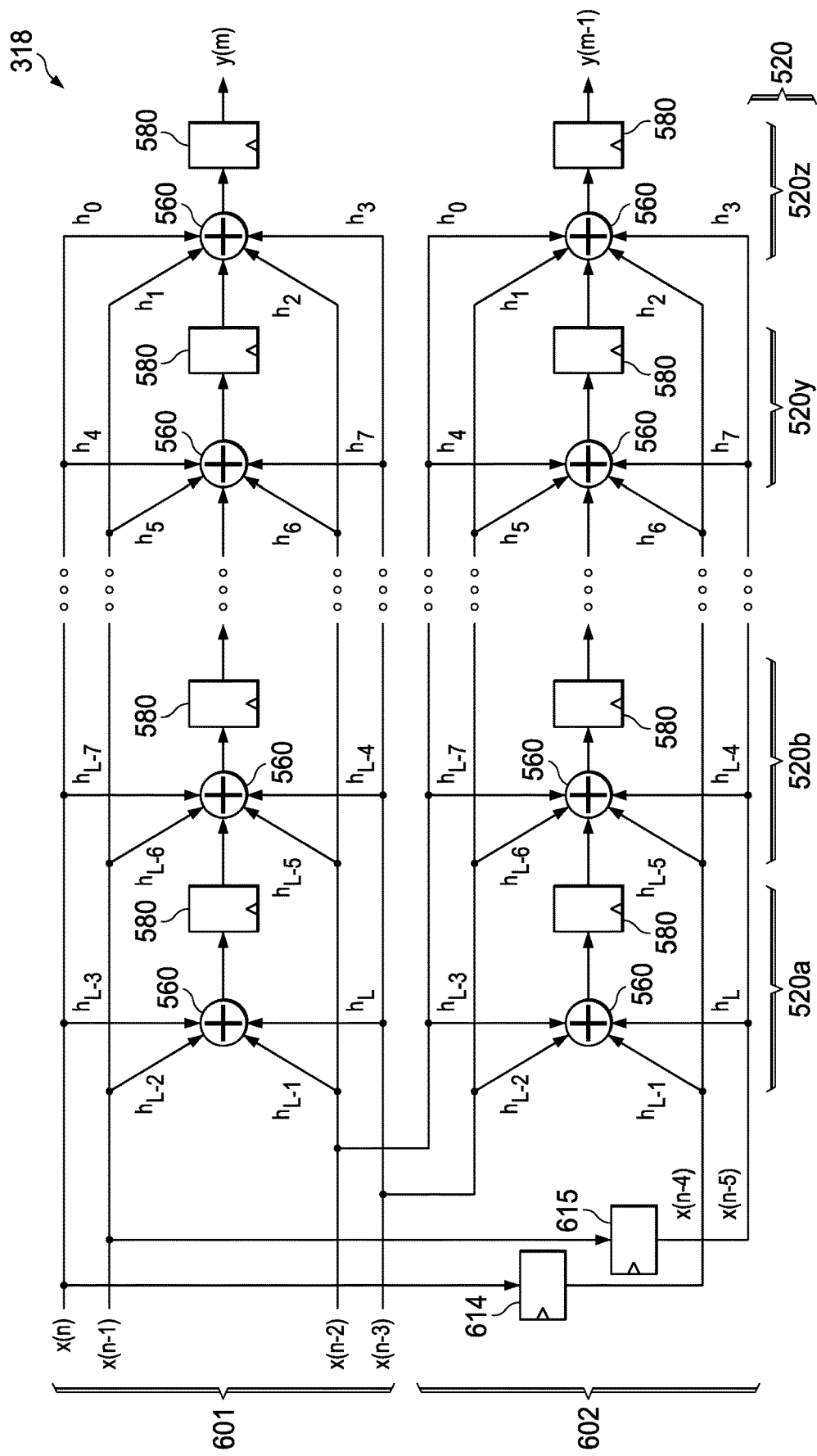
FIG. 6 is a block diagram illustrating a prior art decimation filter having a parallelization factor of 2.

FIG. 6 is a block diagram illustrating a prior art decimation filter 318 having a parallelization factor of 2.

The decimation filter 318 is also a finite impulse response (FIR) filter that filters the input signal x(n) by multiplying an array of the most recent input samples x(n) by the array of filter coefficients $h_k$ and summing the elements of the resulting array. The decimation filter 318 also has a length L, meaning the input signal x(n) is filtered by L filter coefficients $h_k$ where k is each integer between 0 and L−1. The decimation filter 318 has a parallelization factor of 2, meaning two decimated output samples y(m) and y(m−1) are produced every clock cycle. The decimation filter 318 is a decimate-by-2 filter, meaning each two output samples y(m) and y(m−1) are produced using the four most recent input samples, x(n−3), x(n−2), x(n−1) and x(n).

The decimate-by-2 filter 318 includes two parallel filters 601 and 602. The first filter 601 produces the decimated output sample y(m) using the four input samples, x(n−3), x(n−2), x(n−1) and x(n). The second filter 602 includes a first delay register 614, which stores the input sample x(n) and delays the input sample x(n) by 1 clock cycle, and a second delay register 615, which stores the input sample x(n−1) and delays the input sample x(n−1) by 1 clock cycle. The output of the first delay register 614 is the input sample x(n−4), which is the input sample x(n) of the previous clock cycle. The output of the second delay register 615 is the input sample x(n−5), which is the input sample x(n−1) of the previous clock cycle. The delay registers 614 and 615 may be implemented using any digital storage element (e.g., flip-flops). The second filter 602 produces the decimated output sample y(m−1) using the input samples x(n−3) and x(n−2), the input sample x(n−4) output by the first delay register 614, and the input sample x(n−5) output by the second delay register 615.

In the embodiment of FIG. 6, each filter 601 or 602 includes ⌈L/4⌉ filter stages 520. For ease of reference, some of the filter stages 520 are individually identified as the initial filter stage 520a, the second filter stage 520b, the penultimate filter stage 520y, and the final filter stage 520z. Like the decimation filter 329, each filter stage 520 of each filter 601 or 602 includes a memory register 580 that stores the partial sum for that filter stage 520 and an adder 560 that computes the partial sum for that filter stage 520 by adding the partial sum stored in the memory register 580 of the preceding filter stage 520 to the filtered input samples. The memory registers 580 may be implemented using any digital storage element (e.g., flip-flops).

Each filter stage 520 of each filter 601 or 602 also includes four multipliers (not shown) that each filter one of the input samples by a specified filter coefficient $h_k$. The initial filter stage 520a of the first filter 601, for example, includes a first multiplier that filters the input sample x(n) by the filter coefficient $h_{L-3}$, a second multiplier that filters the input sample x(n−1) by the filter coefficient $h_{L-2}$, a third multiplier that filters the input sample x(n−2) by the filter coefficient $h_{L-1}$, and a fourth multiplier that filters the input sample x(n−3) by filter coefficient $h_L$. Since the filter coefficients $h_k$ are known, the multipliers may be realized using a CSD-based implementation.

Like the decimation filter 329 of FIG. 5C, the decimation filter 318 of FIG. 6 is a finite impulse response (FIR) filter that filters the input signal x(n) by multiplying the most recent input samples x(n−3) through x(n) by the array of filter coefficients $h_k$ and summing the elements of the resulting array. The decimation filter 318 of FIG. 6, however, has a parallelization factor of 2 and produces two output samples y(m) and y(m−1) every clock cycle, which are stored in the memory registers 580 of the final filter stage 520z of each filter 601 and 602. The output sample y(m) is generated by the first filter 601 using the four input samples x(n−3) through x(n) and the output sample y(m−1) is simultaneously generated by the second filter 602 using the input samples x(n−3) and x(n−2) and the input samples x(n) and x(n−1) of the previous clock cycle. The output samples y(m) and y(m−1) are represented mathematically as follows:

$$y(m) = \sum_{k=0}^{L-1} h_k x(n-k)$$

$$y(m-1) = \sum_{k=0}^{L-1} h_k x(n-k-2)$$

where n=2 m.

Figure 7:
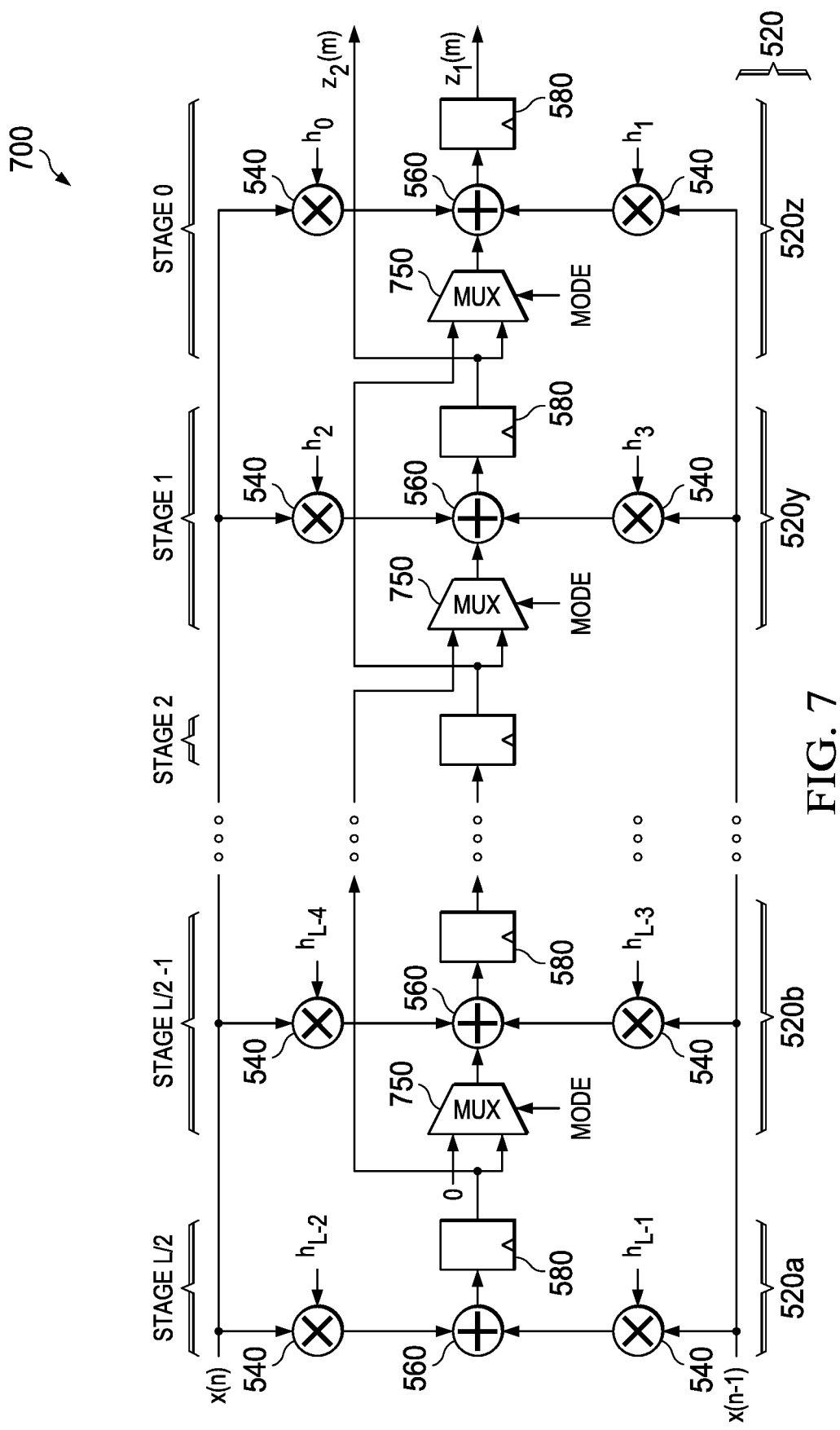
FIG. 7 a block diagram of a reconfigurable decimation filter microarchitecture according to an illustrative embodiment.

FIG. 7 a block diagram of a reconfigurable decimation filter microarchitecture 700 according to an illustrative embodiment.

Like the prior art decimation filter 329, the reconfigurable decimation filter microarchitecture 700 filters input samples x(n), where n is the sampling index of the input samples x(n) over time, and has a length L, meaning the input signal is filtered by L filter coefficients $h_k$ (where k is an integer between 0 and L−1). The reconfigurable decimation filter microarchitecture 700 receives two input samples x(n) and x(n−1), where x(n−1) is the input sample immediately preceding x(n) over time.

The reconfigurable decimation filter microarchitecture 700 has ⌈L/2⌉ filter stages 520. (If the length L is an odd number, then the number of filter stages 520 is L/2 rounded up to the nearest integer.) For ease of reference, some of the L/2 filter stages 520 are individually identified as the initial filter stage 520a

$$\left(\text{``Stage } \frac{L}{2}\text{''}\right),$$

the second filter stage 520b

$$\left(\text{``Stage } \frac{L}{2}-1\text{''}\right),$$

the penultimate filter stage 520y ("Stage 1"), and the final filter stage 520z ("Stage 0"). As described in detail below with reference to FIGS. 8 and 9, the reconfigurable decimation filter microarchitecture 700 may generate two subout-puts: $z_1(m)$, which is stored in the memory register 580 of the final filter stage 520z (Stage 0), and $z_2(m)$, which is stored in the memory register 580 of the penultimate filter stage 520y (Stage 1).

Some of the reconfigurable decimation filter microarchitecture 700 is similar to the prior art decimation filter 329. Each filter stage 520 (with the possible exception of the initial stage 520a) includes two multipliers 540 that each filter one of the input samples x(n) or x(n−1) by the specified filter coefficient $h_k$ of that multiplier 540. (If the length L of the filter is odd, the initial filter stage 520a includes only one multiplier 540.) Since the filter coefficients $h_k$ are known, the multipliers 540 may be realized using a CSD-based implementation. Each filter stage 520 includes a memory register 580 that stores a partial sum for that filter stage 520. The memory registers 580 may be implemented using any digital storage element (e.g., flip-flops). Each filter stage 520 (except the initial filter stage 520a when the length L of the filter is odd) includes an adder 560 that computes the partial sum for that filter stage 520. (If the length L of the filter is an odd number, the initial filter stage 520a requires only a single multiplier 540 and does not require an adder 560.) The adder 560 of each filter stage 520 adds the filtered input samples from the multipliers 540 in that filter stage 520. The partial sum of the initial filter stage 520a is either the sum (generated by the adder 560 of the initial filter stage 520a) of the filtered input signals output by both multipliers 540 of the initial filter stage 520a or the filtered input signal output by the single multiplier 540 of the initial filter stage 520a.

Unlike the prior art decimation filter 329, however, the adders 560 in the subsequent filter stages 520 after the initial filter stage 520a of the reconfigurable decimation filter microarchitecture 700 do not always add the partial sum of the immediately preceding filter stage 520. Instead, each filter stage 520 (except the initial filter stage 520a) of the reconfigurable decimation filter microarchitecture 700 includes a multiplexer 750. Each multiplexer 750 has two inputs, the output of the memory register 580 storing the partial sum of the immediately preceding filter stage 520 and the output of the memory register 580 from two stages prior. As shown in FIG. 7, for instance, the multiplexer 750 of the final filter stage 520z (Stage 0) may select either the output of memory register 580 of the penultimate filter stage 520y (Stage 1) or the output of memory register 580 of the filter stage 520 (labeled "Stage 2") immediately preceding the penultimate filter stage 520y. Because there is no filter stage 520 that is two stages prior to the second filter stage 520b, the two inputs of the multiplexer 750 of the second filter stage 520b are the output of the memory register 580 storing the partial sum of the immediately preceding filter stage 520, i.e. the initial filter stage 520a, and 0. Therefore, the adders 560 (in the subsequent filter stages 520 after the initial filter stage 520a) of the reconfigurable decimation filter microarchitecture 700 compute the partial sum of that filter stage 520 by adding the filtered input samples from the multipliers 540 in that filter stage 520 to the partial sum selected by the multiplexer 750.

As described in detail below with reference to FIGS. 8 and 9, the reconfigurable decimation filter microarchitecture 700 enables the dual mode decimation filter 800 to operate in either a dual band mode or a single band mode. In the dual band mode, each multiplexer 750 selects the partial sum of the immediately preceding filter stage 520. In the single band mode, each multiplexer 750 selects the partial sum of the filter stage 520 two stages prior (i.e., the partial sum of the filter stage 520 immediately preceding the immediately preceding filter stage 520).

Figure 8:
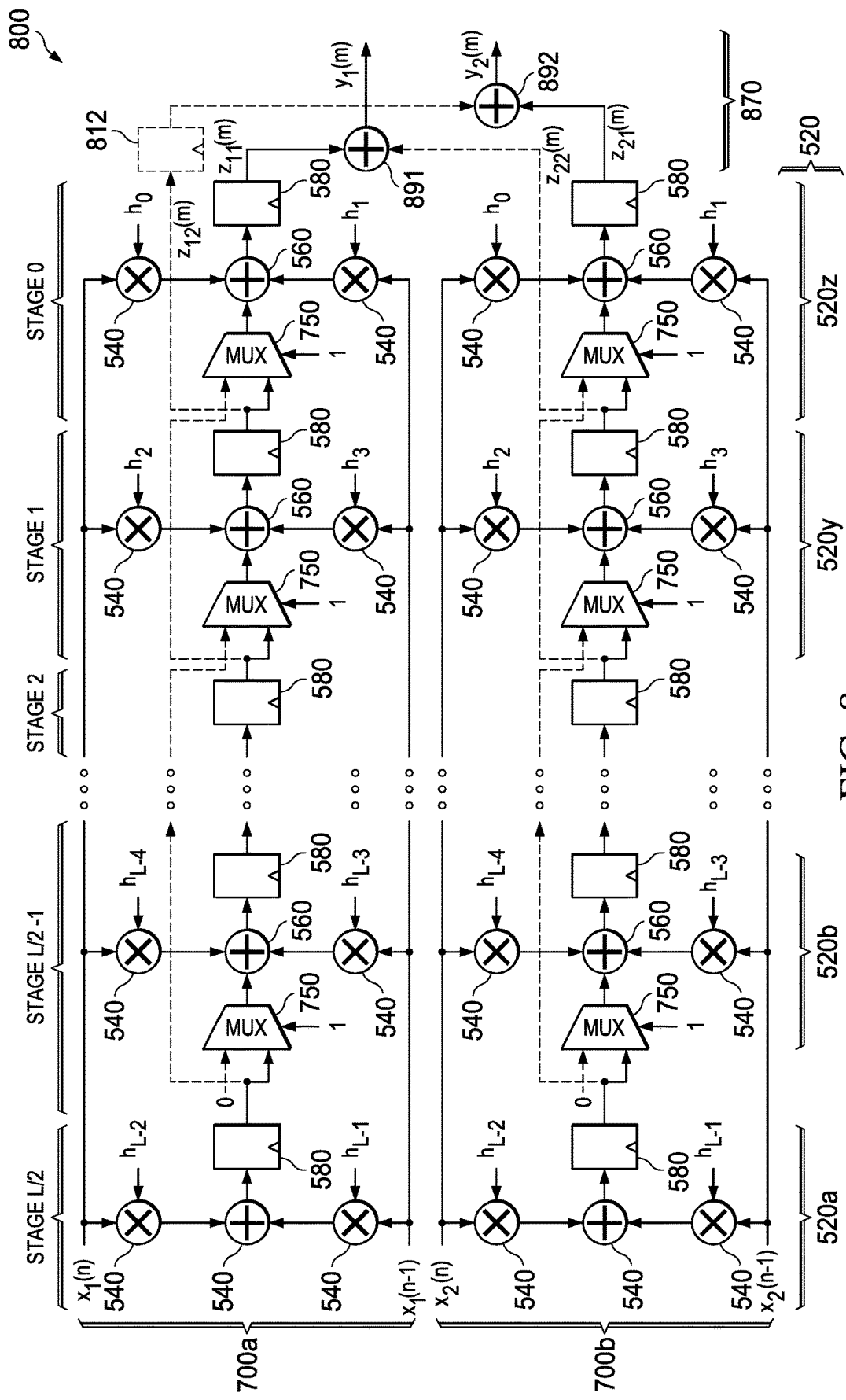
FIG. 8 is a block diagram of a dual mode decimation filter operating in a dual band mode (also a lower parallelization mode) according to an illustrative embodiment.
Figure 9:
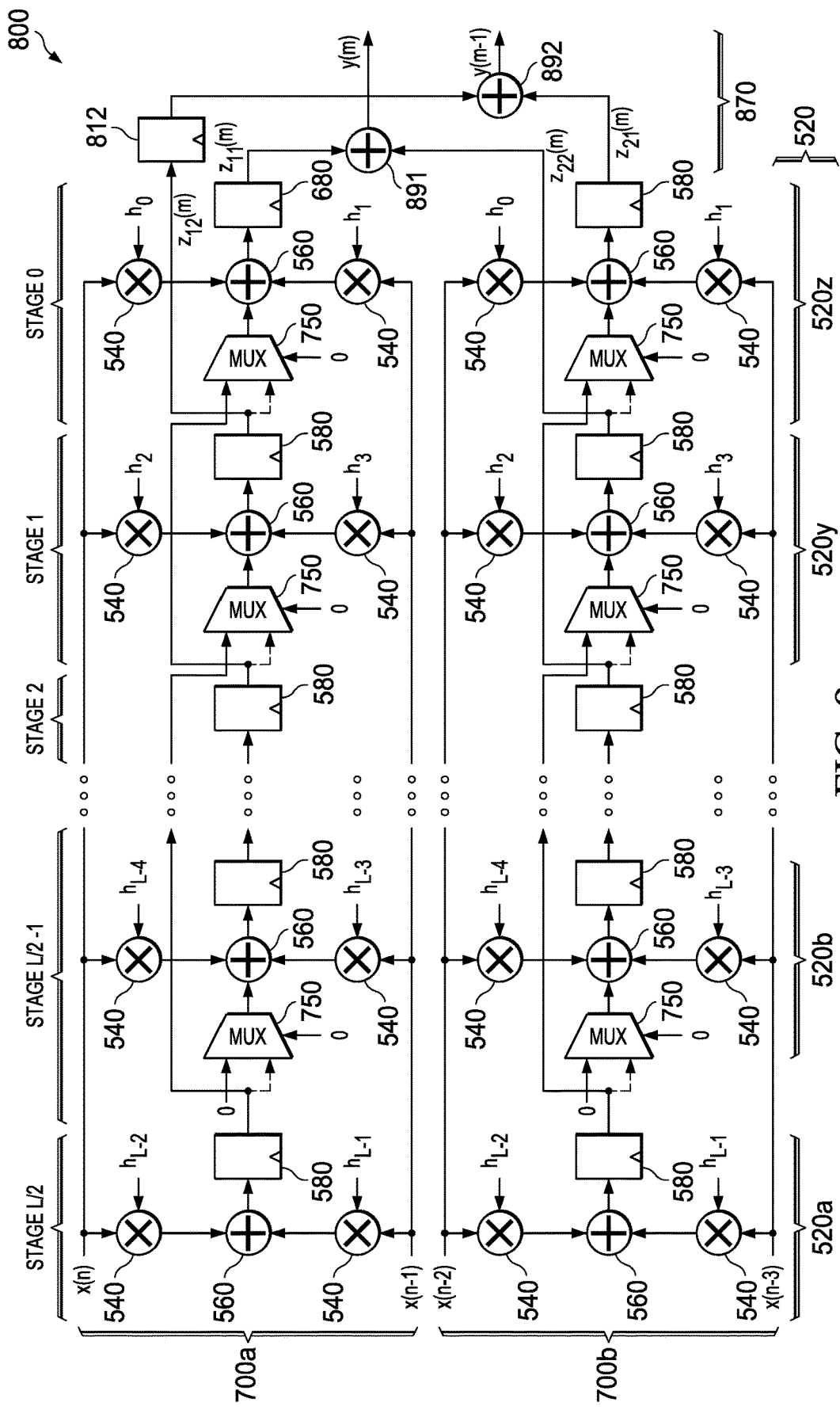
FIG. 9 is a block diagram of the dual mode decimation filter of FIG. 8 operating in a single band mode (also a higher parallelization mode) according to an illustrative embodiment.

FIGS. 8 and 9 are block diagrams of a dual mode decimation filter 800 according to illustrative embodiments. As shown in FIGS. 8 and 9, the dual mode decimation filter 800 includes two identical reconfigurable decimation filters 700a and 700b that each include the features of the reconfigurable decimation filter microarchitecture 700 of FIG. 7 described above. Specifically, the reconfigurable decimation filters 700a and 700b of the dual mode decimation filter 800 include the multiplexers 750 of the reconfigurable decimation filter microarchitecture 700.

Each reconfigurable decimation filter 700a and 700b has a length L, meaning the input signal is filtered by L filter coefficients $h_k$ (where k is an integer between 0 and L−1). Each reconfigurable decimation filter 700a and 700b has ⌈L/2⌉ filter stages 520. (If the length L is an odd number, then the number of filter stages 520 is L/2 rounded up to the nearest integer.) For ease of reference, some of the L/2 filter stages 520 are individually identified as the initial filter stage 520a $$\left(\text{"Stage } \frac{L}{2}\text{"}\right),$$

the second filter stage 520b $$\left(\text{"Stage } \frac{L}{2}-1\text{"}\right),$$

the penultimate filter stage 520y ("Stage 1"), and the final filter stage 520z ("Stage 0").

As described above with reference to FIG. 7, each filter stage 520 (with the possible exception of the initial stage 520a) of each reconfigurable decimation filter 700a and 700b includes two multipliers 540 that each filter one of the input samples (described below) by the specified filter coefficient $h_k$ of that multiplier 540. (If the length L is odd, the initial filter stage 520a includes only one multiplier 540.) Since the filter coefficients $h_k$ are known, the multipliers 540 may be realized using a CSD-based implementation. Each filter stage 520 of each reconfigurable decimation filter 700a and 700b includes a memory register 580 that stores a partial sum for that filter stage 520 of that reconfigurable decimation filter 700a or 700b. The memory registers 580 may be implemented using any digital storage element (e.g., flip-flops). Each filter stage 520 (except the initial filter stage 520a when the length L of the filter is odd) of each reconfigurable decimation filter 700a and 700b includes an adder 560 that computes the partial sum for that filter stage 520. (If the length L is odd, the initial filter stage 520a requires only a single multiplier 540 and does not require an adder 560.) The adder 560 of each filter stage 520 of each reconfigurable decimation filter 700a and 700b adds the filtered input samples output by the multipliers 540 in that filter stage 520 of that reconfigurable decimation filter 700a or 700b. The partial sum of the initial filter stage 520a of each reconfigurable decimation filter 700a and 700b is either the sum of the filtered input signals output by both multipliers 540 of the initial filter stage 520a of that reconfigurable decimation filter 700a or 700b (added together by the adder 560 of the initial filter stage 520a of that reconfigurable decimation filter 700a or 700b) or the filtered input signal output by the single multiplier 540 of the initial filter stage 520a of that reconfigurable decimation filter 700a or 700b. The partial sums for each of the subsequent filter stages 520b-520z (after the initial stage 520a) depend on whether the dual mode decimation filter 800 is operating in either a dual band mode (described below with reference to FIG. 8) or a single band mode (described below with reference to FIG. 9).

The dual mode decimation filter 800 also includes a mode-based processor 870, which includes two dual mode adders 891 and 892 and a delay circuit 812. As briefly mentioned above with reference to FIG. 7, the first reconfigurable decimation filter 700a may generate two suboutputs: $z_{11}(m)$, which is stored in the memory register 580 of the final filter stage 520z (Stage 0) of the first reconfigurable decimation filter 700a, and $z_{12}(m)$, which is stored in the memory register 580 of the penultimate filter stage 520y (Stage 1) of the first reconfigurable decimation filter 700a. Meanwhile, the second reconfigurable decimation filter 700b may also generate two suboutputs: $z_{21}(m)$, which is stored in the memory register 580 of the final filter stage 520z (Stage 0) of the second reconfigurable decimation filter 700b, and $z_{22}(m)$, which is stored in the memory register 580 of the penultimate filter stage 520y (Stage 1) of the second reconfigurable decimation filter 700b.

The first dual mode adder 891 has two inputs, a first input that receives the first suboutput $z_{11}(m)$ of the first reconfigurable decimation filter 700a from the memory register 580 of the final filter stage 520z (Stage 0) of the first reconfigurable decimation filter 700a and a second input that receives the second suboutput $z_{22}(m)$ of the second reconfigurable decimation filter 700b stored in the memory register 580 of the penultimate filter stage 520y (Stage 1) of the second reconfigurable decimation filter 700b.

The second dual mode adder 892 has two inputs, a first input that receives the first suboutput $z_{21}$(m) of the second reconfigurable decimation filter 700b from the memory register 580 of the final filter stage 520z (Stage 0) of the second reconfigurable decimation filter 700b and a second input that receives the second suboutput $z_{12}$(m) of the first reconfigurable decimation filter 700a output by the memory register 580 of the penultimate filter stage 520y (Stage 1) of the first reconfigurable decimation filter 700a to the delay circuit 812.

In the single band mode (described below with reference to FIG. 9), the first dual mode adder 891 outputs the sum of the first suboutput $z_{11}$(m) of the first reconfigurable decimation filter 700a and the second suboutput $z_{22}$(m) of the second reconfigurable decimation filter 700b. Similarly, in the single band mode, the second dual mode adder 892 outputs the sum of the first suboutput $z_{21}$(m) of the second reconfigurable decimation filter 700b and the second suboutput $z_{12}$(m) of the first reconfigurable decimation filter 700a.

In the dual band mode (described below with reference to FIG. 8), the first dual mode adder 891 outputs the first suboutput $z_{11}$(m) of the first reconfigurable decimation filter 700a. Similarly, in the dual band mode, the second dual mode adder 892 outputs the first suboutput $z_{21}$(m) of the second reconfigurable decimation filter 700b.

As described in detail below with reference to FIGS. 8 and 9, the mode-based processor 870 and the multiplexers 750 in the reconfigurable decimation filter microarchitecture 700 enable the dual mode decimation filter 800 to operate in either a dual band mode (described below with reference to FIG. 8) or a single band mode (described below with reference to FIG. 9).

FIG. 8 is a block diagram of the dual mode decimation filter 800 operating in a dual band mode (also a lower parallelization mode) according to an illustrative embodiment.

When operating in the dual band mode shown in FIG. 8, each multiplexer 750 of each filter stage 520 in each reconfigurable decimation filter 700a and 700b is configured to select (e.g. based on a logic "1" being supplied to the mode selection input of each multiplexer 750) the partial sum stored in the memory register 580 of the immediately preceding filter stage 520. (The inputs selected by the multiplexers 750 in the dual band mode are shown in FIG. 8 as solid lines while the inputs not selected by the multiplexers 750 in the dual band mode are shown as dashed lines.)

In the dual band mode shown in FIG. 8, the first reconfigurable decimation filter 700a generates filters an input signal $x_1$(n) of a first band, specifically by multiplying an array of the most recent input samples $x_1$(n−1) and $x_1$(n) by an array of filter coefficients $h_k$ and summing the elements of the resulting array. To do so, each multiplier 540 of the first reconfigurable decimation filter 700a filters one of the input samples $x_1$(n) or $x_1$(n−1) by the specified filter coefficient $h_k$ of that multiplier 540, each memory register 580 of each filter stage 520 stores the partial sum for that filter stage 520, each multiplexer 750 in each filter stage 520 selects the partial sum of the immediately preceding filter stage 520, and each adder 560 generates the partial sum for that filter stage 520 by adding the filtered input samples of that filter stage 520 (output by the multipliers 540 of that filter stage 520) to the partial sum of the immediately preceding filter stage 520 (selected by the multiplexer 750 of that filter stage 520).

Similarly, in the dual band mode shown in FIG. 8, the second reconfigurable decimation filter 700b filters input samples $x_2$(n) of a second band, specifically by multiplying an array of the most recent input samples $x_2$(n−1) and $x_2$(n) by the array of filter coefficients $h_k$ and summing the elements of the resulting array. To do so, each multiplier 540 of the second reconfigurable decimation filter 700b filters one of the input samples $x_2$(n) or $x_2$(n−1) by the specified filter coefficient $h_k$ of that multiplier 540, each memory register 580 of each filter stage 520 stores the partial sum for that filter stage 520, each multiplexer 750 in each filter stage 520 selects the partial sum of the immediately preceding filter stage 520, and each adder 560 generates the partial sum for that filter stage 520 by adding the filtered input samples output by the multipliers 540 of that filter stage to the partial sum of the immediately preceding filter stage 520 selected by the multiplexer 750 of that filter stage 520.

As described above, in the dual band mode shown in FIG. 8, each of the reconfigurable decimation filters 700a and 700b are used separately so that each filter an input signal $x_1$(n) or $x_2$(n) in one of two bands. Meanwhile, because each multiplexer 750 (in the dual band mode) selects the partial sum of the immediately preceding filter stage 520, each reconfigurable decimation filter 700a and 700b filters the input signal $x_1$(n) or $x_2$(n) received by that reconfigurable decimation filter 700a or 700b by the entire array of L filter coefficients $h_k$ using every filter stage 520 of that reconfigurable decimation filter 700a or 700b. Specifically, the output of the memory register 580 of the final filter stage 520z of the first reconfigurable decimation filter 700a, identified as the first suboutput $z_{11}$(m) of the first reconfigurable decimation filter 700a, is the input signal $x_1$(n) in the first band filtered by the entire array of L filter coefficients $h_k$ by every final filter stage 520 of the first reconfigurable decimation filter 700a. Similarly, the output of the memory register 580 of the final filter stage 520z of the second reconfigurable decimation filter 700b, identified as the first suboutput $z_{21}$(m) of the second reconfigurable decimation filter 700b, is the input signal $x_2$(n) in the second band filtered by the entire array of L filter coefficients $h_k$.

Because each of the reconfigurable decimation filters 700a and 700b are used separately in the dual band mode, the mode-based processor 870 does not add the suboutputs from both reconfigurable decimation filters 700a and 700b in the dual band mode. Instead, because the first suboutput $z_{11}$(m) of the first reconfigurable decimation filter 700a is the input signal $x_1$(n) in the first band filtered by the entire array of L filter coefficients $h_k$, the first dual mode adder 891 selects the first sub-output $z_{11}$(m) of the first reconfigurable decimation filter 700a as the first output signal $y_1$(m) of the dual mode decimation filter 800. Similarly, because the first suboutput $z_{21}$(m) of the second reconfigurable decimation filter 700b is the input signal $x_2$(n) in the second band filtered by the entire array of L filter coefficients $h_k$, the second dual mode adder 892 selects the second sub-output $z_{21}$(m) of the second reconfigurable decimation filter 902 as the second output sample $y_2$(m) of the dual mode decimation filter 800.

When operating in the dual band mode shown in FIG. 8, each reconfigurable decimation filter 700a or 700b of the dual mode decimation filter 800 has a parallelization factor of 1, generating one output sample $y_1$(m) or $y_2$(m) in each of two separate bands. In the specific embodiment shown in FIG. 8, each reconfigurable decimation filter 700a or 700b is a decimate-by-2 filter that generates the output samples $y_1$(m) or $y_2$(m) represented mathematically as follows:

$$y_1(m) = \sum_{k=0}^{L-1} h_k x_1(n-k)$$

$$y_2(m) = \sum_{k=0}^{L-1} h_k x_2(n-k)$$

where n=2 m.

In the dual band mode, each of the reconfigurable decimation filters 700a and 700b of the dual mode decimation filter 800 may be configured to perform the same function as the prior art decimation filter 329 of FIG. 5C. Therefore, in the dual band mode, the dual mode decimation filter 800 can perform the functions of the both prior art decimation filters 329 in the dual band DDC chain 320 of FIG. 3. Specifically, the first reconfigurable decimation filter 700a of the dual mode decimation filter 800 can perform the decimation performed by the first decimation filter 329 in the first band of the dual band DDC chain 320 and the second reconfigurable decimation filter 700b of the dual mode decimation filter 800 can simultaneously perform the decimation performed by the second decimation filter 329 in the second band of the dual band DDC chain 320. In those instances, the input signal $x_1(n)$ of FIG. 8 is the resampled receive signals in the first band output by the first resampling filter 327 in the first band of the dual band DDC chain 320 and the output signal $y_1(m)$ of FIG. 8 is the down-sampled baseband receive signals in the first band previously generated by the prior art digital down-converter 121 of FIG. 3 using the first decimation filter 329 in the first band of the dual band DDC chain 320. Similarly, in those instances, the input signal $x_2(n)$ of FIG. 8 is the resampled receive signals in the second band output by the second resampling filter 327 in the second band of the dual band DDC chain 320 and the output signal $y_2(m)$ of FIG. 8 is the down-sampled baseband receive signals in the second band previously generated by the prior art digital down-converter 121 of FIG. 3 using the second decimation filter 329 in the second band of the dual band DDC chain 320.

FIG. 9 is a block diagram of the dual mode decimation filter 800 operating in a single band mode (also a higher parallelization mode) according to an illustrative embodiment.

As shown in FIG. 9, when operating in the single band mode, each multiplexer 750 of each filter stage 520 in each reconfigurable decimation filter 700a or 700b is configured to select (e.g. based on a logic "0" being supplied to the mode selection input of each multiplexer 750) the partial sum stored in the memory register 580 two stages prior. (The inputs selected by the multiplexers 750 in the single band mode are shown in FIG. 9 as solid lines while the inputs not selected by the multiplexers 750 in the single band mode are shown as dashed lines.)

Because each multiplexer 750 in the single band mode selects the partial sum stored in the memory register 580 two stages prior, each reconfigurable decimation filter 700a and 700b is each effectively divided into two sub-chains that include either the odd-numbered filter stages 520 or the even numbered filter stages 520 of that reconfigurable decimation filter 700a or 700b. For example, the first sub-output $z_{11}(m)$ of the first reconfigurable decimation filter 700a, which is stored in the memory register 580 of the final stage 520z (Stage 0) of the first reconfigurable decimation filter 700a, is generated by the first reconfigurable decimation filter 700a by adding the partial sums stored in the memory registers 580 from each of the even-numbered filter stages 520 (Stage 0, Stage 2, etc.) of the first reconfigurable decimation filter 700a. Meanwhile, the second sub-output $z_{12}(m)$ of the first reconfigurable decimation filter 700a, which is stored in the memory register 680 of the penultimate stage 520y (Stage 1) of the first reconfigurable decimation filter 700a, is generated by adding the partial sums stored in the memory registers 580 from each of the odd-numbered stages (Stage 1, Stage 3, etc.) of the first reconfigurable decimation filter 700a. Similarly, the sub-output $z_{21}(m)$ of the second reconfigurable decimation filter 700b, stored in the memory register 580 of the final stage 520z (Stage 0) of the second reconfigurable decimation filter 700b, is generated by adding the partial sums stored in the memory registers 580 from each of the even-numbered stages (Stage 0, Stage 2, etc.) of the second reconfigurable decimation filter 700b and the second sub-output $z_{22}(m)$ of the second reconfigurable decimation filter 700b, which is stored in the memory register 580 of the penultimate stage 520y (Stage 1) of the second reconfigurable decimation filter 700b, is generated by adding the partial sums stored in the memory registers 580 from each of the odd-numbered stages (Stage 1, Stage 3, etc.) of the second reconfigurable decimation filter 700b.

In the single band mode shown in FIG. 9, both of the reconfigurable decimation filters 700a and 700b are used to filter an input signal x(n) of a single band, specifically by multiplying an array of the most recent input samples x(n−3) through x(n) by an array of filter coefficients $h_k$ and summing the elements of the resulting array. To do so, the first reconfigurable decimation filter 700a is used to generate two sub-outputs $z_{11}(m)$ and $z_{12}(m)$ from the two input samples x(n−1) and x(n) and the second reconfigurable decimation filter 700b is used to generate two sub-outputs $z_{21}(m)$ and $z_{22}(m)$ from the two input samples x(n−3) and x(n−2).

The first suboutput $z_{11}(m)$ of the first reconfigurable decimation filter 700a is generated by filtering the two input samples x(n−1) and x(n) by the filter coefficients $h_k$ of the even-numbered filter stages 520 and the second suboutput $z_{12}(m)$ of the first reconfigurable decimation filter 700a is generated by filtering the input samples x(n−1) and x(n) by the filter coefficients $h_k$ of the odd-numbered filter stages 520. The first suboutput $z_{21}(m)$ of the second reconfigurable decimation filter 700b is generated by filtering the two input samples x(n−3) and x(n−2) by the filter coefficients $h_k$ of the even-numbered filter stages 520 and the second suboutput $z_{22}(m)$ of the second reconfigurable decimation filter 700b is generated by filtering the two input samples x(n−3) and x(n−2) by the filter coefficients $h_k$ of the odd-numbered filter stages 520.

In the single band mode, the mode-based processor 870 generates two output samples y(m) and y(m−1). Specifically, the first dual mode adder 871 generates the first output sample y(m) by adding the first suboutput $z_{11}(m)$ of the first reconfigurable decimation filter 700a and the second sub-output $z_{22}(m)$ of the second reconfigurable decimation filter 700b. Similarly, the second dual mode adder 872 generates the second output sample y(m−1) by adding the first sub-output $z_{21}(m)$ of the second reconfigurable decimation filter 700b and the second suboutput $z_{12}(m)$ of the first reconfigurable decimation filter 700b with the appropriate delay provided by the delay circuit 912.

Both of the output samples y(m) and y(m−1) are filtered by all of the filter coefficients $h_k$, because y(m) is the sub-output $z_{11}(m)$ filtered by the even-numbered filter stages 520 of the first reconfigurable decimation filter 700a and the sub-output $z_{22}(m)$ filtered by the odd-numbered filter stages 520 of the second reconfigurable decimation filter 700*b*; and y(m−1) is the sub-output $z_{21}(m)$ filtered by the even-numbered filter stages 520 of the second reconfigurable decimation filter 700*b* and the sub-output $z_{12}(m)$ filtered by the odd-numbered filter stages 520 of the first reconfigurable decimation filter 700*a*.

When operating in the single band mode shown in FIG. 9, the dual mode decimation filter 800 has a parallelization factor of 2, generating two output samples y(m−1) and y(m) every clock cycle. The output samples y(m) and y(m−1) are represented mathematically as follows:

$$y(m) = \sum_{k=0}^{L-1} h_k x(n-k)$$

$$y(m-1) = \sum_{k=0}^{L-1} h_k x(n-k-2)$$

where n=2m.

In the single band mode shown in FIG. 9, the dual mode decimation filter 800 decimates input samples in a single band with higher parallelization than when operating in the dual band mode shown in FIG. 8. Therefore, in the single band mode shown in FIG. 9, the dual mode decimation filter 800 is capable of performing the same function as the prior art decimation filter 318 of FIG. 6. For instance, the input samples x(n−3) through x(n) of FIG. 9 may be the resampled baseband receive signals output by the resampling filter 316 in the single band DDC chain 310. In those instances, the output samples y(m−1) and y(m) of FIG. 8 are the down-sampled baseband receive signals previously generated by the prior art digital down-converter 121 of FIG. 3 using the decimation filter 318 of the single band DDC chain 310. Because the dual mode decimation filter 800 can perform the functions of both the prior art decimation filters 329 of FIGS. 3 and 5C (when operating in the dual band mode) and the prior art decimation filter 318 of FIGS. 3 and 6 (when operating in the single band mode), the dual mode decimation filter 800 eliminates the need for duplicate hardware elements to support both the single band mode and the dual band mode.

Dual Mode Resampling Filter

Figure 10:
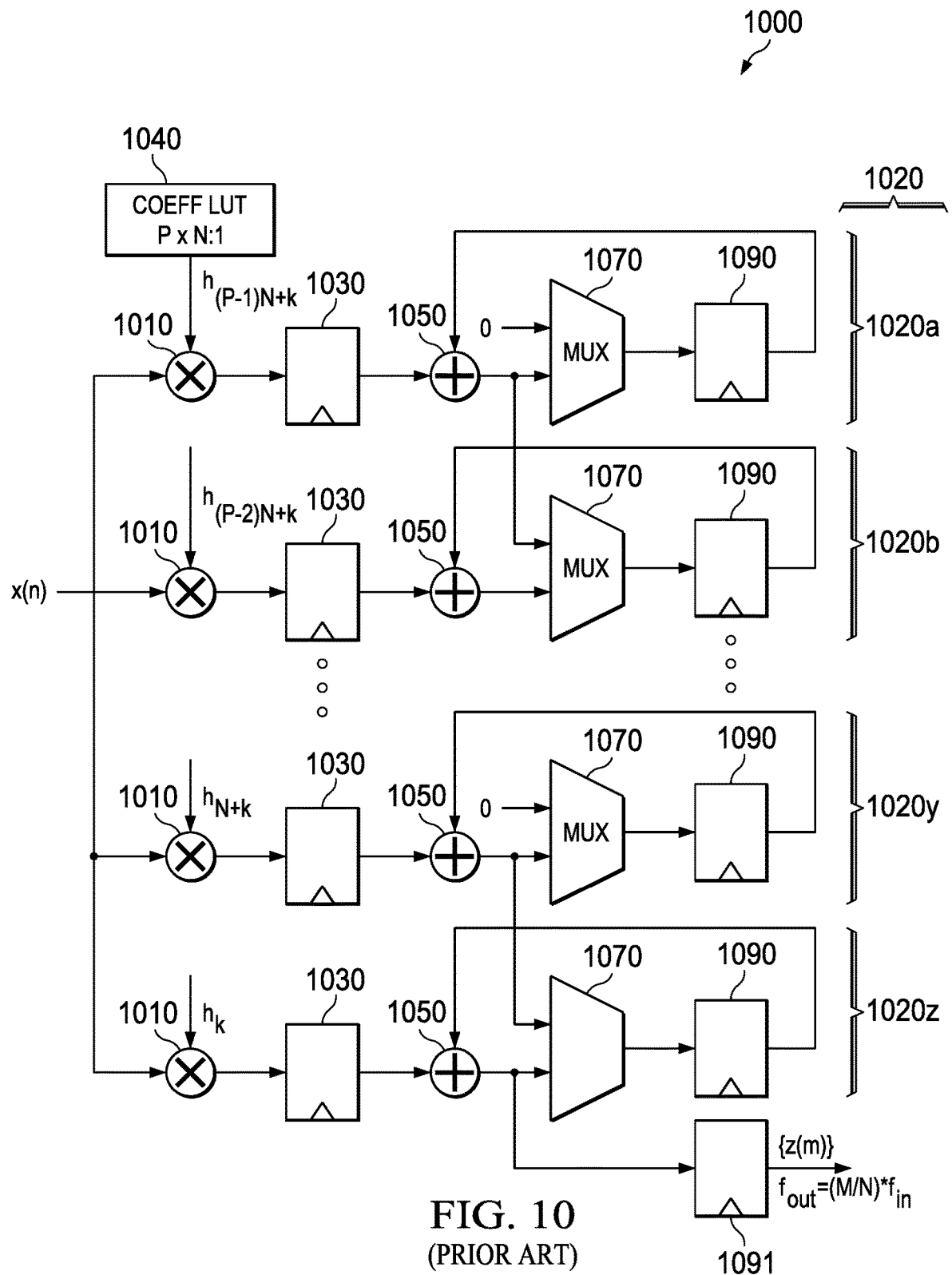
FIG. 10 is a diagram of a prior art "ripple-down" form resampling filter of U.S. Pat. No. 9,923,737.

FIG. 10 is a diagram of a prior art "ripple-down" form M/N resampling filter 1000 as described in U.S. Pat. No. 9,923,737. As described in U.S. Pat. No. 9,923,737, the prior art M/N resampling filter 1000 generates M output samples z(m) for every N input samples {x(n−N+1), x(n)}. The resampling filter 1000 has a length L, meaning the input samples x(n) are filtered by L filter coefficients $h_k$ where k is each integer between 0 and L−1. The L filter coefficients are stored in a filter coefficient look-up table 1040.

In the embodiment shown in FIG. 10, the resampling filter 1000 includes P filter stages 1020, where P=⌈L/N⌉ and the ⌈ ⌉ symbol represents a ceiling operation where the operand is rounded up to the nearest integer. (However, as described in U.S. Pat. No. 9,923,737, other resampling filters may include P=⌈L/M⌉ filter stages 1020.) For ease of reference, some of the filter stages 1020 are identified as the initial filter stage 1020*a*, the second filter stage 1020*b*, the penultimate filter stage 1020*y*, and the final filter stage 1020*z*. Each filter stage 1020 includes a multiplier 1010, a first memory register 1030, an adder 1050, a multiplexer 1070, and second memory register 1090. The output samples z(m), which are generated by adder 1050 of the final filter stage 1020*z*, are stored in an output memory register 1091. The memory registers 1030, 1090, and 1091 may be implemented using any digital storage element (e.g., flip-flops).

In each filter stage 1020, the multiplier 1010 scales the input sample by the filter coefficient for that filter stage 1020. (As described in U.S. Pat. No. 9,923,737, each of the P multipliers 1010 cycles through a different set of by N filter coefficients $h_k$, the P sets of N coefficients making a total of L filter coefficients $h_k$.) The coefficient scaled input sample for each filter stage 1020 is stored in the first memory register 1030 of that filter stage 1020. In each filter stage 1020, the adder 1050 generates a partial sum for that filter stage 1020 by adding the coefficient scaled input sample for that filter stage 1020 to the partial sum stored in the second memory register 1090 of that filter stage 1020. The partial sum stored in the second memory register 1090 of each filter stage 1020 depends on the output of the multiplexer 1070 of that filter stage 1020, which has a first input coupled to the output of the adder 1050 of that filter stage 1020 and a second input coupled to the adder 1050 of the immediately preceding filter stage 1020 (except in the initial filter stage 1020*a*, which has no immediately preceding filter stage 1020, where the second input of the multiplexer 1070 is 0). When generating an output sample z(m), the multiplexers 1070 in each filter stage 1020 select the partial sum generated by the immediately preceding filter stage 1020, allowing the partial sums generated by the adders 1050 to be "rippled down" to the next successive filter stage 1020. In those instances, the multiplexer 1070 in the initial filter stage 1020*a* selects a logic "0" to reset the second memory register 1090 of the initial filter stage 1020*a*. However, the resampling filter 1000 does not generate an output sample z(m) every Nth input sample index. When the resampling filter 1000 does not generate an output sample z(m), the multiplexers 1070 in each filter stage select the partial sum generated by the adder 1050 in that filter stage 1020, enabling each filter stage 1020 to retain the partial sum of that filter stage 1020 in the second memory register 1090 of that filter stage 1020.

Accordingly, as described above, the prior art M/N resampling filter 1000 computes M filtered output samples z(m) from N input samples {x(n−N+1), x(n)}.

Figure 11:
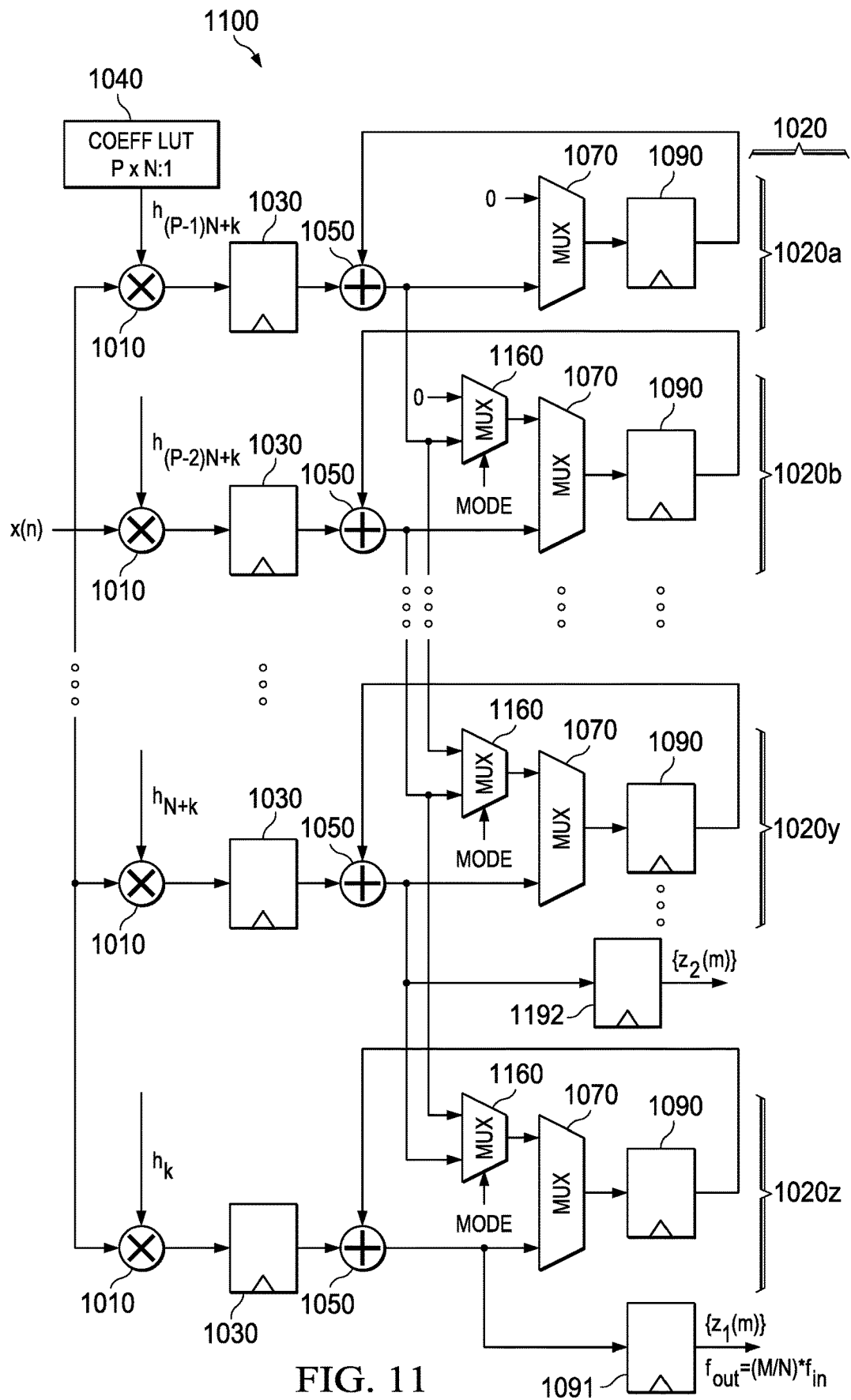
FIG. 11 is a diagram of a reconfigurable resampling filter microarchitecture according to an illustrative embodiment.

FIG. 11 is a diagram of a reconfigurable resampling filter microarchitecture 1100 according to an illustrative embodiment.

The reconfigurable resampling filter microarchitecture 1100 includes multiple stages 1020, including an initial filter stage 1020*a*, a second filter stage 1020*b*, a penultimate filter stage 1020*y*, and a final filter stage 1020*z*. Each filter stage 1020 includes a multiplier 1010, a first memory register 1030, an adder 1050, a multiplexer 1070, and a second memory register 1090. The reconfigurable resampling filter microarchitecture 1100 also includes a filter coefficient look-up table 1040, which stores the filter coefficients $h_k$ used by the multipliers 1010. A first output memory register 1091 stores the partial sum generated by the adder 1050 of the final filter stage 1020*z*, which is output as a first filtered output $z_1(m)$ of the reconfigurable resampling filter microarchitecture 1100. Each multiplier 1010 scales the input sample by a filter coefficient $h_k$ and each first memory register 1030 stores the coefficient scaled input sample for that filter stage 1020. In each filter stage 1020, the adder 1050 generates a partial sum for that filter stage 1020 by adding the coefficient scaled input sample for that filter stage 1020 to the partial sum stored in the second memory register 1090 of that filter stage 1020, which depends on the output of the multiplexer 1070 of that filter stage 1020, which has a first input coupled to the output of the adder 1050 of that filter stage 1020.

Unlike resampling filter 1000, however, the second input of the multiplexer 1070 is not always provided with the partial sum of the immediately preceding filter stage 1020. Instead, each filter stage 1020 (except the initial stage 1020a) of the reconfigurable resampling filter microarchitecture 1100 includes an additional multiplexer 1160 configured to select either the partial sum from the immediately preceding filter stage 1020 or the partial sum from two stages prior. The second input of the multiplexer 1070 in each filter stage 1020 (except the initial stage 1020a) of the reconfigurable resampling filter microarchitecture 1100 is coupled to the output of the additional multiplexer 1160, which includes a first input coupled to the output of the adder 1050 of the immediately preceding filter stage 1020 and a second input coupled to the output of the adder 1050 of the filter stage 1020 immediately preceding the immediately preceding filter stage 1020. Because there is no filter stage 1020 that is two stages prior to the second filter stage 1020b, the two inputs of the additional multiplexer 1160 of the second filter stage 1020b are the output of the adder 1050 that generates the partial sum of the immediately preceding filter stage 1020, i.e. the initial filter stage 1020a, and a logic "0" value. Additionally, the reconfigurable resampling filter microarchitecture 1100 includes a second output memory register 1192 that stores the output of the adder 1050 of the penultimate stage 1020y, which is output as the second filtered output $z_2(m)$ of the reconfigurable resampling filter microarchitecture 1100.

As described in detail below with reference to FIGS. 12 and 13, the reconfigurable resampling filter microarchitecture 1100 enables the dual mode resampling filter 1200 to operate in either a dual band mode or a single band mode. In the dual band mode, each additional multiplexer 1160 selects the partial sum of the immediately preceding filter stage 1020. In the single band mode, each additional multiplexer 1160 selects the partial sum of the filter stage 1020 two stages prior (i.e., the partial sum of the filter stage 1020 immediately preceding the immediately preceding filter stage 1020).

FIGS. 12 and 13 are block diagrams of a dual mode resampling filter 1200 according to illustrative embodiments.

As shown in FIGS. 12 and 13, the dual mode resampling filter 1200 include two identical (or, at least, similar) reconfigurable resampling filters 1100a and 1100b that each include the features of the reconfigurable resampling filter microarchitecture 1100 of FIG. 11 described above. Specifically, the reconfigurable resampling filters 1100a and 1100b of the dual mode resampling filter 1200 include the additional multiplexers 1160 of the reconfigurable decimation filter microarchitecture 1100.

As described above with reference to FIG. 10, each reconfigurable resampling filter 1100a and 1100b includes multiple stages 1020, including an initial filter stage 1020a, a second filter stage 1020b, a penultimate filter stage 1020y, and a final filter stage 1020z. Each filter stage 1020 of each reconfigurable resampling filter 1100a and 1100b includes a multiplier 1010, a first memory register 1030, an adder 1050, a multiplexer 1070, and second memory register 1090. Each reconfigurable resampling filter 1100a and 1100b also includes a filter coefficient look-up table 1040 and a first output memory register 1091, which stores the partial sum generated by the final filter stage 1020z. Each multiplier 1010 scales the input sample by a filter coefficient $h_k$ selected from the coefficient look-up table 1040 and the first memory register 1030 of each filter stage 1020 stores the coefficient scaled input sample for that filter stage 1020. In each filter stage 1020, the adder 1050 generates a partial sum for that filter stage 1020 by adding the coefficient scaled input sample for that filter stage 1020 to the partial sum stored in the second memory register 1090 of that filter stage 1020. The partial sum stored in the second memory register 1090 of each filter stage 1020 depends on the output of the multiplexer 1070 of that filter stage 1020, which has a first input coupled to the output of the adder 1050 of that filter stage 1020. In the initial stage 1020a, the multiplexer 1070 has a first input coupled to a logic "0".

As described above with reference to FIG. 11, each filter stage 1020 (except the initial stage 1020a) of each reconfigurable resampling filter 1100a and 1100b includes an additional multiplexer 1160 configured to select either the partial sum from the preceding filter stage 1020 or the partial sum from two stages prior. Each reconfigurable resampling filter 1100a and 1100b also includes a second output memory register 1192, which stores the partial sum generated by the penultimate filter stage 1020y.

Like the dual mode resampling filter of FIGS. 8-9, the dual mode resampling filter 1200 also includes a mode-based processor 870, which includes two dual mode adders 891 and 892 and a delay circuit 812. As briefly mentioned above with reference to FIG. 11, the first reconfigurable resampling filter 1100a generates two suboutputs: $z_{11}(m)$, which is stored in the first output memory register 1091 of the first reconfigurable resampling filter 1100a and is generated by the final filter stage 1020z (Stage 0) of the first reconfigurable resampling filter 1100a; and $z_{12}(m)$, which is stored in the second output memory register 1192 of the first reconfigurable resampling filter 1100a and is generated by the penultimate filter stage 1020y (Stage 1) of the first reconfigurable resampling filter 1100a. Meanwhile, the second reconfigurable resampling filter 1100b also generates two suboutputs: $z_{21}(m)$, which is stored in the first output memory register 1091 of the second reconfigurable resampling filter 1100b and is generated by the final filter stage 1020z (Stage 0) of the second reconfigurable resampling filter 1100b; and $z_{22}(m)$, which is stored in the second output memory register 1192 of the second reconfigurable resampling filter 1100b and is generated by the penultimate filter stage 1020y (Stage 1) of the second reconfigurable resampling filter 1100b.

The first dual mode adder 891 has two inputs, a first input that receives the first suboutput $z_{11}(m)$ of the first reconfigurable resampling filter 1100a from the first output memory register 1091 of the first reconfigurable resampling filter 1100a and a second input that receives the second suboutput $z_{22}(m)$ of the second reconfigurable resampling filter 1100b from the second output memory register 1192 of the second reconfigurable resampling filter 1100b. The second dual mode adder 892 has two inputs, a first input that receives the first suboutput $z_{21}(m)$ of the second reconfigurable resampling filter 1100b from the first output memory register 1091 of the second reconfigurable resampling filter 1100b and a second input that receives the second suboutput $z_{12}(m)$ of the first reconfigurable resampling filter 1100a, stored in the second output memory register 1192 of the first reconfigurable resampling filter 1100a, via the delay circuit 812.

As described in detail below with reference to FIGS. 12 and 13, the mode-based processor 870 and the additional multiplexers 1160 in the reconfigurable resampling filter microarchitecture 1100 enable the dual mode resampling filter 1200 to operate in either a dual band mode (described below with reference to FIG. 12) or a single band mode (described below with reference to FIG. 13).

Figure 12A:
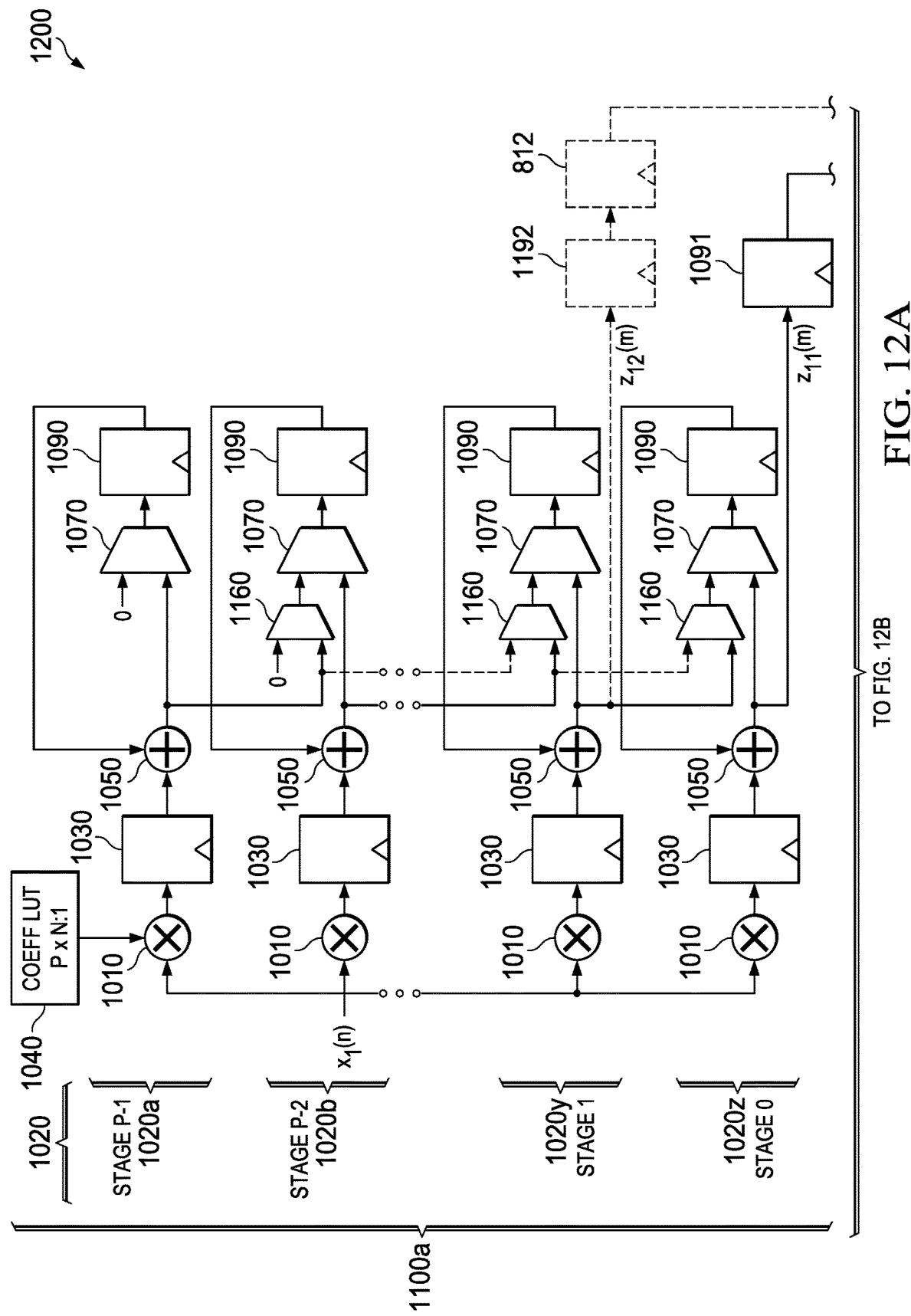
FIGS. 12A and 12B collectively form FIG. 12, which is a block diagram of a dual mode resampling filter in a dual band mode (with lower parallelization) according to an illustrative embodiment.
Figure 12B:
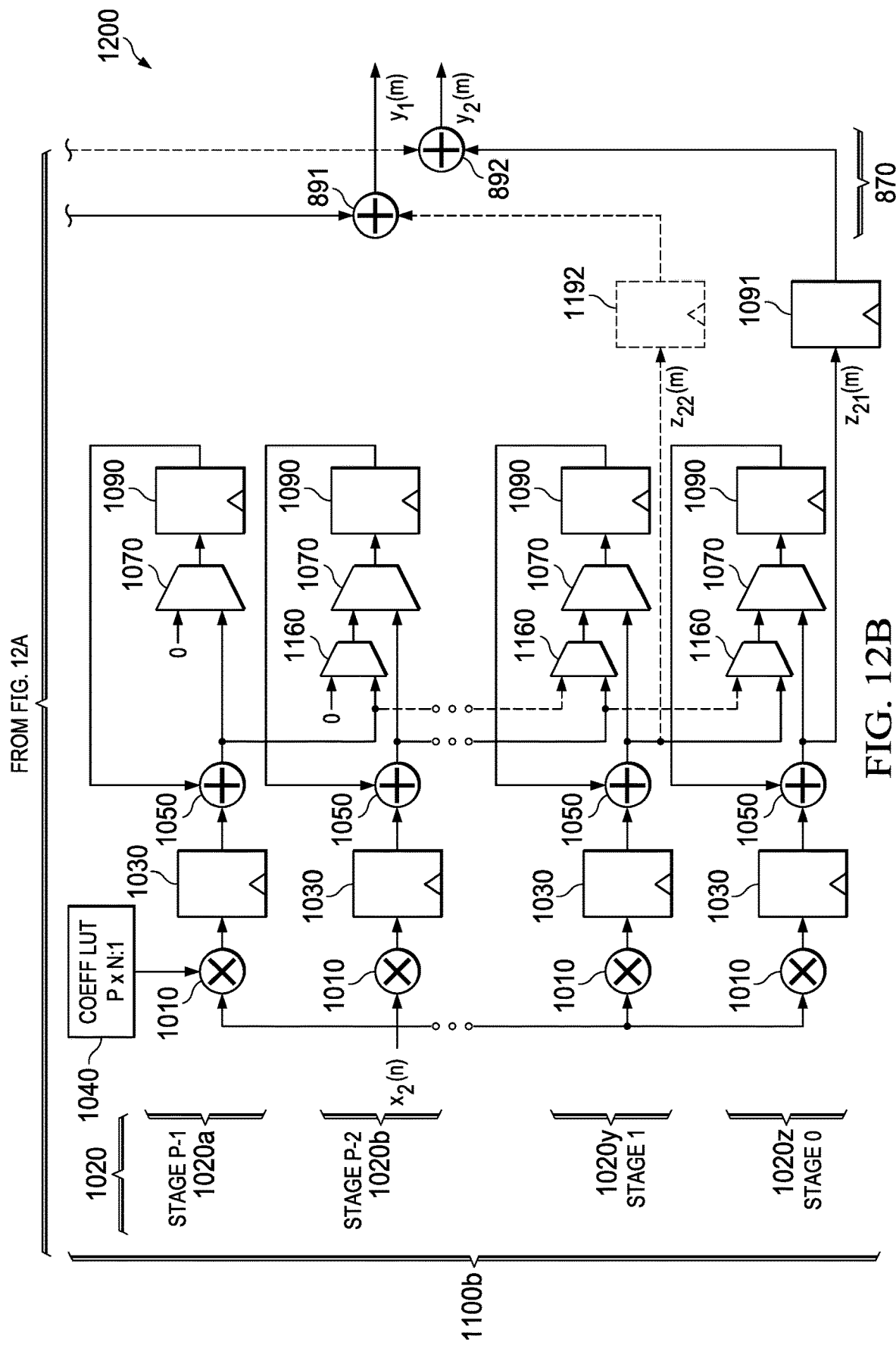

FIG. 12, which includes FIGS. 12A and 12B, is a diagram of the dual mode resampling filter 1200 in the dual band mode (also a lower parallelization mode) according to an illustrative embodiment.

When operating in the dual band mode shown in FIG. 12, each of the additional multiplexers 1160 in each filter stage 1020 of each reconfigurable resampling filter 1100 is configured to select the partial sum generated by the adder 1050 in the immediately preceding filter stage 1020. (The inputs selected by the additional multiplexers 1160 in the dual band mode are shown in FIG. 12 as solid lines while the inputs not selected by the additional multiplexers 1160 in the dual band mode are shown as dashed lines.) For example, the additional multiplexer 1160 of the final filter stage 1020z selects the bottom input to the multiplexer 1070 of the penultimate filter stage 1020y, thereby providing the output of adder 1050 of the penultimate filter stage 1020y to the input of multiplexer 1070 for the final filter stage 1020z.

Because each additional multiplexer 1160 (in the dual band mode) selects the partial sum generated by the immediately preceding filter stage 1020, each reconfigurable resampling filter 1100a and 1100b filters the input samples received by that reconfigurable resampling filter 1100a or 1100b by the entire array of L filter coefficients using every filter stage 1020 of that reconfigurable resampling filter 1100a or 1100b. In other words, in the dual band mode shown in FIG. 12, the two reconfigurable resampling filters 1100a and 1100b form separate resampling filters that are each configured exactly the same as the prior art resampling filter 1000 of FIG. 10. Therefore, in the dual band mode shown in FIG. 12, the two reconfigurable resampling filters 1100a and 1100b may be employed to separately resample input signals in two separate bands.

As shown in FIG. 12, the first reconfigurable resampling filter 1100a computes M filtered suboutput samples $z_1(m)$ from N input samples $\{x_1(n-N+1), x_1(n)\}$ in a first band, which are output via the first output memory register 1091 of the first reconfigurable resampling filter 1100a. Meanwhile, the second reconfigurable resampling filter 1100b computes M filtered suboutput samples $z_2(m)$ from N input samples $\{x_2(n-N+1), x_2(n)\}$ in a second band, which are output via the first output memory register 1091 of the first reconfigurable resampling filter 1100b. As described above with reference to FIG. 10, each scales the input sample by a filter coefficient $h_k$ and the first memory register 1030 of each filter stage 1020 stores the coefficient scaled input sample for that filter stage 1020. The adder 1050 of each filter stage 1020 generates a partial sum for that filter stage 1020 by adding the coefficient scaled input sample for that filter stage 1020 to the partial sum stored in the second memory register 1090 of that filter stage 1020. The partial sum stored in the second memory register 1090 of each filter stage 1020 depends on the output of the multiplexer 1070 of that filter stage 1020.

When generating an output sample, the multiplexers 1070 in each filter stage 1020 (except the initial filter stage 1020a) select the partial sum generated by the immediately preceding filter stage 1020 (via the additional multiplexer 1160), allowing the partial sums generated by the adders 1050 to be "rippled down" to the next successive filter stage 1020. Meanwhile when generating an output sample, the multiplexer 1070 in the initial filter stage 1020a selects a logic "0" to reset the second memory register 1090 of the initial filter stage 1020a. During sampling indexes when the reconfigurable resampling filter 1100a or 1100b does not generate an output sample, the multiplexers 1070 in each filter stage 1020 select the partial sum generated by the adder 1050 in that filter stage 1020, enabling each filter stage 1020 to retain the partial sum of that filter stage 1020 in the second memory register 1090 of that filter stage 1020.

As described above, the first reconfigurable resampling filter 1100a generates M filtered suboutput samples $z_1(m)$ from the N input samples $\{x_1(n-N+1), x_1(n)\}$ in a first band and the second reconfigurable resampling filter 1100b computes M filtered suboutput samples $z_2(m)$ from N input samples $\{x_2(n-N+1), x_2(n)\}$ in a second band.

As described above, in the dual band mode shown in FIG. 12, each of the reconfigurable resampling filters 1100a and 1100b are used separately so that each filters an input signal $x_1(n)$ or $x_2(n)$ in one of two bands. Meanwhile, because each additional multiplexer 1160 (in the dual band mode) selects the partial sum of the immediately preceding filter stage 1020, each reconfigurable resampling filter 1100a and 1100b filters the input signal $x_1(n)$ or $x_2(n)$ received by that reconfigurable resampling filter 1100a or 1100b by the entire array of filter coefficients using every filter stage 1020 of that reconfigurable resampling filter 1100a or 1100b. Specifically, the first output memory register 1091 of the first reconfigurable resampling filter 1100a outputs M filtered suboutput samples $z_1(m)$ from the N input samples $\{x_1(n-N+1), x_1(n)\}$ in the first band and the first output memory register 1091 of the second reconfigurable resampling filter 1100b outputs M filtered suboutput samples $z_2(m)$ from the N input samples $\{x_2(n-N+1), x2(n)\}$ in the second band.

In the dual band mode, the mode-based processor 870 is configured to output two sets of output samples, $y_1(m)$ and $y_2(m)$, in the two separate bands. Because each of the reconfigurable resampling filters 1100a and 1100b are used separately in the dual band mode, the mode-based processor 870 does not add the suboutputs from both reconfigurable resampling filters 1100a and 1100b in the dual band mode. Instead, because the output of the first output memory register 1091 of the first reconfigurable resampling filter 1100a is the input signal $x_1(n)$ in the first band filtered by the entire array of filter coefficients using all of the filter stages 1120 of the first reconfigurable resampling filter 1100a, the first dual mode adder 891 selects the first suboutput $z_{11}(m)$ of the first reconfigurable resampling filter 1100a as the first output signal $y_1(m)$ of the dual mode resampling filter 1200. Similarly, because the first suboutput $z_{21}(m)$ of the second reconfigurable resampling filter 1100b is the input signal $x_2(n)$ in the second band filtered by the entire array of L filter coefficients $h_k$, the second dual mode adder 892 selects the second suboutput $z_{21}(m)$ of the second reconfigurable resampling filter 1100b as the second output sample $y_2(m)$ of the dual mode resampling filter 1200.

In the dual band mode described above, the first output samples $y_1(m)$ are the filtered suboutput samples $z_{11}(m)$ computed by the first reconfigurable resampling filter 1100a and the second output samples $y_2(m)$ are the filtered suboutput samples $z_{21}(m)$ computed by the second reconfigurable resampling filter 1100b. Therefore, in the dual band mode described above, the dual mode resampling filter 1200 operates in two bands with each reconfigurable resampling filter 1100a and 1100b having a parallelization factor of 1, meaning each reconfigurable resampling filter 1100a or 1100b generates one output sample in a separate band.

While the example dual mode resampling filter 1200 has a parallelization factor of 1 in the dual band mode operation of FIG. 12, the same principle can be applied to a resampling filter with a parallelization factor of 2. Accordingly, the two reconfigurable resampling filters 1100a and 1100b of the dual mode resampling filter 1200 can perform the functions of both of the resampling filters 327 in the dual band DDC chain 320 of FIG. 3. Specifically, the first reconfigurable resampling filter 1100a of the dual mode resampling filter 1200 can perform the resampling performed by the first resampling filter 327 in the first band of the dual band DDC chain 320 and the second reconfigurable resampling filter 1100b of the dual mode resampling filter 1200 can simultaneously perform the resampling performed by the second resampling filter 327 in the second band of the dual band DDC chain 320.

Figure 13A:
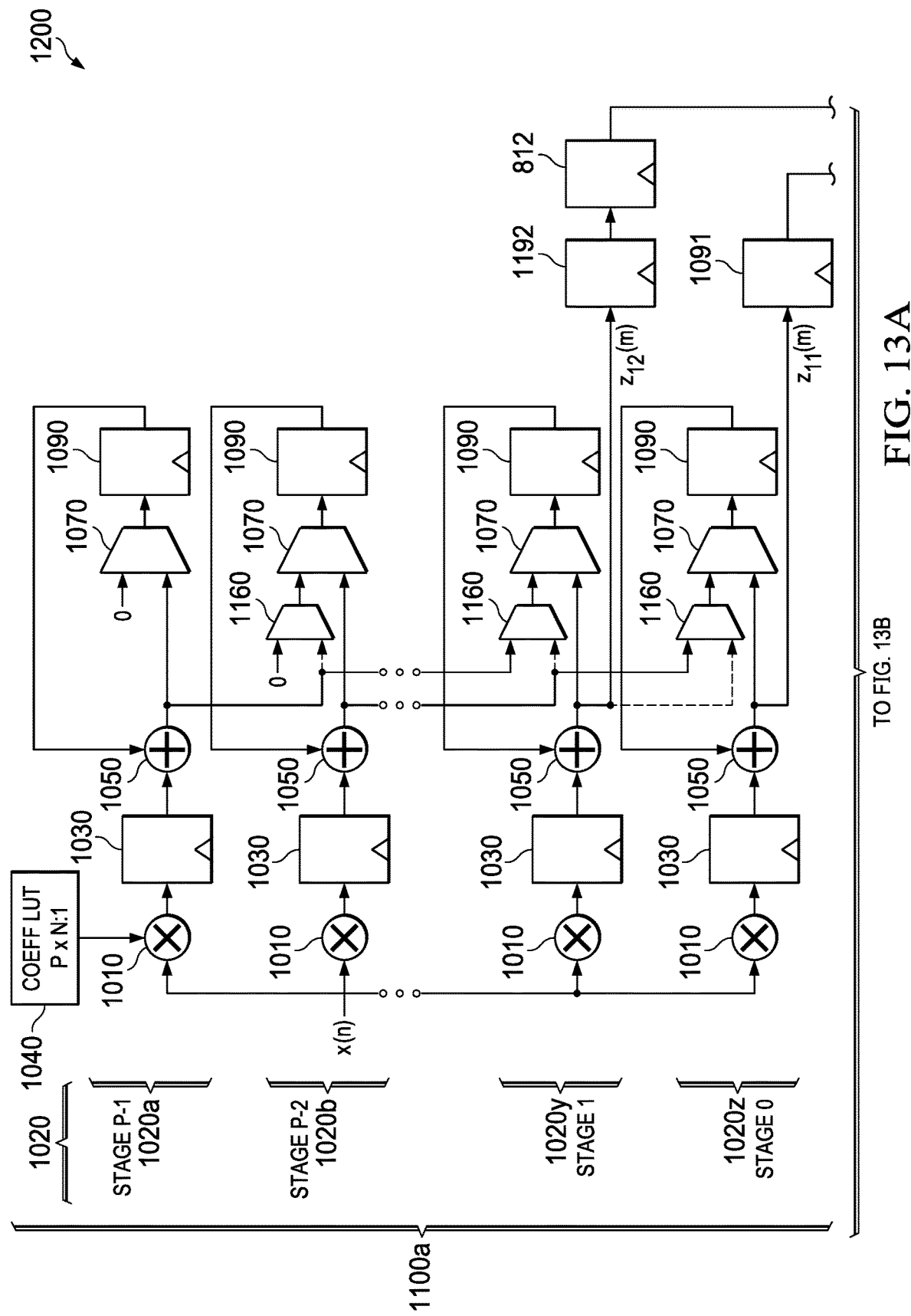
FIGS. 13A and 13B collectively form FIG. 13, which is a block diagram of the dual mode resampling filter of FIG. 12 in a single band mode (with higher parallelization) according to an illustrative embodiment.
Figure 13B:
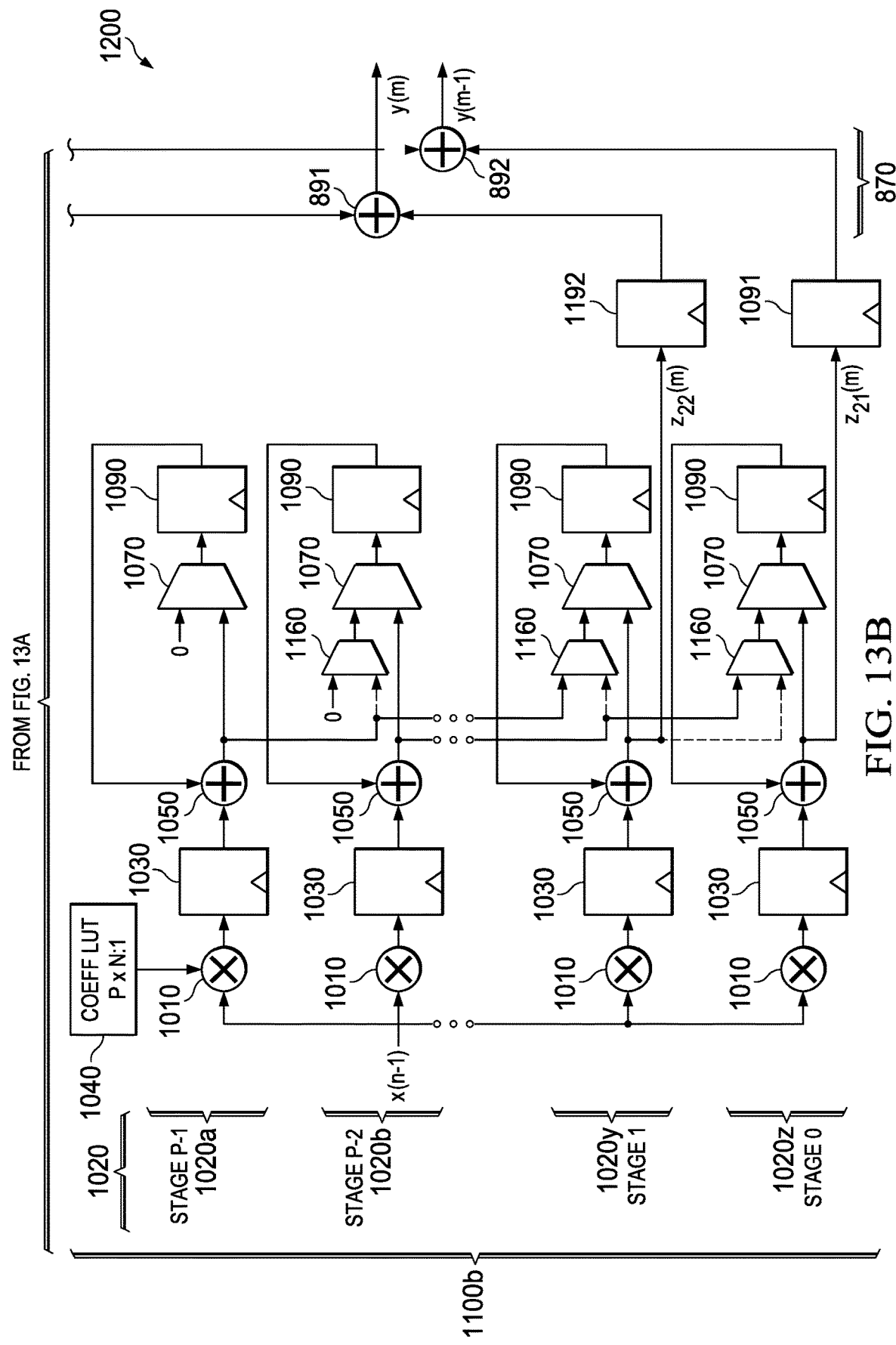

FIG. 13, which includes FIGS. 13A and 13B, is a block diagram of the dual mode resampling filter 1200 operating in a single band mode (also a higher parallelization mode) according to an illustrative embodiment.

In the single band mode, each of the additional multiplexers 1160 in each filter stage 1020 is configured to select the partial sum generated by the adder 1050 in the filter stage 1020 two stages prior. (The inputs selected by the additional multiplexers 1160 in the dual band mode are shown in FIG. 13 as solid lines while the inputs not selected by the additional multiplexers 1160 in the dual band mode are shown as dashed lines.)

When operating in the single band mode shown in FIG. 13, the two reconfigurable resampling filters 1100a and 1100b resample input samples x(n) and x(n−1) in the same band, where x(n−1) is the input sample immediately preceding x(n) over time.

Each reconfigurable resampling filter 1100a and 1100b is then configured to compute two sets of suboutputs utilizing either the odd-numbered stages or the even-numbered stages. Specifically, the first reconfigurable resampling filter 1100a computes a first suboutput $z_{11}(m)$, which is generated by the even-numbered stages 1020 of the first reconfigurable resampling filter 1100a and stored in the first output memory register 1091 of the first reconfigurable resampling filter 1100a; and a second suboutput $z_{12}(m)$, which is generated by the odd-numbered stages 1020 of the first reconfigurable resampling filter 1100a and stored in the second output memory register 1192 of the first reconfigurable resampling filter 1100a. Similarly, the second reconfigurable resampling filter 1100b computes a first suboutput $z_{21}(m)$, which is generated by the even-numbered stages 1020 of the second reconfigurable resampling filter 1100b and stored in the first output memory register 1091 of the second reconfigurable resampling filter 1100b; and a second suboutput $z_{12}(m)$ which is generated by the odd-numbered stages 1020 of the second reconfigurable resampling filter 1100b and stored in the second output memory register 1192 of the second reconfigurable resampling filter 1100b.

In the single band mode, the mode-based processor 870 generates two output samples y(m) and y(m−1). The dual mode adder 891 generates output sample y(m) by adding the suboutput $z_{11}(m)$ and the suboutput $z_{22}(m)$. Meanwhile, the dual mode adder 892 generates output sample y(m−1) by adding the suboutput $z_{21}(m)$ and the suboutput $z_{12}(m)$ with the appropriate delay provided by the delay circuit 812.

In the single band mode, both the of reconfigurable resampling filters 1100a and 1100b of the dual mode resampling filter 1200 are used together to generate M output samples y(m) and y(m−1) in a single band from N input samples x(n) and x(n−1) in the single band. The output samples y(m) and y(m−1) are filtered by the entire array of L filter coefficients $h_k$. Specifically, the first output y(m) is the suboutput $z_{11}(m)$, which filtered by the even-numbered stages 1020 of the first reconfigurable resampling filter 1100a, and the suboutput $z_{22}(m)$, which is filtered by the odd-numbered stages 1020 of the second reconfigurable resampling filter 1100b. Meanwhile, the second output y(m−1) is the suboutput $z_{21}(m)$, which is filtered by the even-numbered stages 1020 of the second reconfigurable resampling filter 1100b, and the suboutput $z_{12}(m)$, which is filtered by the odd-numbered stages 1020 of the first reconfigurable resampling filter 1100a.

The example dual mode resampling filter 1200 has a parallelization factor of 2 in the single band mode of FIG. 13 and a parallelization factor of 1 in the dual band mode of FIG. 12. However, the same principle can used to configure a resampling with a higher parallelization factor in a single band mode (for example, a parallelization factor of 4) than in a dual band mode (in that example, parallelization factor of 2).

As described above, the dual mode resampling filter 1200 operates with a higher parallelization in the single band mode (FIG. 13) than in the dual band mode (FIG. 12). Therefore, in the single band mode, the dual mode resampling filter 1200 is capable of performing the function of the prior art resampling filter 316 in the single band DDC chain 310 of FIG. 3. Because the dual mode resampling filter 1200 can perform the functions of both the prior art resampling filters 327 of FIGS. 3 (when operating in the dual band mode) and the prior art resampling filter 316 of FIGS. 3 (when operating in the single band mode), the dual mode resampling filter 1200 eliminates the need for duplicate hardware elements to support both the single band mode and the dual band mode.

Dual Mode Interpolation Filter

As described above with reference to FIGS. 7-9 and 11-13, the dual mode decimation filter 800 and the dual mode resampling filter 1200 eliminate the need for duplicate hardware elements to support both the single band mode and the dual band mode. In addition to decimation and resampling, an RF sampling transceiver 120 may also need to perform interpolation (for example, by the digital up-converter 122) in either a dual band mode or single band mode with higher parallelization. Accordingly, as described below with reference to FIGS. 17-19, a dual mode interpolation filter 1800 is provided that uses a similar principal as the dual mode decimation filter 800 and the dual mode resampling filter 1200 to perform interpolation in either a dual band mode or a single band mode (with higher parallelization) and eliminate the need for duplication hardware elements.

Figure 14:
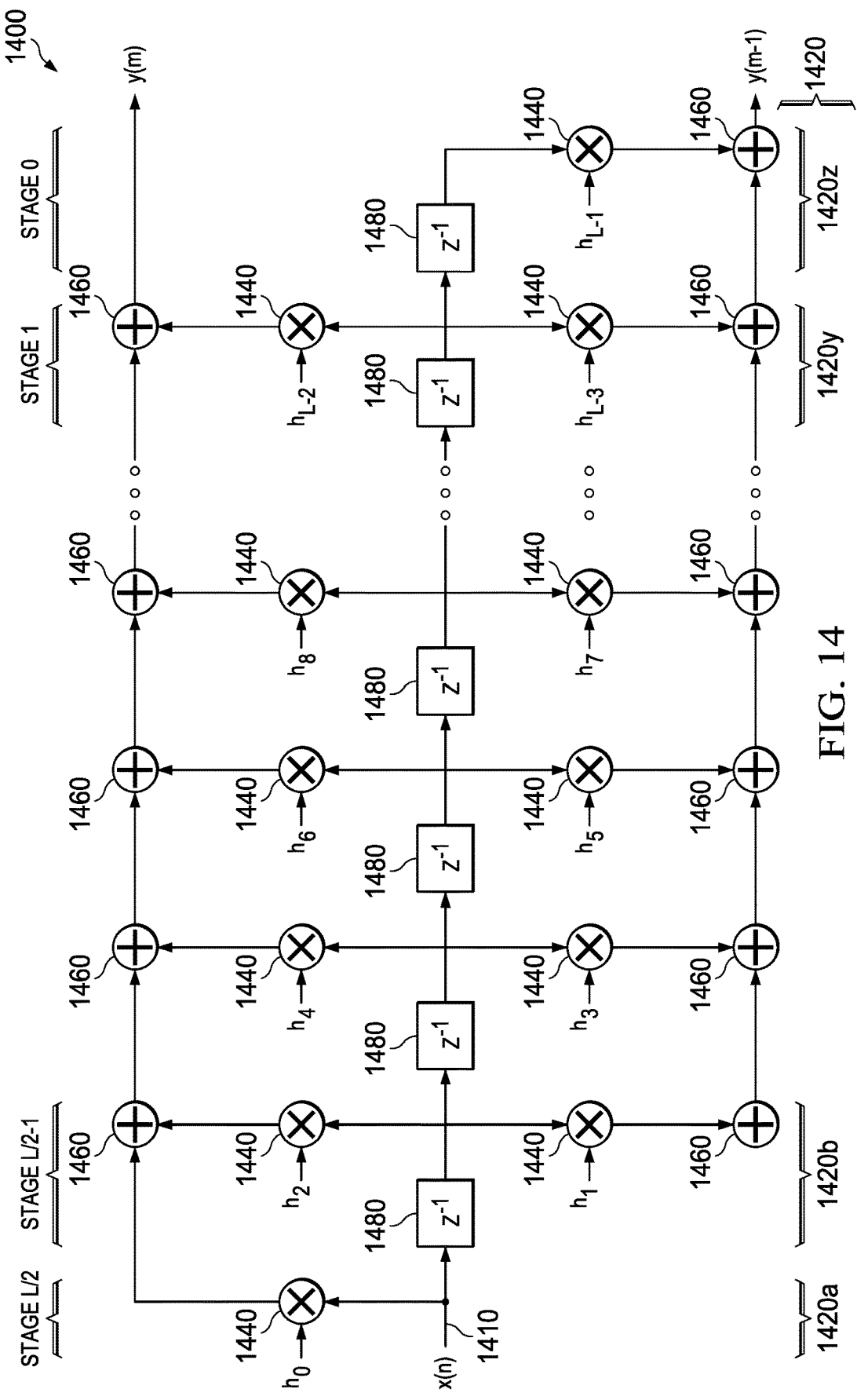
FIG. 14 is a block diagram illustrating a prior art interpolation filter having a parallelization factor of 1.

FIG. 14 is a block diagram illustrating a prior art interpolation filter 1400 having a parallelization factor of 1. Every clock cycle, the interpolation filter 1400 of FIG. 14 generates two output samples y(m) and y(m−1) using one input sample x(n). The interpolation filter 1400 is realized as a lowpass finite impulse response (FIR) filter that filters the input samples x(n) by multiplying each input sample x(n) by the array of filter coefficients $h_k$ and summing the elements of the resulting array. The interpolation filter 1400 has a length L, meaning the input signal x(n) is filtered by L filter coefficients $h_k$ where k is each integer between 0 and L−1.

The interpolation filter 1400 is a multi-stage filter having a plurality of filter stages 1420. In the embodiment of FIG. 14, the example interpolation filter 1400 is in direct form and has $\lfloor L/2 \rfloor-1$ filter stages 1420 (where the $\lfloor \; \rfloor$ symbol represents a floor operation where the operand is rounded down to the nearest integer). For ease of reference, some of the filter stages 1420 are identified as the initial filter stage 1420a the second filter stage 1420*b*

("Stage $\frac{L}{2}$"), the penultimate filter stage 1420*y* ("Stage 1"), and the final filter stage 1420*z* ("Stage 0").

The input samples x(n) are received by a tapped delay line 1410. Along the delay line 1410, each filter stage 1420 (except the initial filter stage 1420*a*) includes a delay element 1480. The delay elements 1480 may be implemented using any digital storage element (e.g., flip-flops). To filter each input sample x(n) by L filter coefficients $h_k$, the interpolation filter 1400 includes L multipliers 1440 that each filter the input sample x(n) by one of the L filter coefficients $h_k$. In the embodiment shown in FIG. 14, each filter stage 1420 (except the initial filter stage 1420*a* and the final filter stage 1420*z*) includes two multipliers 1440 while the initial filter stage 1420*a* and the final filter stage 1420*z* include one multiplier 1440. Because the filter coefficients $h_k$ are known, the multipliers 1440 may be realized using a canonical signed digit (CSD) based implementation. In the initial filter stage 1420*a*, the multiplier 1440 filters the most recent input sample x(n). In each subsequent filter stage 1420 after the initial filter stage 1420*a*, the multiplier(s) 1440 filter the input sample stored in the delay element 1480 of that filter stage 1420. Each clock cycle, the delay element 1480 in each filter stage 1420 receives the input sample x(n) that was filtered by the immediately preceding filter stage 1420 from the delay element 1420 of the immediately preceding filter stage. Accordingly, each clock cycle, the input samples x(n) are passed to the next filter stage 1420 to be filtered by the multipliers 1440 of the next filter stage 1420.

The output sample y(m) is generated by summing the input samples filtered by filter coefficients $h_k$ with an even-numbered filter index k (e.g., $h_0, h_2, \ldots h_{L-2}$) and the output sample y(m−1) is generated by summing the input samples filtered by filter coefficients $h_k$ with an even-numbered filter index k (e.g., $h_1, h_3, \ldots h_{L-1}$). To sum the filtered input samples, the example interpolation filter 1400 shown in FIG. 14 includes an adder 1460 coupled to each multiplier 1400 (except the multiplier 1440 in the initial filter stage 1420*a*). However, in other embodiments, the filtered input samples from all of the filter stages 1420 may be summed by a single adder cloud.

Figure 15:
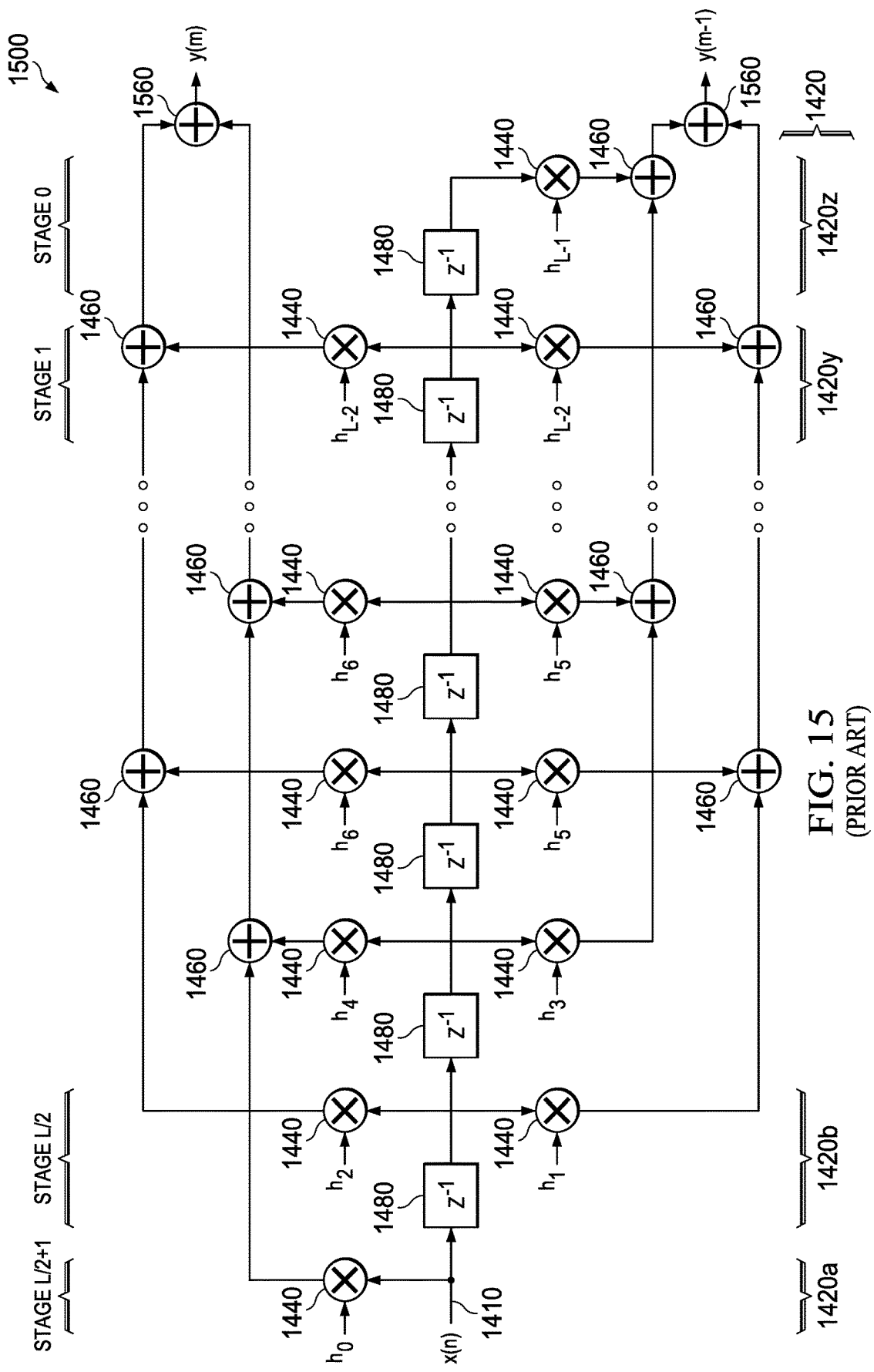
FIG. 15 is a block diagram illustrating another prior art interpolation filter having a parallelization factor of 1.

FIG. 15 is a block diagram illustrating another prior art interpolation filter 1500 having a parallelization factor of 1. Like the interpolation filter 1400 of FIG. 14, every clock cycle, the interpolation filter 1500 of FIG. 15 generates two output samples y(m) and y(m−1) using one input sample x(n). The example interpolation filter 1500 is also in direct form and has $\lfloor L/2 \rfloor+1$ filter stages 1420, including an initial filter stage 1420*a*

("Stage $\frac{L}{2}+1$"), a second filter stage 1420*b*

("Stage $\frac{L}{2}$"), a penultimate filter stage 1420*y* ("Stage 1"), and the final filter stage 1420*z* ("Stage 0"). The interpolation filter 1500 also includes a tapped delay line 1410 with a delay element 1480 in each filter stage 1420 (except the initial filter stage 1420*a*). The delay elements 1480 may be implemented using any digital storage element (e.g., flip-flops).

The interpolation filter 1500 also filters the input samples x(n) by multiplying each input sample x(n) by the array of L filter coefficients $h_k$ using L multipliers 1440. The output sample y(m) is generated by summing the input samples filtered by filter coefficients $h_k$ with an even-numbered filter index k (e.g., $h_0, h_2, \ldots h_{L-2}$) and the output sample y(m−1) is generated by summing the input samples filtered by filter coefficients $h_k$ with an even-numbered filter index k (e.g., $h_1, h_3, \ldots h_{L-1}$). In contrast to the interpolation filter 1400 shown in FIG. 14, however, the adders 1460 in each even-numbered filter stage 1420 (e.g., "Stage 0", "Stage 2", etc.) add the filtered input sample generated by one of the multipliers 1440 in that filter stage 1420 to one of the partial sums generated by the previous even-numbered filter stage 1420. Similarly, the adders 1460 in each odd-numbered filter stage 1420 (e.g., "Stage 1", "Stage 3", etc.) add the filtered input sample generated by one of the multipliers 1440 in that filter stage 1420 to one of the partial sums generated by the previous odd-numbered filter stage 1420. The output samples y(m) and y(m−1) are generated by the interpolation filter 1500 by adders 1560, which each sum partial sums from odd-numbered and even-numbered filter stages 1420.

Figure 16A:
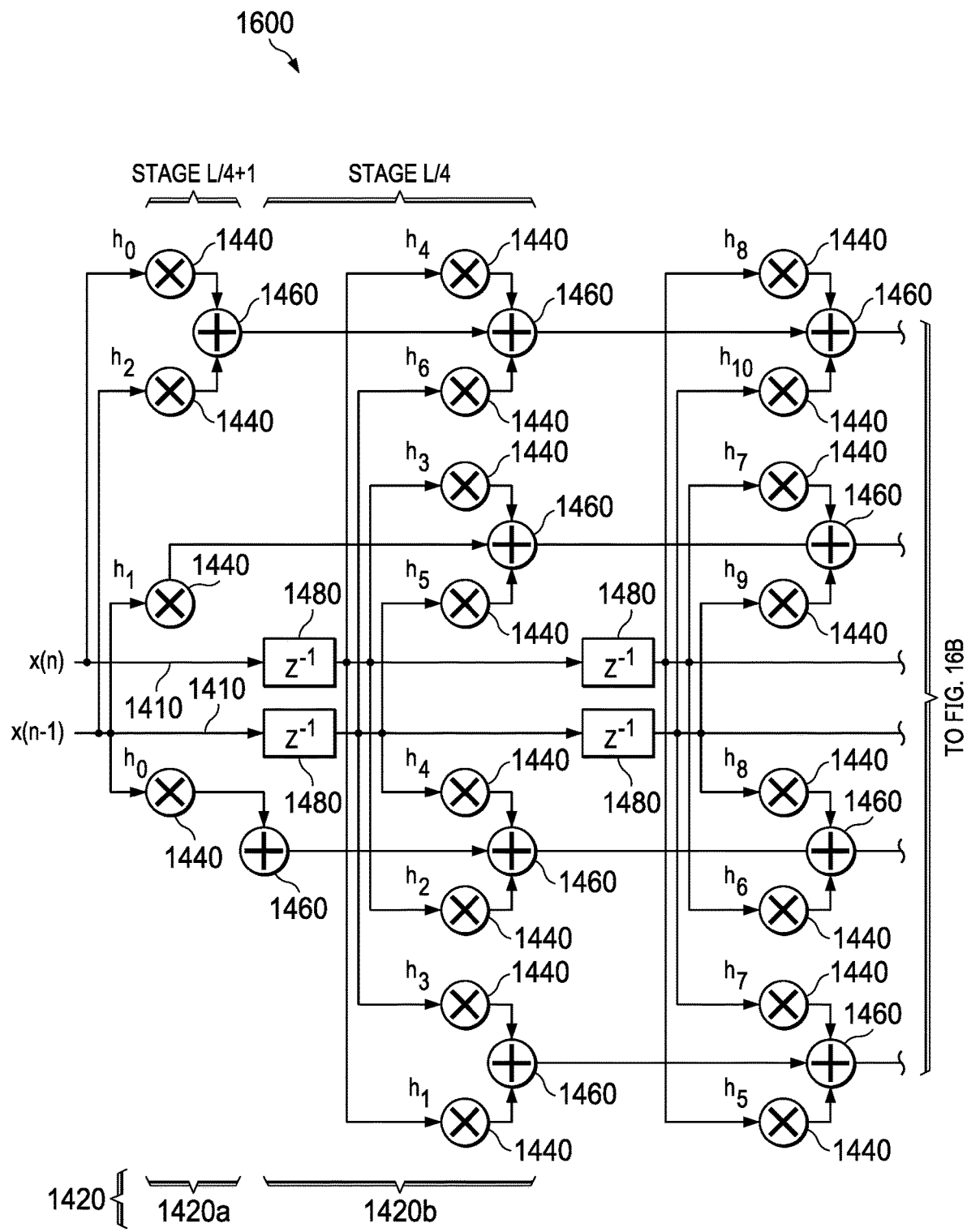
FIGS. 16A and 16B collectively form FIG. 16, which is a block diagram illustrating a prior art interpolation filter having a parallelization factor of 2.
Figure 16B:
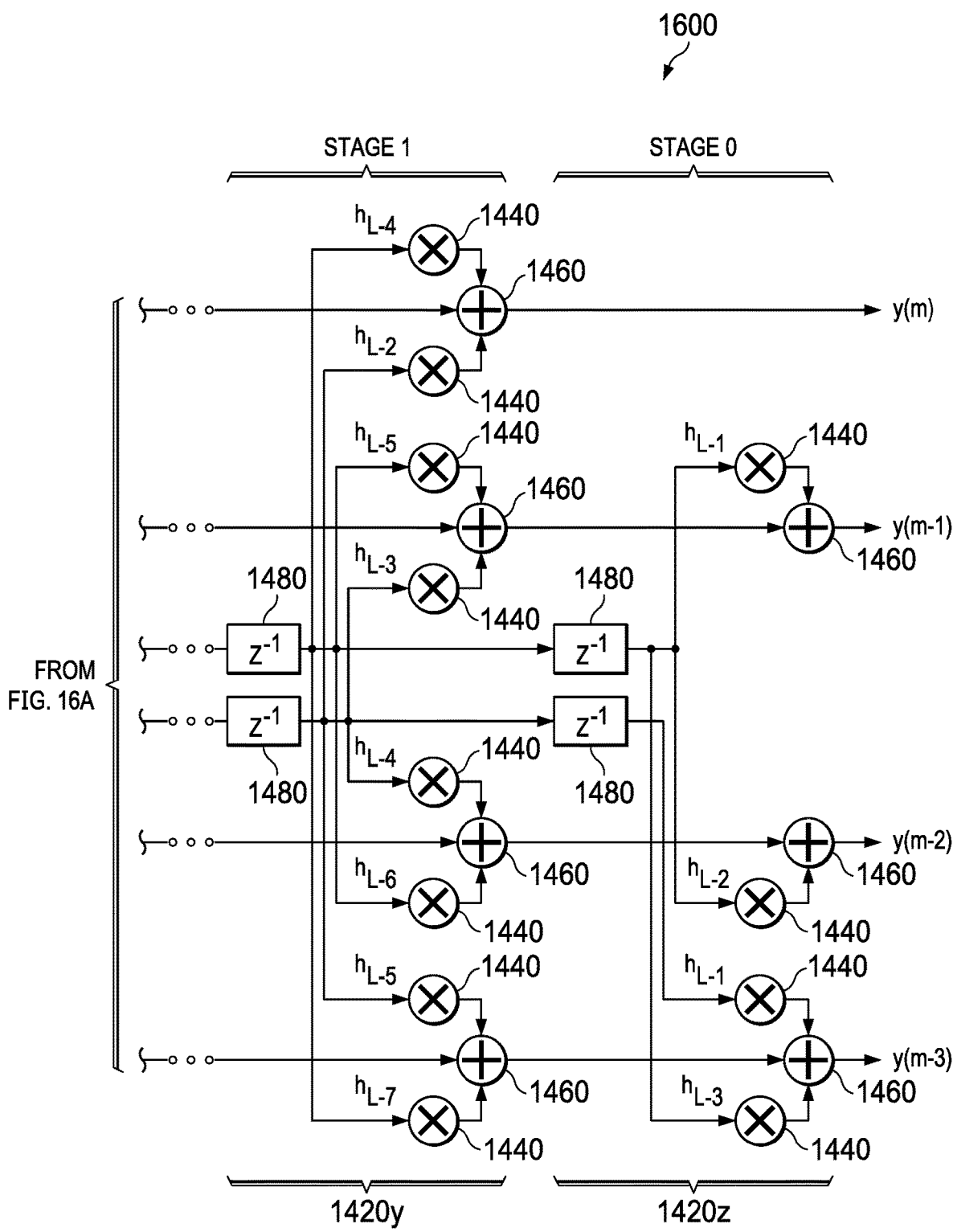

FIG. 16, which includes FIGS. 16A and 16B, is a block diagram illustrating prior art interpolation filter 1600 having a parallelization factor of 2. Every clock cycle, the interpolation filter 1600 of FIG. 16 generates four output samples y(m) through y(m−3) using two input sample x(n) and x(n−1). The interpolation filter 1600 is also realized as a lowpass finite impulse response (FIR) filter that filters the input samples x(n) and x(n−1) by multiplying each input sample x(n) by the array of filter coefficients $h_k$ and summing the elements of the resulting array. The interpolation filter 1600 has a length L, meaning the input signal x(n) is filtered by L filter coefficients $h_k$ where k is each integer between 0 and L−1.

In the embodiment of FIG. 16, the interpolation filter 1600 is in direct form and has $\lfloor L/4 \rfloor+1$ filter stages 1420 (where the $\lfloor\ \rfloor$ symbol represents a floor operation where the operand is rounded down to the nearest integer). For ease of reference, some of the filter stages 1420 are identified as the initial filter stage 1420*a*

("Stage $\frac{L}{4}+1$"), the second filter stage 1420*b*

("Stage $\frac{L}{4}$"), the penultimate filter stage 1420*y* ("Stage 1"), and the final filter stage 1420*z* ("Stage 0").

The interpolation filter 1600 includes two tapped delay lines 1410 for each input sample x(n) and x(n−1). Along each delay line 1410, each filter stage 1420 (except the initial filter stage 1420a) includes a delay element 1480. The delay elements 1480 may be implemented using any digital storage element (e.g., flip-flops). To filter each of the two input samples x(n) and x(n−1) by L filter coefficients $h_k$, the interpolation filter 1600 includes L×2 multipliers 1440 that each filter each input sample by one of the L filter coefficients $h_k$. Because the filter coefficients $h_k$ are known, the multipliers 1440 may be realized using a canonical signed digit (CSD) based implementation. In the embodiment shown in FIG. 16, each filter stage 1420 (except the initial filter stage 1420a and the final filter stage 1420z) includes eight multipliers 1440 (four multipliers 1440 coupled to each delay line 1420). The output sample y(m) is generated by summing the input sample x(n) filtered the filter coefficients $h_0$, $h_4$, $h_8$, . . . $h_{L−4}$, and the input sample x(n−1) filtered by the filter coefficients $h_2$, $h_6$, $h_{10}$, . . . $h_{L−2}$. The output sample y(m−1) is generated by summing the input sample x(n) filtered by the filter coefficients $h_3$, $h_7$, $h_{11}$, . . . $h_{L−1}$, and the input sample x(n−1) filtered by the filter coefficients $h_1$, $h_5$, $h_9$, . . . $h_{L−3}$. The output sample y(m−2) is generated by summing the input sample x(n) filtered by the filter coefficients $h_2$, $h_6$, $h_{10}$, . . . $h_{L−2}$, and the input sample x(n−1) filtered by the filter coefficients $h_0$, $h_4$, $h_8$, . . . $h_{L−4}$. Finally, the output sample y(m−3) is generated by summing the input sample x(n) filtered by the filter coefficients $h_1$, $h_5$, $h_9$, . . . $h_{L−3}$, and the input sample x(n−1) filtered by the filter coefficients $h_3$, $h_7$, $h_{11}$, . . . $h_{L−1}$.

Figure 17:
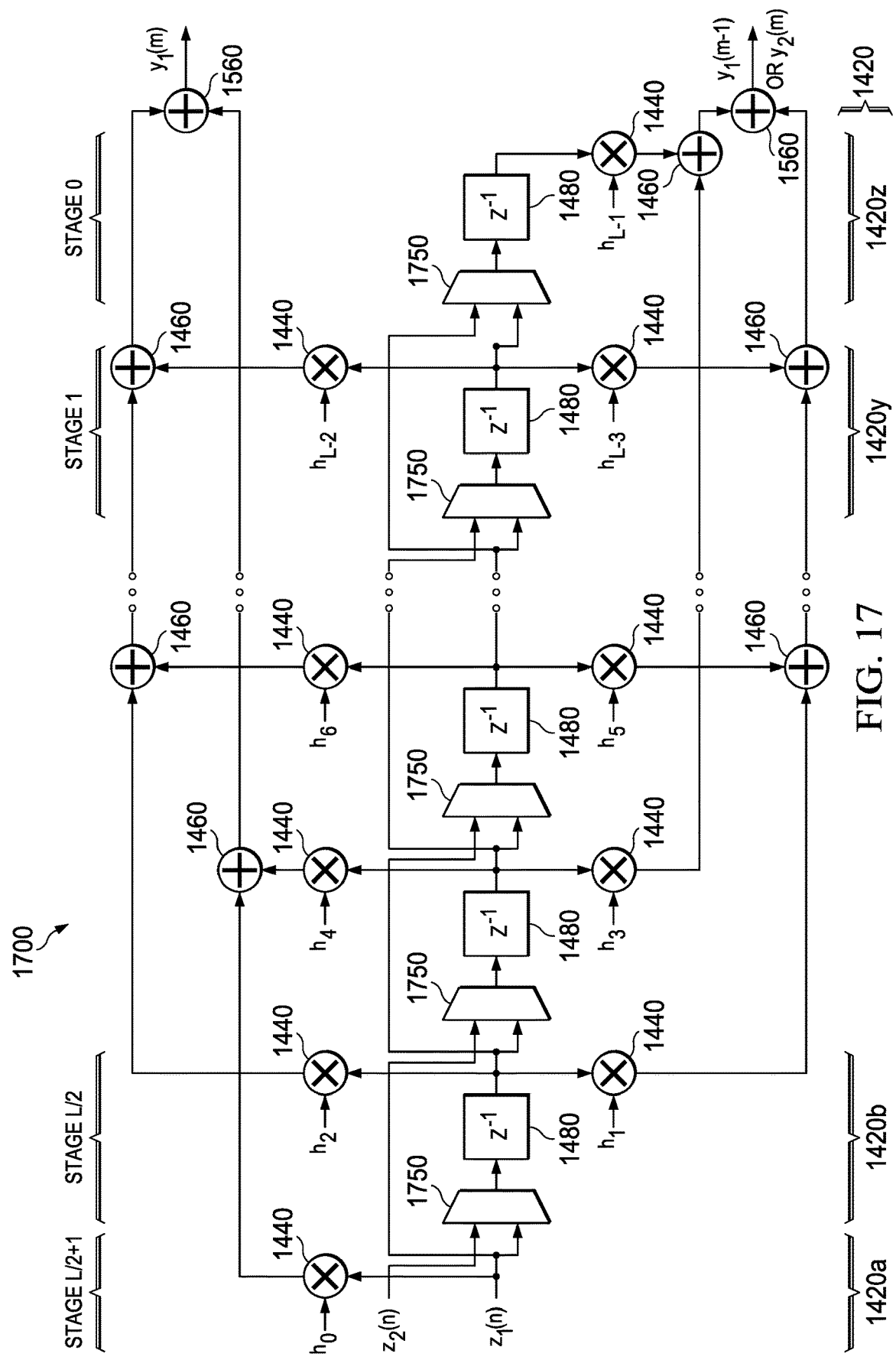
FIG. 17 a block diagram of a reconfigurable interpolation filter microarchitecture 1700 according to an illustrative embodiment.

FIG. 17 a block diagram of a reconfigurable interpolation filter microarchitecture 1700 according to an illustrative embodiment. The reconfigurable interpolation filter 1700 is realized as a lowpass finite impulse response (FIR) filter that filters the input samples by multiplying them by an array of L filter coefficients $h_k$ and summing the elements of the resulting array.

The reconfigurable interpolation filter 1700 is a multi-stage filter having a plurality of filter stages 1420. In the embodiment of FIG. 17, the reconfigurable interpolation filter 1700 has $\lfloor L/2 \rfloor + 1$ filter stages 1420 (where the $\lfloor \; \rfloor$ symbol represents a floor operation where the operand is rounded down to the nearest integer), including an initial filter stage 1420a ("Stage $\frac{L}{2} + 1$"), a second filter stage 1420b ("Stage $\frac{L}{2}$"), a penultimate filter stage 1420y ("Stage 1"), and a final filter stage 1420z ("Stage 0").

As described below, the reconfigurable interpolation filter microarchitecture 1700 can be configured to filter input samples $z_1(n)$ by the entire array of L filter coefficients $h_k$ using all of the filter stages 1420. Alternatively, the reconfigurable interpolation filter microarchitecture 1700 can be reconfigured to filter first input samples $z_1(n)$ by the odd-numbered filter stages 1420 ("Stage 1", "Stage 3", etc.) and second input samples $z_2(n)$ by the even-numbered filter stages 1420 ("Stage 0", "Stage 2", etc.).

Each filter stage 1420 (except the initial filter stage 1420a) includes a delay element 1480 that stores an input sample. The delay elements 1480 may be implemented using any digital storage element (e.g., flip-flops). The reconfigurable interpolation filter microarchitecture 1700 filters input samples by L filter coefficients $h_k$ using L multipliers 1440. Because the filter coefficients $h_k$ are known, the multipliers 1440 may be realized using a canonical signed digit (CSD) based implementation. Each filter stage 1420 (except the initial filter stage 1420a and the final filter stage 1420z) includes two multipliers 1440. In the embodiment of FIG. 17, both the initial filter stage 1420a and the final filter stage 1420z include one multiplier 1440. In the initial filter stage 1420a, the multiplier 1440 filters the most recent input sample. In each subsequent filter stage 1420 after the initial filter stage 1420a, the multiplier(s) 1440 filter the input sample stored in the delay element 1480 of that filter stage 1420.

Unlike interpolation filter 1500, however, the delay element 1480 of each filter stage 1420 does not always receive the input sample from the immediately preceding filter stage 1420. Instead, each filter stage 1420 (except the initial filter stage 1420a) of the reconfigurable interpolation filter microarchitecture 1700 includes a multiplexer 1750. Except in the second filter stage 1420b, each multiplexer 1750 has two inputs, the output of the delay element 1580 storing the input sample of the immediately preceding filter stage 1420 and the output of the delay element 1580 from two stages prior. The two inputs of the multiplexer 1750 in the second filter stage 1420b are the output of the delay element 1580 of the immediately preceding filter stage 1420, i.e. the initial filter stage 1420a, and the second input $z_2(n)$.

As described in detail below with reference to FIGS. 18 and 19, the reconfigurable resampling filter microarchitecture 1700 enables the dual mode resampling filter 1800 to operate in either a dual band mode or a single band mode. In the dual band mode (described below with reference to FIG. 18), each multiplexer 1750 selects the input sample of the immediately preceding filter stage 1420 and the reconfigurable interpolation filter microarchitecture 1700 filters the input samples $z_1(n)$ by the entire array of L filter coefficients $h_k$ using all of the filter stages 1420 in the same manner as the prior art interpolation filter 1500 of FIG. 15. Meanwhile, the single band mode (described below with reference to FIG. 19), each multiplexer 750 selects the input sample of the filter stage 1420 two stages prior (i.e., the input sample of the filter stage 1420 immediately preceding the immediately preceding filter stage 1420) and the reconfigurable interpolation filter microarchitecture 1700 filters first input samples $z_1(n)$ by the odd-numbered filter stages 1420 ("Stage 1", "Stage 3", etc.) and second input samples $z_2(n)$ by the even-numbered filter stages 1420 ("Stage 0", "Stage 2", etc.).

FIGS. 18 and 19 are block diagrams of a dual mode interpolation filter 1800 according to illustrative embodiments.

As shown in FIGS. 18 and 19, the dual mode interpolation filter 1800 include two identical (or, at least, similar) reconfigurable interpolation filters 1700a and 1700b that each include the features of the reconfigurable interpolation filter microarchitecture 1700 of FIG. 17 described above. Specifically, the reconfigurable interpolation filters 1700a and 1700b of the dual mode interpolation filter 1800 include the multiplexers 1750 of the reconfigurable interpolation filter microarchitecture 1700. Each reconfigurable interpolation filter 1700 is realized as a lowpass finite impulse response (FIR) filter that filters the input samples by multiplying them by an array of L filter coefficients $h_k$ and summing the elements of the resulting array.

In the embodiments of FIGS. 18 and 19, each reconfigurable interpolation filter 1700a and 1700b has $\lfloor L/2 \rfloor-1$ filter stages 1420 (where the $\lfloor\ \rfloor$ symbol represents a floor operation where the operand is rounded down to the nearest integer), including an initial filter stage 1420a $$\left(\text{"Stage } \frac{L}{2}+1\text{"}\right),$$

a second filter stage 1420b $$\left(\text{"Stage } \frac{L}{2}\text{"}\right),$$

a penultimate filter stage 1420y ("Stage 1"), and a final filter stage 1420z ("Stage 0").

Each filter stage 1420 (except the initial filter stage 1420a) of each reconfigurable interpolation filter 1700a and 1700b includes a delay element 1480 that stores an input sample. The delay elements 1480 may be implemented using any digital storage element (e.g., flip-flops). Each reconfigurable interpolation filter 1700a and 1700b filters input samples by L filter coefficients $h_k$ using L multipliers 1440. Because the filter coefficients $h_k$ are known, the multipliers 1440 may be realized using a canonical signed digit (CSD) based implementation. Each filter stage 1420 (except the initial filter stage 1420a and the final filter stage 1420z) of each reconfigurable interpolation filter 1700a and 1700b includes two multipliers 1440. In the embodiments of FIGS. 18 and 19, both the initial filter stage 1420a and the final filter stage 1420z of each reconfigurable interpolation filter 1700a and 1700b include one multiplier 1440. In the initial filter stage 1420a of each reconfigurable interpolation filter 1700a and 1700b, the multiplier 1440 filters the most recent input sample. In each subsequent filter stage 1420 after the initial filter stage 1420a, the multiplier(s) 1440 filter the input sample stored in the delay element 1480 of that filter stage 1420.

The dual mode interpolation filter 1800 also includes a mode-based processor 1870, which includes four multiplexers 1891, 1892, 1893, and 1894, and a delay circuit 1812. As briefly mentioned above with reference to FIG. 17, each reconfigurable interpolation filter 1700a or 1700b may configured to filter one input signal or reconfigured to filter two input signals. Accordingly, the mode-based processor 1870 may be configured to provide each of the reconfigurable interpolation filters 1700a and 1700b with one input signal or reconfigured to provide each of the reconfigurable interpolation filters 1700a and 1700b with two input signals.

Specifically, the first multiplexer 1891 has an output coupled to the multiplier 1440 of the initial filter stage 1440a of the first reconfigurable interpolation filter 1700a. To provide an input signal to the initial filter stage 1440a of the first reconfigurable interpolation filter 1700a, the first multiplexer 1891 has a first input coupled to a first input signal line 1871 and a second input coupled to a second input line 1872. The second multiplexer 1892 has an output coupled to the delay element 1480 of the second filter stage 1440b of the first reconfigurable interpolation filter 1700b (via the multiplexer 1750 of the second filter stage 1440b of the first reconfigurable interpolation filter 1700b). To provide an input signal to the second filter stage 1440b of the first reconfigurable interpolation filter 1700a in the single band mode (described below with reference to FIG. 19), the second multiplexer 1892 has a first input coupled to the first input signal line 1871. Additionally, because a second input signal is not needed in the dual band mode (described below with reference to FIG. 18), the output of the second multiplexer 1892 is not selected in the dual band mode and a second input of the second multiplexer 1892 may be coupled to a logic "0".

The third multiplexer 1893 has an output coupled to the multiplier 1440 of the initial filter stage 1440a of the second reconfigurable interpolation filter 1700b. To provide an input signal to the initial filter stage 1440a of the second reconfigurable interpolation filter 1700b, the third multiplexer 1893 has a first input coupled to the second input signal line 1872 and a second input coupled to the first input signal line 1871 via the delay circuit 1812. The fourth multiplexer 1894 has an output coupled to the delay element 1480 of the second filter stage 1440b of the second reconfigurable interpolation filter 1700b (via the multiplexer 1750 of the second filter stage 1440b of the second reconfigurable interpolation filter 1700b). To provide an input signal to the second filter stage 1440b of the second reconfigurable interpolation filter 1700b in the single band mode (described below with reference to FIG. 19), the fourth multiplexer 1894 has a first input coupled to the second input signal line 1872. Additionally, because a second input signal is not needed in the dual band mode (described below with reference to FIG. 18), the output of the fourth multiplexer 1894 is not selected in the dual band mode and a second input of the fourth multiplexer 1894 may be coupled to a logic "0".

Figure 18A:
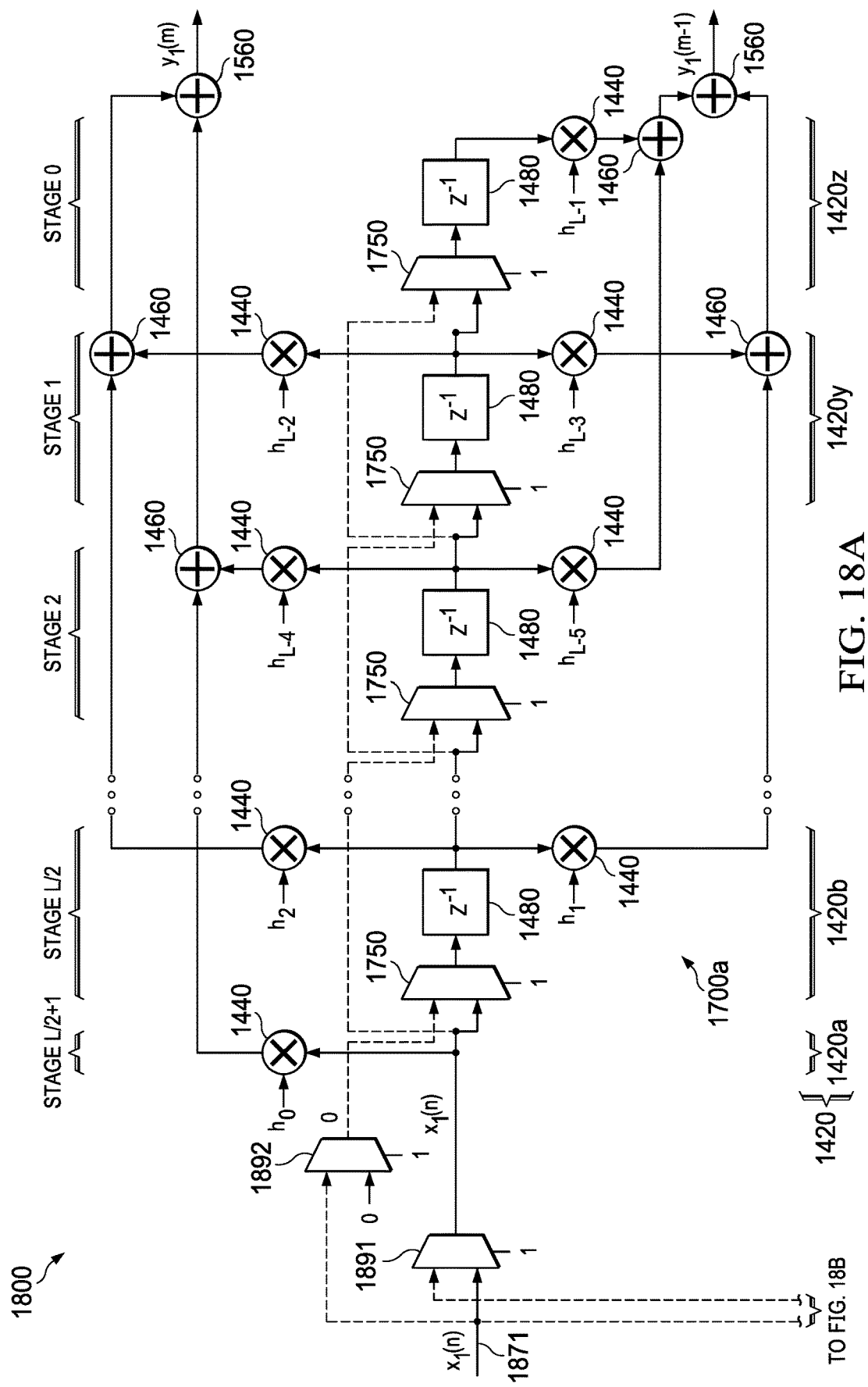
FIGS. 18A and 18B collectively form FIG. 18, which is a block diagram of a dual mode interpolation filter operating in a dual band mode (also a lower parallelization mode) according to an illustrative embodiment.
Figure 18B:
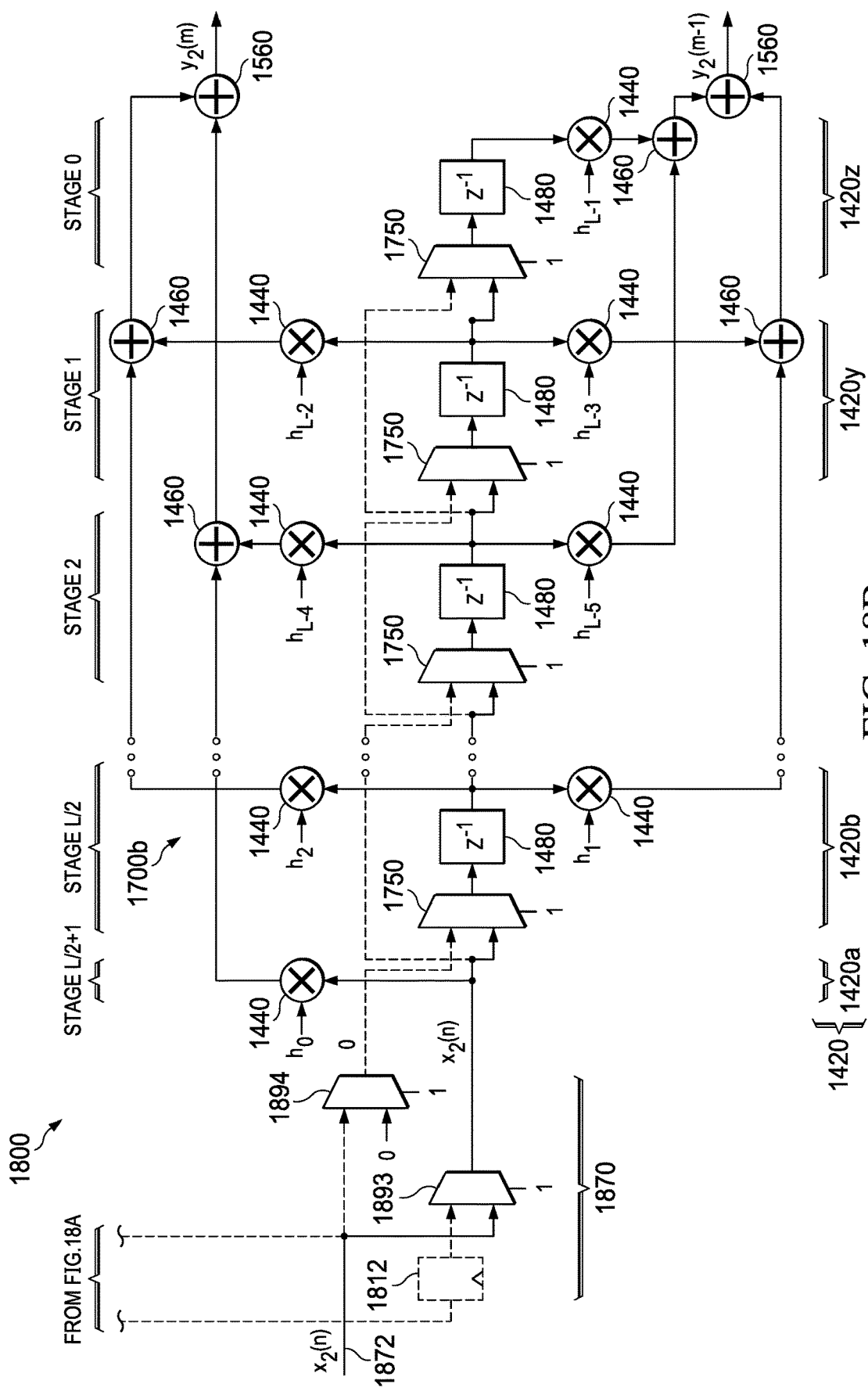

FIG. 18, which includes FIGS. 18A and 18B, is a block diagram of the dual mode interpolation filter 1800 operating in a dual band mode (also a lower parallelization mode) according to an illustrative embodiment.

When operating in the dual band mode shown in FIG. 18, each multiplexer 1750 of each filter stage 1420 in each reconfigurable interpolation filter 1700a and 1700b is configured to select (e.g. based on a logic "1" being supplied to the mode selection input of each multiplexer 1750) the input sample stored in the delay element 1580 of the immediately preceding filter stage 1420. (The inputs selected by the multiplexers in the dual band mode are shown in FIG. 18 as solid lines while the inputs not selected by the multiplexers 750 in the dual band mode are shown as dashed lines.) Meanwhile, the mode-based processor 1870 is configured to provide the first reconfigurable interpolation filter 1700a with input samples $x_1(n)$ in a first band and to provide the second reconfigurable interpolation filter 1700a with input samples $x_2(n)$ in a second band.

In the dual band mode, the first reconfigurable interpolation filter 1700a generates two output samples $y_1(m)$ and $y_1(m-1)$ for every input sample $x_1(n)$ in the first band. Because each multiplexer 1750 of each filter stage 1420 is configured to select the input sample stored in the delay element 1580 of the immediately preceding filter stage 1420, the output samples $y_1(m)$ and $y_1(m-1)$ are generated by filtering the input samples $x_1(n)$ by the entire array of L filter coefficients $h_k$ using every filter stage 1420 of the first reconfigurable interpolation filter 1700a. In the initial filter stage 1420a, the multiplier 1440 filters the most recent input sample $x_1(n)$. In each subsequent filter stage 1420 after the initial filter stage 1420a, the delay element 1480 receives the input sample $x_1(n)$ that was filtered by the immediately preceding filter stage 1420 from the delay element 1420 of the immediately preceding filter stage 1420 via the multiplexer 1750 of that filter stage 1420. Each clock cycle, the input samples $x_1(n)$ are passed to the next filter stage 1420 to be filtered by the multipliers 1440 of the next filter stage

1420. The output samples $y_1(m)$ are generated by summing the input samples $x_1(n)$ filtered by filter coefficients $h_k$ with an even-numbered filter index k (e.g., $h_0, h_2, \ldots h_{L-2}$) and the output samples $y_1(m-1)$ are generated by summing the input samples filtered by filter coefficients $h_k$ with an even-numbered filter index k (e.g., $h_1, h_3, \ldots h_{L-1}$).

Similarly, the second reconfigurable interpolation filter 1700b generates two output samples $y_2(m)$ and $y_2(m-1)$ for every input sample $x_2(n)$ in the second band. Again, because each multiplexer 1750 of each filter stage 1420 is configured to select the input sample stored in the delay element 1580 of the immediately preceding filter stage 1420, the output samples $y_2(m)$ and $y_2(m-1)$ are generated by filtering the input samples $x_2(n)$ by the entire array of L filter coefficients $h_k$ using every filter stage 1420 of the first reconfigurable interpolation filter 1700a. Again, in the initial filter stage 1420a, the multiplier 1440 filters the most recent input sample $x_2(n)$. In each subsequent filter stage 1420 after the initial filter stage 1420a, the delay element 1480 receives the input sample $x_2(n)$ that was filtered by the immediately preceding filter stage 1420 from the delay element 1420 of the immediately preceding filter stage 1420 via the multiplexer 1750 of that filter stage 1420. Each clock cycle, the input samples $x_2(n)$ are passed to the next filter stage 1420 to be filtered by the multipliers 1440 of the next filter stage 1420. The output samples $y_2(m)$ are generated by summing the input samples $x_2(n)$ filtered by filter coefficients $h_k$ with an even-numbered filter index k (e.g., $h_0, h_2, \ldots h_{L-2}$) and the output samples $y_2(m-1)$ are generated by summing the input samples filtered by filter coefficients $h_k$ with an even-numbered filter index k (e.g., $h_1, h_3, \ldots h_{L-1}$).

In the dual band mode, each of the reconfigurable interpolation filters 1700a and 1700b of the dual mode interpolation filter 1800 are configured to perform the same function as the prior art interpolation filter 1500 of FIG. 15. Therefore, in the dual band mode, the dual mode interpolation filter 1800 can perform the functions of two prior art interpolation filters 1500 in a dual band DUC chain.

Figure 19A:
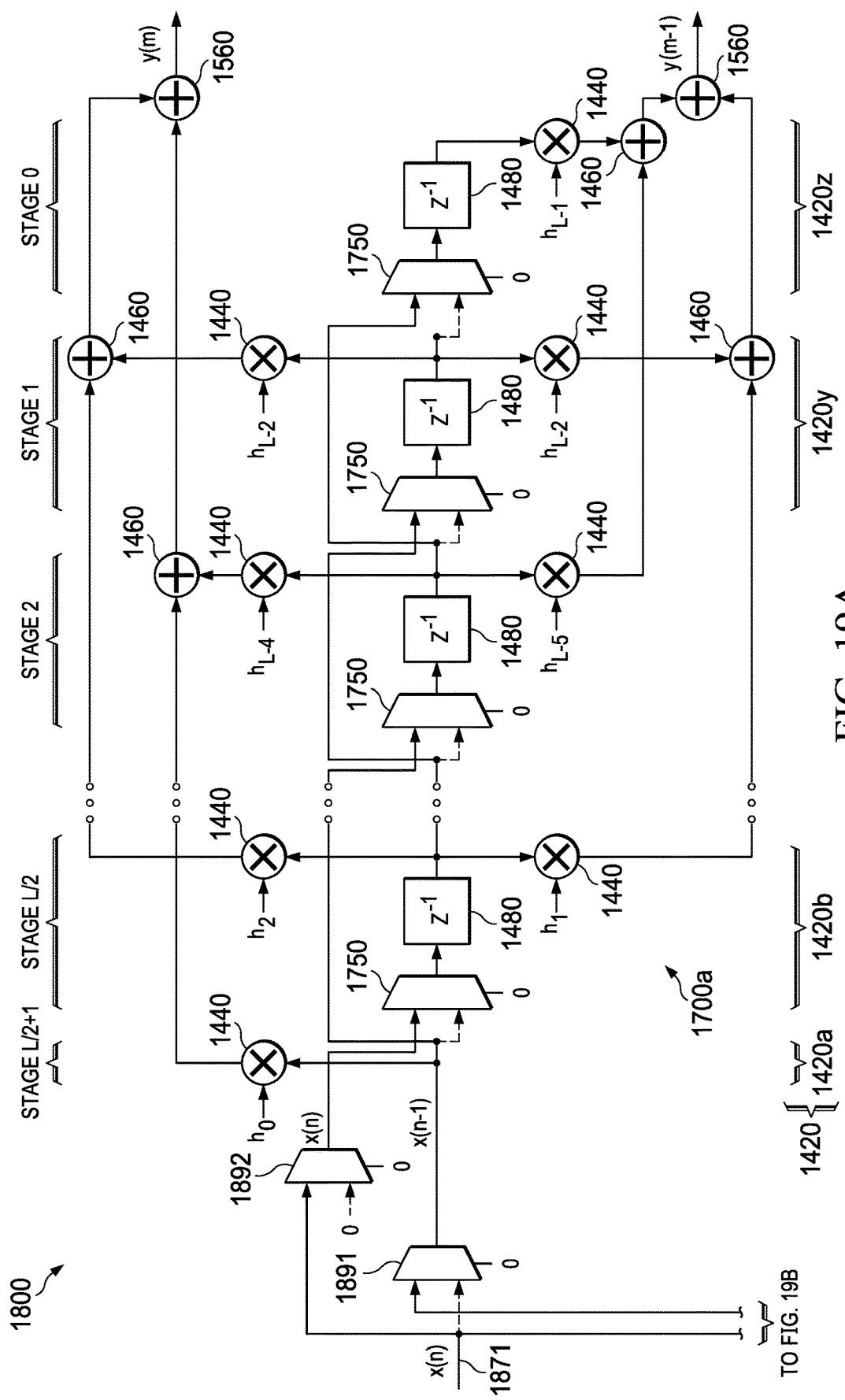
FIGS. 19A and 19B collectively form FIG. 19, which is a block diagram of the dual mode interpolation filter of FIG. 18 operating in a single band mode (also a higher parallelization mode) according to an illustrative embodiment.
Figure 19B:
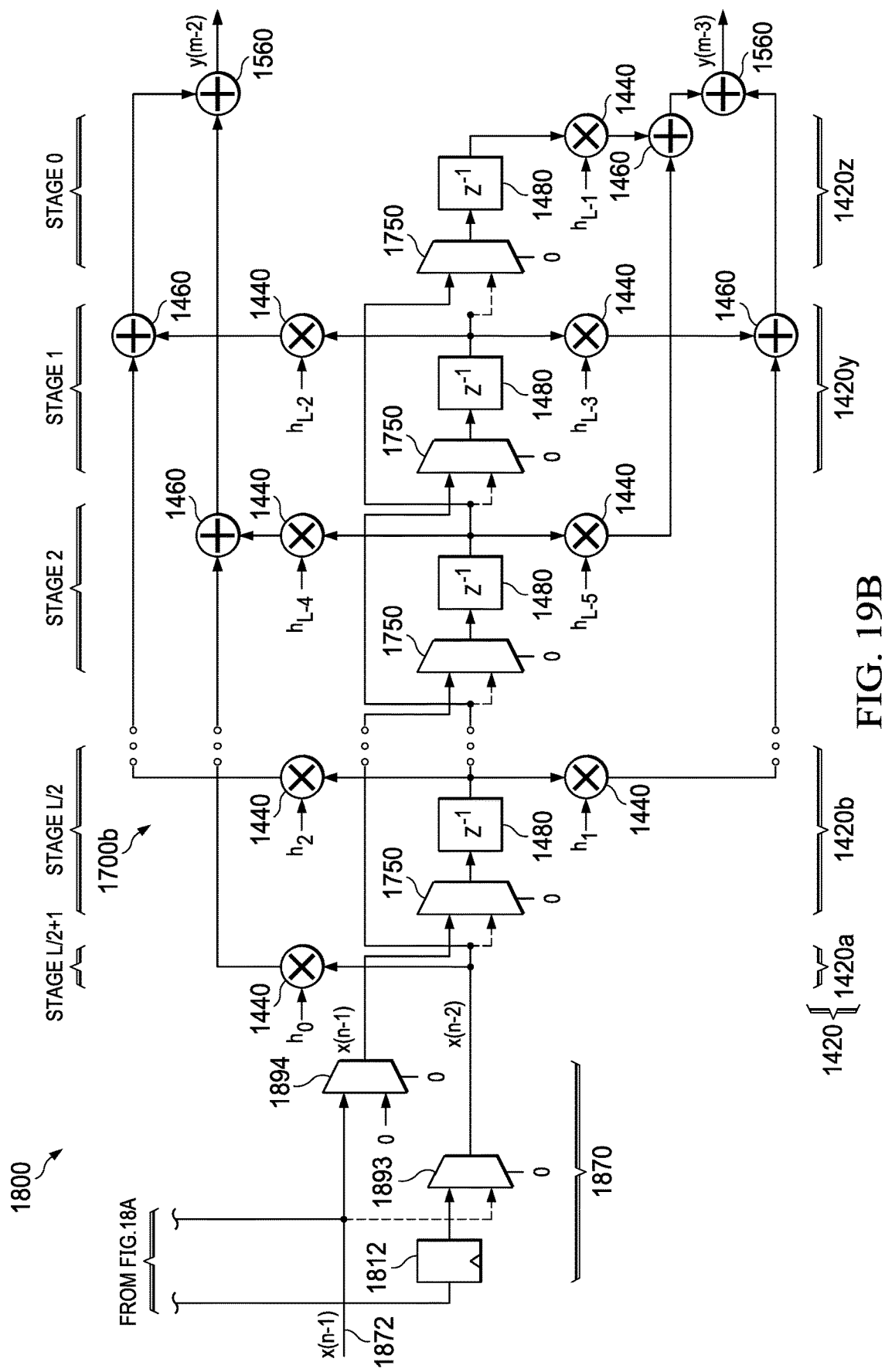

FIG. 19, which includes FIGS. 19A and 19B, is a block diagram of the dual mode interpolation filter 1800 operating in a single band mode (also a higher parallelization mode) according to an illustrative embodiment.

As shown in FIG. 19, when operating in the single band mode, each multiplexer 1750 of each filter stage 1420 in each reconfigurable interpolation filter 1700a or 1700b is configured to select (e.g. based on a logic "0" being supplied to the mode selection input of each multiplexer 1750) the input sample stored in the delay element 1580 two stages prior. The inputs selected by the multiplexers 1750 in the single band mode are shown in FIG. 19 as solid lines while the inputs not selected by the multiplexers 1750 in the single band mode are shown as dashed lines.

In the single band mode, the dual mode interpolation filter 1800 is configured to generate four output samples $y(m-3)$ through $y(m)$ every clock cycle using two input samples $x(n-1)$ and $x(n)$. The mode-based processor 1870 provides the input samples $x(n)$ to the second filter stage 1420b of the first reconfigurable interpolation filter 1700a (via the second multiplexer 1892) and the input samples $x(n-1)$ to the initial filter stage 1420a of the first reconfigurable interpolation filter 1700a (via the first multiplexer 1892). The mode-based processor 1870 also provides the input samples $x(n-1)$ to the second filter stage 1420b of the second reconfigurable interpolation filter 1700b (via the fourth multiplexer 1894) and the input samples $x(n-2)$ to the initial filter stage 1420a of the second reconfigurable interpolation filter 1700a (by delaying the input samples $x(n)$ using the delay circuit 1812 and providing the delayed input samples $x(n-2)$ via the first multiplexer 1892).

Because each multiplexer 1750 in the single band mode selects the input sample stored in the delay element 1580 two stages prior, each reconfigurable interpolation filter 1700a and 1700b is each effectively divided into two sub-chains that include either the odd-numbered filter stages 1420 or the even-numbered filter stages 1420 of that reconfigurable interpolation filter 1700a or 1700b. For instance, the input samples $x(n-1)$ provided to the initial filter stage 1420a of the first reconfigurable interpolation filter 1700a are filtered by the even-numbered filter stages 1420 ("Stage 0", "Stage 2", ...

$$\text{Stage } \frac{L}{2}+1")$$

of the first reconfigurable interpolation filter 1700a and the input samples $x(n)$ provided to the second filter stage 1420b of the first reconfigurable interpolation filter 1700a are filtered by the odd-numbered filter stages 1420 ("Stage 1", "Stage 3", ...

$$\text{Stage } \frac{L}{2}")$$

of the first reconfigurable interpolation filter 1700a. Similarly, the input samples $x(n-2)$ provided to the initial filter stage 1420a of the second reconfigurable interpolation filter 1700b are filtered by the even-numbered filter stages 1420 ("Stage 0", "Stage 2", ...

$$\text{Stage } \frac{L}{2}+1")$$

of the second reconfigurable interpolation filter 1700b and the input samples $x(n-1)$ provided to the second filter stage 1420b of the second reconfigurable interpolation filter 1700b are filtered by the odd-numbered filter stages 1420 ("Stage 1", "Stage 3", ...

$$\text{Stage } \frac{L}{2}")$$

of the second reconfigurable interpolation filter 1700b.

The output sample $y(m)$ is generated by summing the input sample $x(n)$ filtered the filter coefficients $h_2, h_6, h_{10}, \ldots h_{L-2}$ and the input sample $x(n-1)$ filtered by the filter coefficients $h_0, h_4, h_8, \ldots h_{L-4}$. The output sample $y(m-1)$ is generated by summing the input sample $x(n)$ filtered by the filter coefficients $h_1, h_5, h_9, \ldots h_{L-3}$, and the input sample $x(n-1)$ filtered by the filter coefficients $h_3, h_7, h_{11}, \ldots h_{L-1}$. The output sample $y(m-2)$ is generated by summing the input sample $x(n-1)$ filtered by the filter coefficients $h_2, h_6, h_{10}, \ldots h_{L-2}$, and the input sample $x(n-2)$ filtered by the filter coefficients $h_0, h_4, h_8, \ldots h_{L-4}$. Finally, the output sample $y(m-3)$ is generated by summing the input sample $x(n-1)$ filtered by the filter coefficients $h_1, h_5, h_9, \ldots h_{L-3}$, and the input sample $x(n-1)$ filtered by the filter coefficients $h_3, h_7, h_{11}, \ldots h_{L-1}$.

In the single band mode shown in FIG. 19, the dual mode interpolation filter 1800 interpolates input samples x(n) in a single band with higher parallelization than when operating in the dual band mode shown in FIG. 18. Therefore, in the single band mode shown in FIG. 19, the dual mode interpolation filter 1800 is capable of performing the same function as the interpolation filter 1600 of FIG. 16. Therefore, in the single band mode, the dual mode interpolation filter 1800 can perform the function of a single band interpolation filter having high parallelization in a single band DUC chain.

Because the dual mode interpolation filter 1800 can perform the functions of both the of the two interpolation filters 1500 (when operating in the dual band mode) and a single band interpolation filter 1600 having high parallelization (when operating in the single band mode), the dual mode interpolation filter 1800 eliminates the need for duplicate hardware elements to support both the single band mode and the dual band mode.

Although described with reference to the cellular base stations 100 and 200 of FIGS. 1 and 2, the dual mode filters 800, 1200, and 1800 have additional applications, for example in radar systems and test and measurement systems.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, one or more structures/devices may be formed on different semiconductor substrates or they may be formed within a single physical device (e.g., a semiconductor substrate and/or integrated circuit (IC) package). Circuits described herein are reconfigurable to include the replaced components to provide functionality at least partially similar to functionality available prior to the component replacement.

In some example embodiments, certain elements may be included in an integrated circuit while other elements are external to the integrated circuit. In other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A dual mode filter having a higher parallelization mode and a lower parallelization mode, the dual mode filter comprising:
    a first reconfigurable filter and a second reconfigurable filter, each reconfigurable filter comprising a plurality of filter stages, the plurality of filter stages including a penultimate filter stage and a final filter stage, each filter stage comprising:
        a multiplexer configured to select either a partial sum generated by a filter stage immediately preceding the filter stage or a partial sum generated by a filter stage immediately preceding the immediately preceding filter stage;
        one or more multipliers, each coupled to an input signal and one of a plurality of unique filter coefficients and having an output operable to output a filtered input signal; and
        an adder coupled to at least one multiplier and operable to generate a partial sum for the filter stage by adding the one or more filtered input signals and the partial sum selected by the multiplexer.

2. The dual mode filter of claim 1, wherein the dual mode filter is a decimation filter or a resampling filter.

3. The dual mode filter of claim 1, wherein, in the lower parallelization mode, each multiplexer in each filter stage is configured to select the partial sum generated by the immediately preceding filter stage.

4. The dual mode filter of claim 3, further comprising:
    a mode-based processor that, in the lower parallelization mode, outputs the partial sums generated by the adders in the final filter stage of each of the reconfigurable filters.

5. The dual mode filter of claim 3, wherein, in the lower parallelization mode:
    the first reconfigurable filter generates a filtered output of a first input signal in a first band; and
    the second reconfigurable filter generates a filtered output of a second input signal in a second band.

6. The dual mode filter of claim 3, wherein, in the higher parallelization mode, each multiplexer in each filter stage is configured to select the partial sum generated by the filter stage immediately preceding the immediately preceding filter stage.

7. The dual mode filter of claim 6, wherein:
    each reconfigurable filter includes a set of odd-numbered filter stages alternating with a set of even-numbered filter stages; and in the higher parallelization mode, the adder in the final filter stage of each reconfigurable filter generates a partial sum filtered by the even-numbered filter stages and the adder in the penultimate filter stage of each reconfigurable filter generates a partial sum filtered by the odd-numbered filter stages.

8. The dual mode filter of claim 6, further comprising:
a mode-based processor that, in the higher parallelization mode:
  generates a first filtered output by adding the partial sum generated by the adder in the final filter stage of the first reconfigurable filter and the partial sum generated by the adder in the penultimate filter stage of the second reconfigurable filter; and
  generates a second filtered output by adding the partial sum generated by the adder in the final filter stage of the second reconfigurable filter and the partial sum generated by the adder in the penultimate filter stage of the first reconfigurable filter.

9. The dual mode filter of claim 6, wherein, in the higher parallelization mode, both of the reconfigurable filters filter an input signal in the same band.

10. The dual mode filter of claim 1, wherein each reconfigurable filter further comprises an initial filter stage, the initial filter stage comprising an initial stage multiplier, coupled to the input signal and one of the plurality of unique filter coefficients, operable to generate a partial sum for the initial filter stage by filtering the input signal.

11. The dual mode filter of claim 1, wherein each reconfigurable filter further comprises an initial filter stage, the initial filter stage comprising:
  a plurality of initial stage multipliers, each coupled to the input signal and one of the plurality of unique filter coefficients and having an output operable to output a filtered input signal; and
  an initial stage adder coupled to the plurality of initial stage multipliers and operable to generate a partial sum for the initial filter stage by adding the filtered input signals output by the initial stage multipliers.

12. The dual mode filter of claim 1, wherein each reconfigurable filter further comprises a second filter stage, the second filter stage comprising:
  a plurality of second stage multipliers, each coupled to the input signal and one of the plurality of unique filter coefficients and having an output operable to output a filtered input signal;
  a second stage multiplexer configured to select and output either a partial sum generated by an initial filter stage or 0; and
  a second stage adder coupled to the plurality of second stage multipliers and operable to generate a partial sum for the second filter stage by adding the filtered input signals output by the second stage multipliers to the output of the second stage multiplexer.

13. The dual mode filter of claim 12, wherein:
in the lower parallelization mode, the second stage multiplexer is configured to select the partial sum generated by the initial filter stage; and
in the higher parallelization mode, the second stage multiplexer is configured to select 0.

14. A dual mode interpolation filter having a lower parallelization mode and a higher parallelization mode, the dual mode interpolation filter comprising:
  a first reconfigurable filter and a second reconfigurable filter, each reconfigurable filter comprising:
    a plurality of filter stages, each filter stage comprising:
      a multiplexer configured to select either an input sample provided by a filter stage immediately preceding the filter stage or an input sample provided by a filter stage immediately preceding the immediately preceding filter stage; and
      one or more multipliers that each filter the input signal selected by the multiplexer; and
    adders coupled to the multipliers configured to generate output samples by summing the outputs of the multipliers.

15. The dual mode interpolation filter of claim 14, wherein, in the lower parallelization mode, each multiplexer in each filter stage is configured to select the partial sum generated by the immediately preceding filter stage.

16. The dual mode interpolation filter of claim 15, further comprising:
a mode-based processor that, in the lower parallelization mode:
  provides a first input signal in a first band to the first reconfigurable filter; and
  provides a second input signal in a second band to the second reconfigurable filter.

17. The dual mode interpolation filter of claim 14, wherein, in the higher parallelization mode, each multiplexer in each filter stage is configured to select the partial sum generated by the filter stage immediately preceding the immediately preceding filter stage.

18. The dual mode interpolation filter of claim 17, further comprising:
a mode-based processor that, in the higher parallelization mode, is configured to provide input samples in the same band to both the first reconfigurable filter and the second reconfigurable filter.

19. A transceiver, comprising:
one or more dual mode filters, each dual mode filter comprising a first reconfigurable filter and a second reconfigurable filter, each reconfigurable filter comprising a plurality of filter stages, each filter stage comprising:
  a multiplexer configured to select either a partial sum generated by a filter stage immediately preceding the filter stage or a partial sum generated by a filter stage immediately preceding the immediately preceding filter stage;
  one or more multipliers, each coupled to an input signal and one of a plurality of unique filter coefficients and having an output operable to output a filtered input signal; and
  an adder coupled to at least one multiplier and operable to generate a partial sum for the filter stage by adding the one or more filtered input signals and the partial sum selected by the multiplexer.

20. The transceiver of claim 19, wherein the one or more dual mode filters comprise a dual mode resampling filter or a dual mode decimation filter.

21. The transceiver of claim 20, comprising:
a digital up-converter comprising a dual mode interpolation filter; and
a digital down-converter, comprising:
the dual mode resampling filter; and
the dual mode decimation filter.

* * * * *